(12) United States Patent
Jiang et al.

(10) Patent No.: US 10,655,836 B2
(45) Date of Patent: May 19, 2020

(54) LED LAMP HAVING LAMP COVER WITH INNER REFLECTING SURFACE AND OUTER REFLECTING SURFACE

(71) Applicant: JIAXING SUPER LIGHTING ELECTRIC APPLIANCE CO., LTD, Jiaxing (CN)

(72) Inventors: Tao Jiang, Jiaxing (CN); Mingbin Wang, Jiaxing (CN); Aiming Xiong, Jiaxing (CN); Lin Zhou, Jiaxing (CN)

(*) Notice: Subject to any disclaimer, the term of this patent is extended or adjusted under 35 U.S.C. 154(b) by 0 days.

(21) Appl. No.: 16/503,417

(22) Filed: Jul. 3, 2019

(65) Prior Publication Data

US 2019/0346128 A1 Nov. 14, 2019

Related U.S. Application Data

(63) Continuation of application No. 16/267,747, filed on Feb. 5, 2019.

(30) Foreign Application Priority Data

Feb. 8, 2018 (CN) .......................... 2018 1 0130085
May 18, 2018 (CN) .......................... 2018 1 0479044

(Continued)

(51) Int. Cl.
*F21V 29/00* (2015.01)
*F21V 29/503* (2015.01)
(Continued)

(52) U.S. Cl.
CPC ............ *F21V 29/503* (2015.01); *F21K 9/235* (2016.08); *F21K 9/237* (2016.08); *F21K 9/238* (2016.08);
(Continued)

(58) Field of Classification Search
CPC ...... F21V 29/503; F21V 29/773; F21V 29/83; F21K 9/236; F21K 9/237; F21K 9/235;
(Continued)

(56) References Cited

U.S. PATENT DOCUMENTS

| 7,748,870 B2 * | 7/2010 | Chang | F21V 29/004 362/294 |
| 9,897,304 B2 * | 2/2018 | Shum | F21V 23/006 |

(Continued)

FOREIGN PATENT DOCUMENTS

| CN | 201606689 U | 10/2010 |
| CN | 201651880 U | 11/2010 |

(Continued)

*Primary Examiner* — Ali Alavi
(74) *Attorney, Agent, or Firm* — Simon Kuang Lu

(57) ABSTRACT

An LED lamp includes: a lamp shell; a passive heat dissipating element having a heat sink, wherein the heat sink comprises fins and a base; a power source; a light emitting surface connected to the heat sink of the passive heat dissipating element and comprising LED chips; a first heat dissipating channel formed in a first chamber of the lamp shell; a second heat dissipating channel formed in the heat sink and between the fins and the base of the heat sink; and a lamp cover connected with the heat sink and having a light output surface, an end surface, an inner reflecting surface disposed inside the light output surface of the lamp cover and an outer reflecting surface disposed in the outer circle of the array of the LED chips; wherein a relationship as follows is satisfied between the LED chips and the inner and outer reflecting surface: (A1/N1):(A2/N2)=0.4~1; where A1 and A2 respectively represent area of the inner and outer reflecting surface; where N1 and N2 respectively represent number of the innermost and outermost of the array of LED chips of the light emitting surface.

14 Claims, 34 Drawing Sheets

(30) Foreign Application Priority Data

| | | | |
|---|---|---|---|
| May 28, 2018 | (CN) | .......................... | 2018 1 0523952 |
| Jun. 6, 2018 | (CN) | .......................... | 2018 1 0573322 |
| Jun. 20, 2018 | (CN) | .......................... | 2018 1 0634571 |
| Jul. 12, 2018 | (CN) | .......................... | 2018 1 0763089 |
| Jul. 12, 2018 | (CN) | .......................... | 2018 1 0763800 |
| Aug. 24, 2018 | (CN) | .......................... | 2018 1 0972904 |
| Oct. 9, 2018 | (CN) | .......................... | 2018 1 1172470 |
| Nov. 1, 2018 | (CN) | .......................... | 2018 1 1295618 |
| Nov. 2, 2018 | (CN) | .......................... | 2018 1 1299410 |
| Nov. 13, 2018 | (CN) | .......................... | 2018 1 1347198 |
| Nov. 19, 2018 | (CN) | .......................... | 2018 1 1378174 |

(51) Int. Cl.

| | |
|---|---|
| *F21K 9/235* | (2016.01) |
| *F21V 29/77* | (2015.01) |
| *F21K 9/238* | (2016.01) |
| *F21K 9/237* | (2016.01) |
| *F21V 29/83* | (2015.01) |
| *F21K 9/66* | (2016.01) |
| *F21K 9/68* | (2016.01) |
| *H05B 45/50* | (2020.01) |
| *H05B 45/395* | (2020.01) |
| *F21V 7/00* | (2006.01) |
| *H03H 11/04* | (2006.01) |
| *F21Y 115/10* | (2016.01) |
| *F21Y 105/18* | (2016.01) |
| *H03H 7/01* | (2006.01) |

(52) U.S. Cl.
CPC .................. *F21K 9/66* (2016.08); *F21K 9/68* (2016.08); *F21V 7/0025* (2013.01); *F21V 29/773* (2015.01); *F21V 29/83* (2015.01); *H05B 45/395* (2020.01); *H05B 45/50* (2020.01); *F21Y 2105/18* (2016.08); *F21Y 2115/10* (2016.08); *H03H 7/0115* (2013.01); *H03H 11/04* (2013.01)

(58) Field of Classification Search
CPC ... F21K 9/233; F21K 9/66; F21K 9/68; H05B 45/395; H05B 45/50; H05B 45/37; H05B 45/00; F21Y 2103/33; F21Y 2105/10; F21Y 2115/10; H03H 11/04
USPC ......................................................... 362/294
See application file for complete search history.

(56) References Cited

U.S. PATENT DOCUMENTS

| | | | |
|---|---|---|---|
| 2007/0230188 A1 | 10/2007 | Lin | |
| 2012/0085516 A1* | 4/2012 | McClellan | ............ F21V 15/013 165/80.3 |
| 2016/0025322 A1* | 1/2016 | Chen | ....................... F21K 9/232 362/373 |

FOREIGN PATENT DOCUMENTS

| | | |
|---|---|---|
| CN | 102032491 A | 4/2011 |
| CN | 102374427 A | 3/2012 |
| CN | 102859256 A | 1/2013 |
| CN | 203190364 U | 9/2013 |
| CN | 203442750 U | 2/2014 |
| CN | 203656721 U | 6/2014 |
| CN | 204114712 U | 1/2015 |
| CN | 104728631 A | 6/2015 |
| CN | 204717489 U | 10/2015 |
| CN | 204785745 U | 11/2015 |
| CN | 107345628 A | 11/2017 |
| CN | 108368977 A | 8/2018 |
| KR | 100932192 B1 | 12/2009 |

* cited by examiner

LED LAMP HAVING LAMP COVER WITH INNER REFLECTING SURFACE AND OUTER REFLECTING SURFACE

CROSS-REFERENCE TO RELATED APPLICATIONS

This application is a continuation application of U.S. application Ser. No. 16/267,747 filed on 2019 Feb. 5, which claims priority to the following Chinese Patent Applications No. CN 201810130085.3 filed on 2018 Feb. 8, CN 201810479044.5 filed on 2018 May 18, CN 201810523952.X filed on 2018 May 28, CN 201810573322.3 filed on 2018 Jun. 6, CN 201810634571.9 filed on 2018 Jun. 20, CN 201810763800.7 field on 2018/07/12, CN 201810763089.5 filed on 2018 Jul. 12, CN 201810972904.9 filed on 2018 Aug. 24, CN 201811172470.0 filed on 2018 Oct. 9, CN 201811295618.X filed on 2018 Nov. 1, CN 201811299410.5 filed on 2018 Nov. 2, CN 201811347198.5 filed on 2018 Nov. 13, CN 201811378174.6 filed on 2018 Nov. 19, and CN 201811466198.7 filed on 2018 Dec. 3, the disclosures of which are incorporated herein in their entirety by reference.

FIELD OF THE INVENTION

The invention relates to lighting, particularly to an LED lamps which comprises a lamp cover with inner reflecting surface and outer reflecting surface.

BACKGROUND OF THE INVENTION

Because LED lamps possess advantages of energy saving, high efficiency, environmental protection and long life, they have been widely adopted in the lighting field. For LED lamps used as an energy-saving green light source, a problem of heat dissipation of high-power LED lamps becomes more and more important. Overheating will result in attenuation of lighting efficiency. If waste heat from working high-power LED lamps cannot be effectively dissipated, then the life of LED lamps will be directly negatively affected. As a result, in recent years, solution of the problem of heat dissipation of high-power LED lamps is an important issue for the industry.

OBJECT AND SUMMARY OF THE INVENTION

The LED lamp described in the present disclosure includes an LED (light emitting diode) lamp including a lamp shell including a lamp head, a lamp neck and a sleeve, the lamp head connects to the lamp neck which connects to the sleeve; a passive heat dissipating element having a heat sink connected to the lamp shell, wherein the heat sink comprises fins and a base, the sleeve of the lamp shell is located in the heat sink, the lamp neck projects from the heat sink, height of the lamp neck is at least 80% of height of the heat sink; a power source having a first portion and a second portion, wherein the first portion of the power source is disposed in both the lamp neck and the lamp head of the lamp shell, and the second portion of the power source is disposed in the heat sink of the passive heat dissipating element; a light emitting surface connected to the heat sink of the passive heat dissipating element and comprising LED chips electrically connected to the power source, wherein the light emitting surface and the heat sink are connected to form a heat transferring path from the LED chips to the passive heat dissipating element; a first heat dissipating channel formed in a first chamber of the lamp shell for dissipating heat generated from the power source while the LED lamp is working, and the first chamber is located between bottom of the LED lamp and an upper portion of the lamp neck; a second heat dissipating channel formed in the heat sink and between the fins and the base of the heat sink for dissipating the heat generated from the LED chips and transferred to the heat sink; and a lamp cover connected with the heat sink and having a light output surface, an end surface, an inner reflecting surface disposed inside the light output surface of the lamp cover and an outer reflecting surface disposed in the outer circle of the array of the LED chips, wherein the end surface is formed with a vent to allow air flowing from outside of the LED lamp into both the first heat dissipating channel and the second heat dissipating channel through the vent, the inner reflecting surface is disposed in a position of an inner circle of the array of the LED chips, the outer reflecting surface is set to correspond to the LED chips on the light emitting surface; wherein the first heat dissipating channel comprises a first end on the light emitting surface to allow air flowing from outside of the LED lamp into the first chamber, and a second end on the upper portion of the lamp neck of the lamp shell to allow air flowing from inside of the first chamber out to the LED lamp; wherein the second heat dissipating channel comprises a third end on the light emitting surface to allow air flowing from outside of the LED lamp into the second heat dissipating channel, and flowing out from spaces between every adjacent two of the fins; wherein a third aperture is located in a central region of the light emitting surface, and the third aperture forms an air intake of both the first heat dissipating channel and the second heat dissipating channel; wherein the sleeve of the lamp shell is made of a material having lower thermal conductivity than that of material of the heat sink; wherein the inner reflecting surface of the lamp cover is configured to reflect part of light emitted from the innermost of the array of LED chips, the outer reflecting surface of the lamp cover is configured to reflect part of light emitted from the outermost of the array of LED chips, and the outermost of the array of LED chips are greater than the innermost of array of LED chips in number, and the outer reflecting surface is greater than the inner reflecting surface in area; wherein a relationship as follows is satisfied between the LED chips and the inner and outer reflecting surface: $(A1/N1):(A2/N2)=0.4\sim1$; where A1 and A2 respectively represent area of the inner and outer reflecting surface; where N1 and N2 respectively represent number of the innermost and outermost of the array of LED chips of the light emitting surface.

Preferably, the base of the heat sink has a projecting portion protrudes from the light emitting surface in an axial direction of the LED lamp, the projecting portion protrudes from the light emitting surface in the axial direction of the LED lamp, the projecting portion is configured to be annular and a concave structure is defined by both the projecting portion and the base for receiving and protecting both the light emitting surface and the light cover, the base has a first inner surface and the lamp cover has a peripheral wall, the first inner surface corresponds to the peripheral wall, a gap is kept between the first inner surface and the peripheral wall, the first inner surface is configured to be a slant and an angle is formed between the first inner surface and the light emitting surface, the angle is an obtuse angle.

Preferably, the base further includes a second inner surface, an end portion of the peripheral wall abuts against the second inner surface, an angle between the first inner surface and the light emitting surface is less than an angle between the second inner surface and the light emitting surface.

Preferably, the angle between the second inner surface and the light emitting surface is between 120 degrees and 150 degrees.

Preferably, the end portion of the peripheral wall is provided with protruding plates upward extending from the peripheral wall at regular intervals, Preferably, the protruding plates are the parts that the end portion of the peripheral wall is in actual contact with the second inner surface.

Preferably, a gap is formed between the peripheral wall and the base and the base is formed with a hole, a side of the hole communicates with the gap and the other side corresponds to the fins.

Preferably, a chamber is formed between the light cover and the light emitting surface, and the light emitting surface and the LED chips are located in the chamber.

Preferably, the chamber has first apertures and second apertures, the first apertures are configured to communicate with the outside, and the second apertures are configured to communicate simultaneously with both the first heat dissipating channel and the second heat dissipating channel.

Preferably, the light output surface is provided with holes to form the first apertures, the inner reflecting surface is provided with notches to form the second apertures.

Preferably, the ratio of the number of the second apertures to that of the first apertures is 1:1~2.

Preferably, the ratio of the number of the second apertures to that of the first apertures is 1:1.5.

Preferably, the light emitting surface include at least two LED chip sets having the LED chips, an open region is formed between adjacent two LED chips of the same LED chip set, the open region between any two adjacent LED chips of one of the two adjacent chip sets on the light emitting surface interlaces to and communicates with the open region between any two adjacent LED chips of another one of the chip sets on the light emitting surface in a radial direction of the light emitting surface.

Preferably, three LED chip sets are annularly disposed along the radial direction of the light emitting surface in order, any open regions of the three LED chips are not in the same direction in the radial direction.

BRIEF DESCRIPTION OF THE DRAWINGS

The following detailed descriptions, given by way of example, and not intended to limit the present invention solely thereto, will be best be understood in conjunction with the accompanying figures.

DETAILED DESCRIPTION OF THE EMBODIMENTS

To make the present invention understandable and readable, the following disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just examples and many implementations and variations are possible without the details provided herein. Some terms mentioned in the following description, such as "in an axis", "above" or "under", are used for clear structural relationship of elements, but not a limit to the present invention. In the present invention, the terms "perpendicular", "horizontal" and "parallel" are defined in a range of ±10% based on a standard definition. For example, "perpendicular" (perpendicularity) means the relationship between two lines which meet at a right angle (90 degrees). However, in the present invention, "perpendicular" may encompass a range from 80 degrees to 100 degrees. In addition, "using condition" or "using status" mentioned in the present disclosure means a "head-up" hanging scenario. Exceptions will be particularly described.

Figure 1:
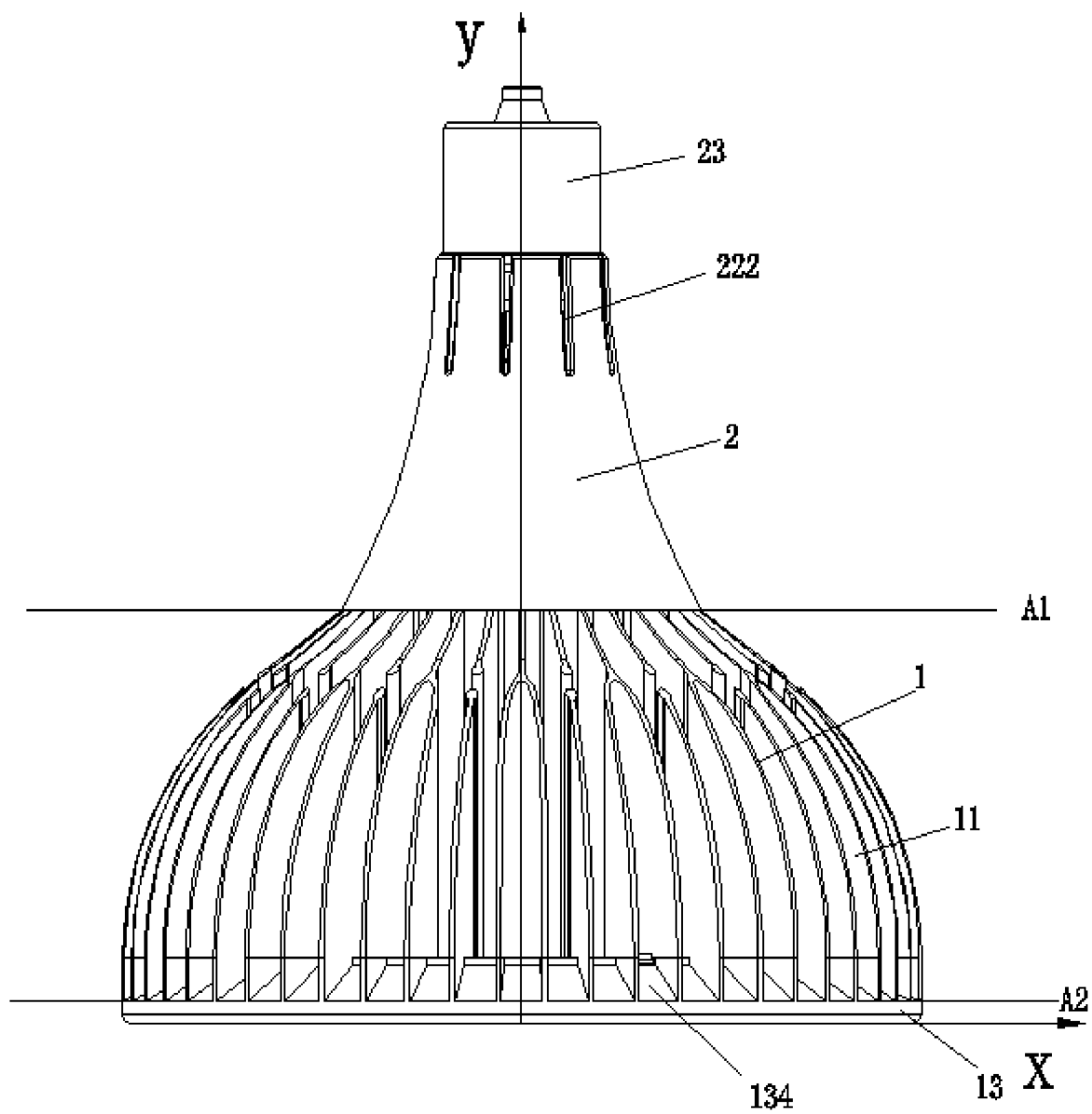
FIG. 1 is a structural schematic view of one embodiment of an LED lamp according to aspects of the invention.
Figure 2:
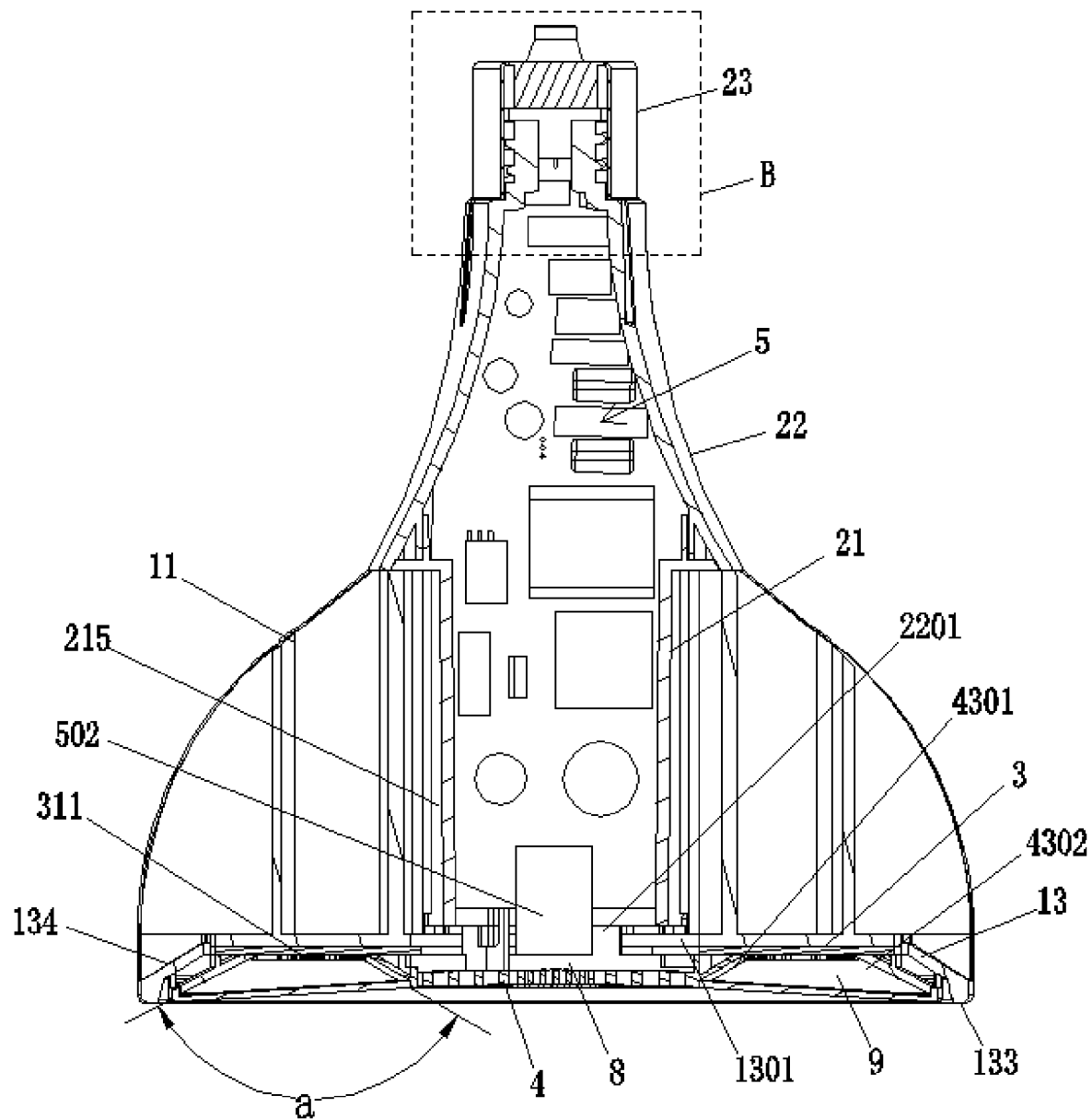
FIG. 2 is a schematic cross-sectional view of the LED lamp of FIG. 1.
Figure 3:
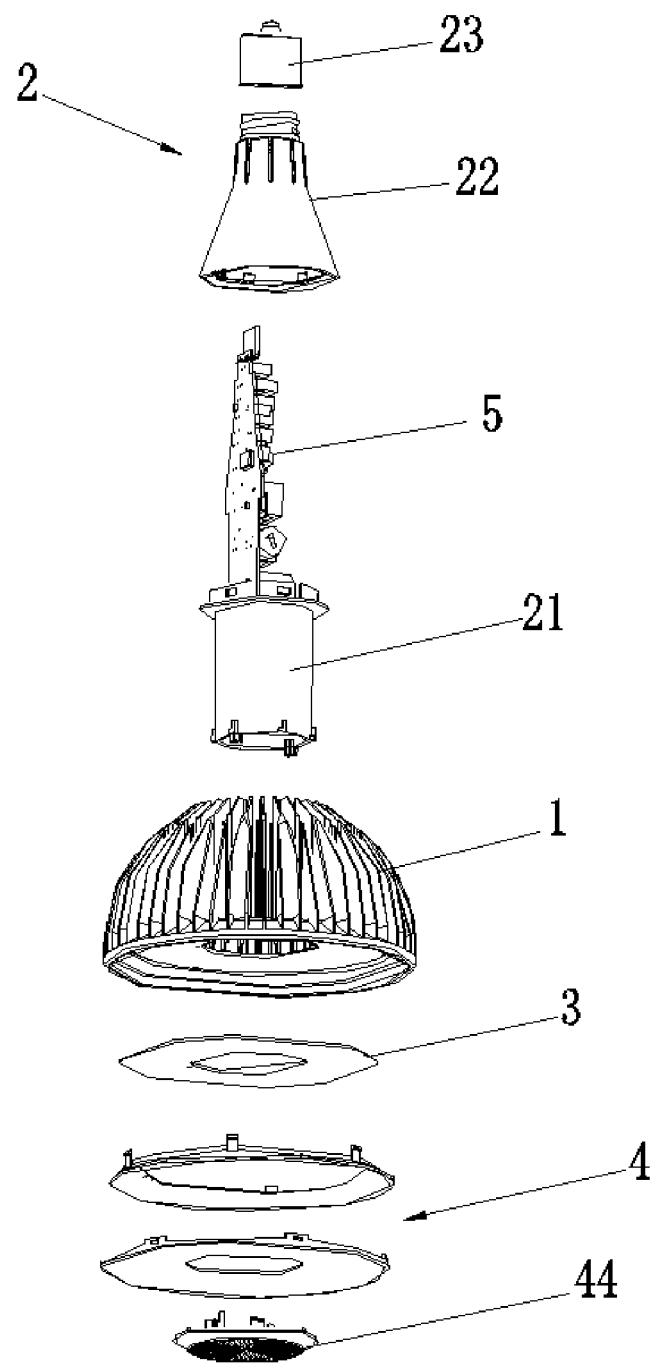
FIG. 3 is an exploded view of the LED lamp of FIG. 1.

FIG. 1 is a structural schematic view of an embodiment of an LED lamp according to certain aspects of the invention. FIG. 2 is a schematic cross-sectional view of the LED lamp of FIG. 1. FIG. 3 is an exploded view of the LED lamp of FIG. 1. As shown in the figures, the LED lamp includes a heat sink 1, a lamp shell 2, a light board 3, a lamp cover 4 and a power source 5. In this embodiment, the light board 3 is connected to the heat sink 1 by attachment for rapidly transferring heat from the light board 3 to the heat sink 1 when the LED lamp is working. In some embodiments, the light board 3 is riveted to the heat sink 1. In some embodiments, the light board 3 is screwed to the heat sink 1. In some embodiments, the light board 3 is welded to the heat sink 1. In some embodiments, the light board 3 is adhered to the heat sink 1. In this embodiment, the lamp shell 2 is connected to the heat sink 1, the lamp cover 4 covers the light board 3 to make light emitted from the light board 3 pass through the lamp cover to project out. The power source 5 is located in a chamber of the lamp shell 2 and the power source 5 is EC to the LED chips 311 for providing electricity.

Figure 4:
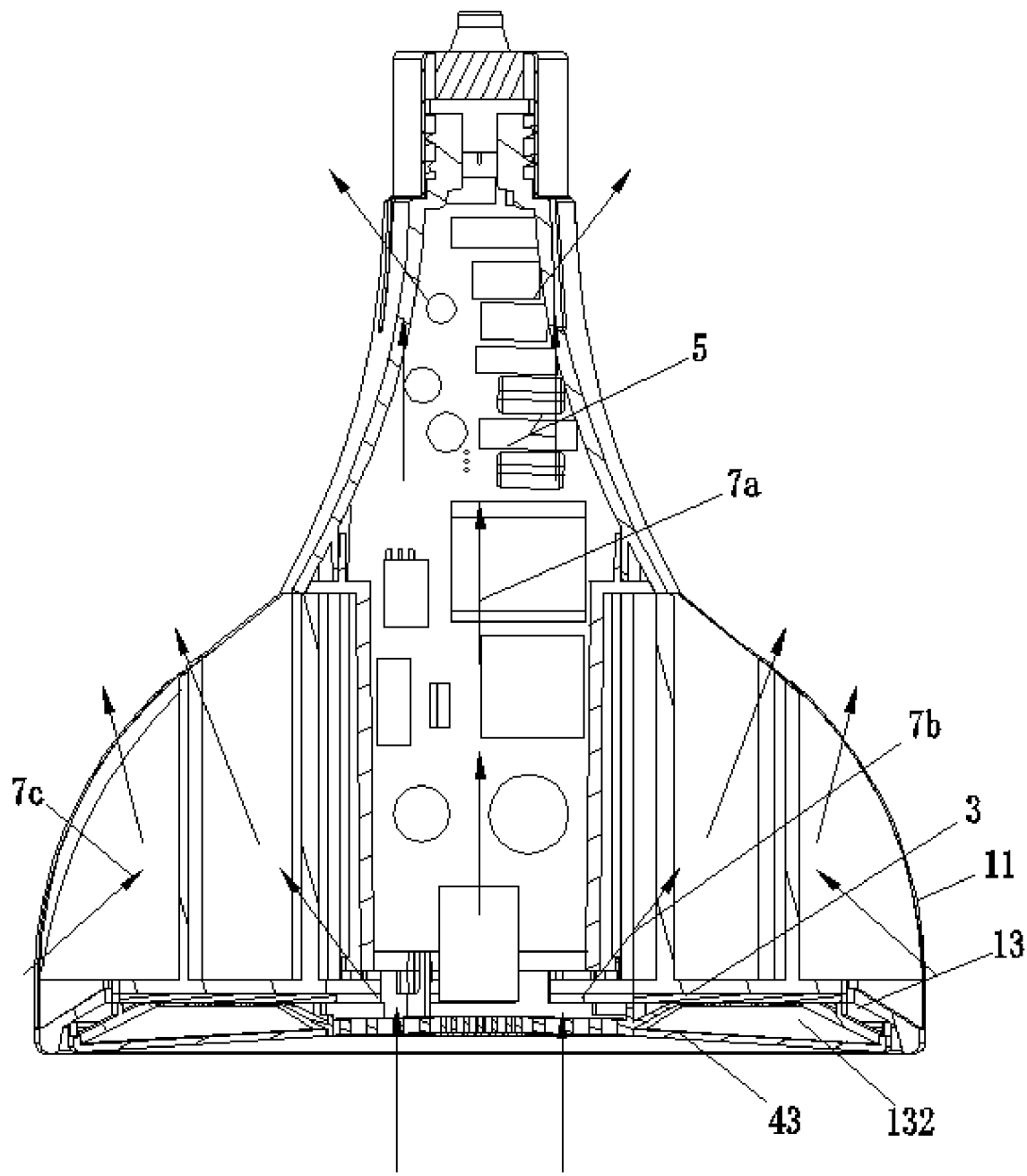
FIG. 4 is a schematic cross-sectional view of the LED lamp of FIG. 1, which shows the first heat dissipating channel and the second heat dissipating channel.

FIG. 4 is a schematic cross-sectional view of the LED lamp. As shown in FIGS. 2 and 4, the chamber of the lamp shell 2 of this embodiment is formed with a first heat dissipating channel 7a. An end of the first heat dissipating channel is formed with a first air inlet 2201. An opposite end of the lamp shell 2 is formed with a venting hole 222 (at an upper portion of the lamp neck 22). Air flows into the first heat dissipating channel 2201 and flows out from the venting hole 222 for bringing out heat in the first heat dissipating channel 7a (primarily, heat of the working power source 5). As for the path of heat dissipation, heat generated from the heat-generating components of the working power source 5 is transferred to air (around the heat-generating components) in the first heat dissipating channel 7a by thermal radiation first, and then external air enters the first heat dissipating channel 7a by convection to bring out internal air to make heat dissipation. In this embodiment, the venting hole 222 at the lamp neck 22 can also make direct heat dissipation.

As shown in FIGS. 1, 2 and 4, a second heat dissipating channel 7b is formed in the fins and the base 13 of the heat sink 1. The second heat dissipating channel 7b has a second air inlet 1301. In this embodiment, the first air inlet 2201 and the second air inlet 1301 share the same opening formed on the light board 3. This will be described in more detail later. Air flows from outside of the LED lamp into the second air inlet 1301, passes through the second heat dissipating channel 7b and finally flows out from spaces between the fins 11 so as to bring out heat of the fins 11 to enhance heat dissipation of the fins 11. As for the path of heat dissipation, heat generated from the LED chips is conducted to the heat sink 1, the fins 11 of the heat sink 1 radiate the heat to surrounding air, and convection is performed in the second heat dissipating channel 7b to bring out heated air in the heat sink 1 to make heat dissipation.

As shown in FIGS. 1 and 4, the heat sink 1 is provided with a third heat dissipating channel 7c formed between adjacent two of the fins 11 or in a space between two sheets extending from a single fin 11. A radial outer portion between two fins 11 forms an intake of the third heat dissipating channel 7c. Air flows into the third heat dissipating channel 7c through the radial outer portion of the LED lamp to bring out heat radiated from the heat sink 11 to air.

Figure 5:
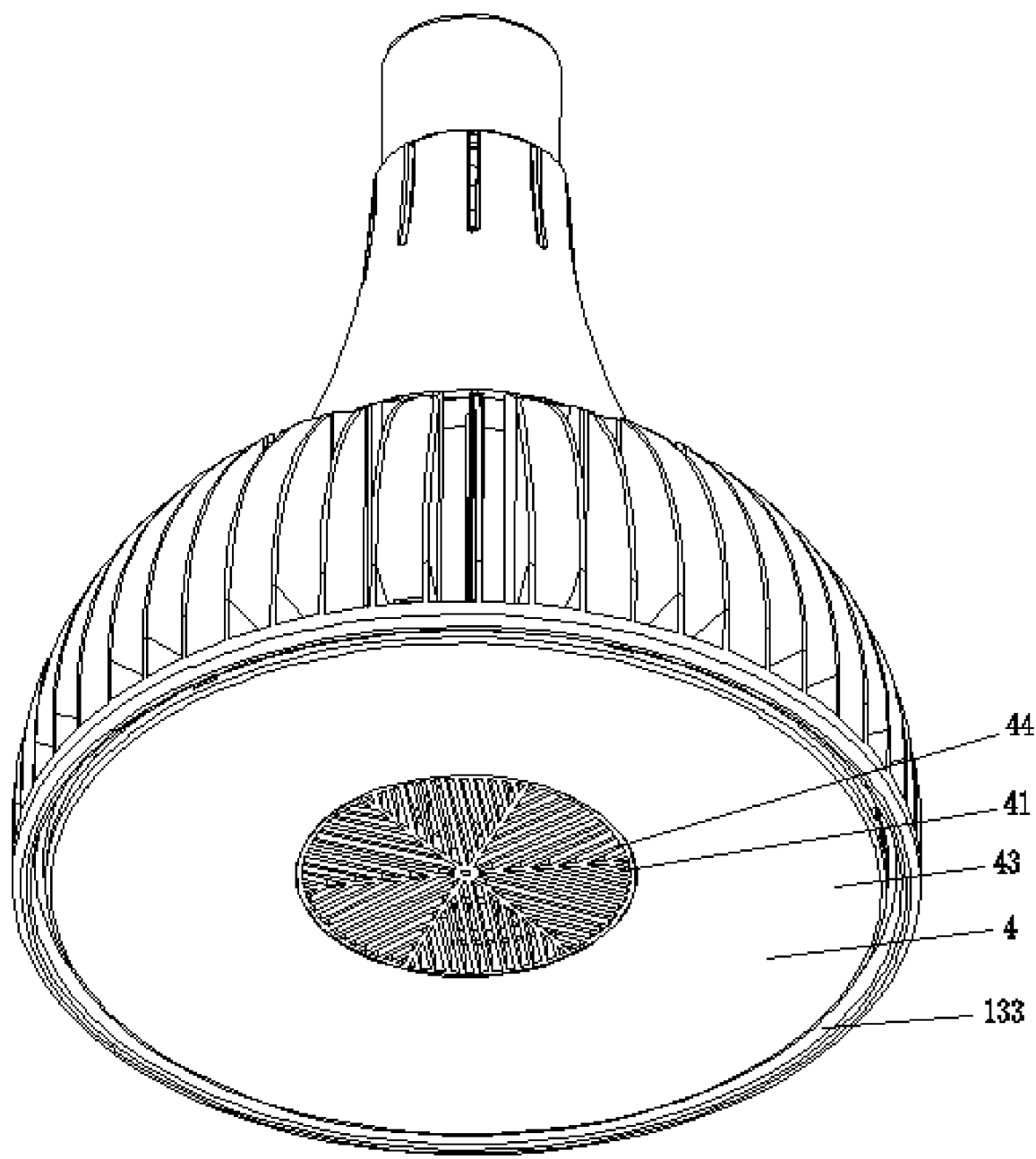
FIG. 5 is a perspective view of the LED lamp of FIG. 1.
Figure 6:
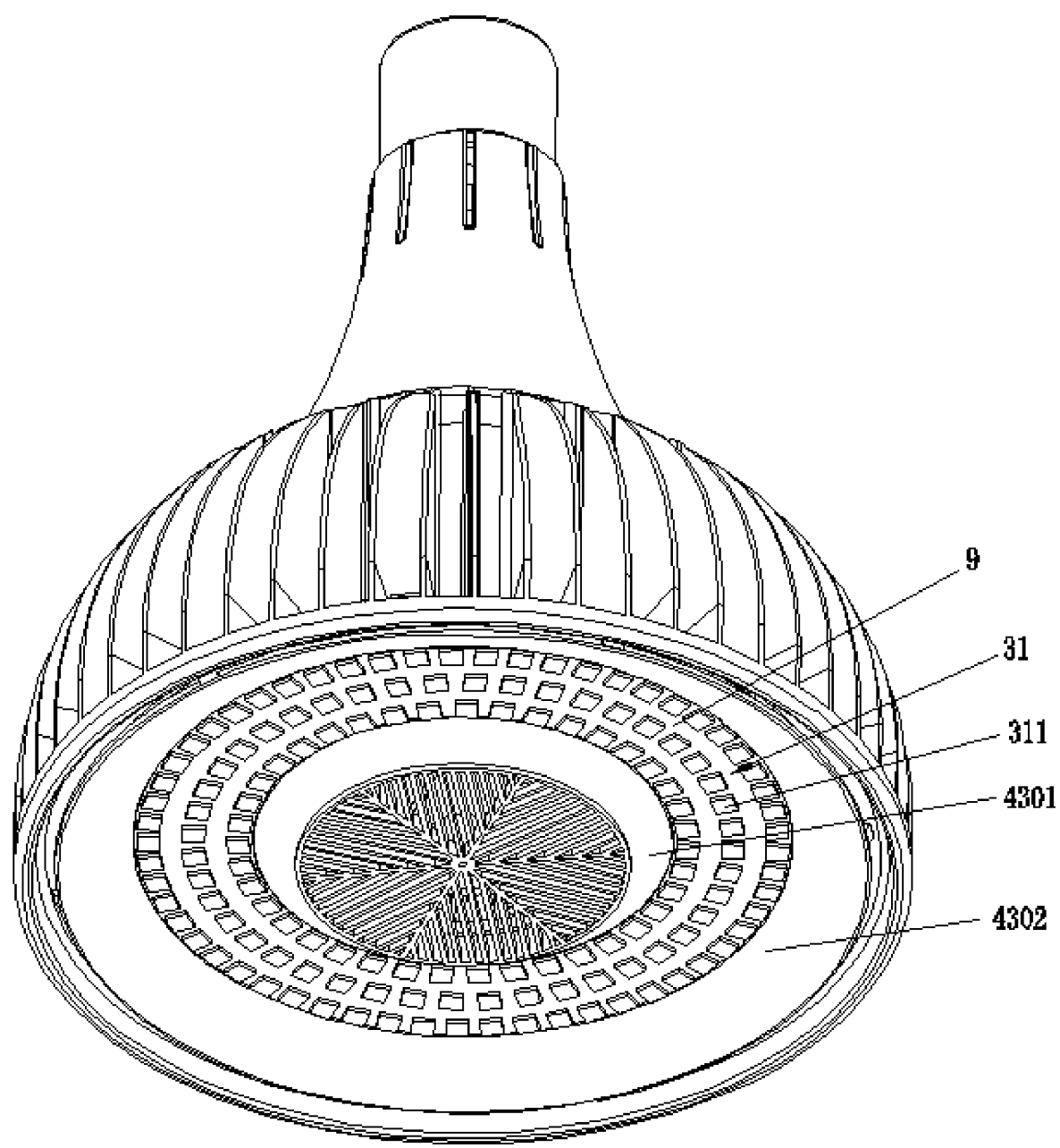
FIG. 6 is a structural schematic view of FIG. 5 without the light output surface.

FIG. 5 is a perspective view of the LED lamp of an embodiment, which shows assembling of the heat sink 1 and the lamp cover 4. FIG. 6 is a structural schematic view of FIG. 5 without the light output surface 43. As shown in FIGS. 5 and 6, in this embodiment, the lamp cover 4 includes a light output surface 43 and an end surface 44 with a vent 41. Air flows into both the first heat dissipating channel 7a and the second heat dissipating channel 7b through the vent 41. When the LED chips 311 (shown in FIG. 6) are illuminated, the light passes through the light output surface 43 to be projected from the lamp cover 4. In this embodiment, the light output surface 43 may use currently available light-permeable material such as glass, PC, etc. The term "LED chip" mentioned in all embodiments of the invention means all light sources with one or more LEDs (light emitting diodes) as a main part, and includes but is not limited to an LED bead, an LED strip or an LED filament. Thus, the LED chip mentioned herein may be equivalent to an LED bead, an LED strip or an LED filament. As shown in FIG. 5, in this embodiment, the ratio of area of the light output surface 43 to area of the end surface 44 is 4~7. Preferably, the ratio of area of the light output surface 43 (area of a single side of the light output surface 43, i.e. area of surface of the side away from the LED chips 311) to area of the end surface 44 (area of a single side of the end surface 44, i.e. area of surface of the side away from the LED chips 311, including area of the vent 41) is 5~6. More preferably, the ratio of area of the light output surface 43 to area of the end surface 44 is 5.5. The end surface 44 is used for allowing air to pass to enter both the first heat dissipating channel 7a and the second heat dissipating channel 7b. The light output surface 43 allows light from the light source to output. As a result, a balance can be accomplished between the light output and the heat dissipation. In this embodiment, to satisfy the requirement of air intake of both the first heat dissipating channel 7a and the second heat dissipating channel 7b, the ratio of area of the lamp cover 4 to area of the end surface 44 is 6~7. As a result, a balance can be accomplished between the light output and air required by the heat dissipation.

In this embodiment, area of the light output surface 43 (area of a single side of the light output surface 43, i.e. area of surface of the side away from the LED chips 311) is above three times as large as area of light emitting surface of all the LED chips 31 but does not exceed ten times. Width of the light output region can be controlled when it is provided sufficiently.

Figure 7:
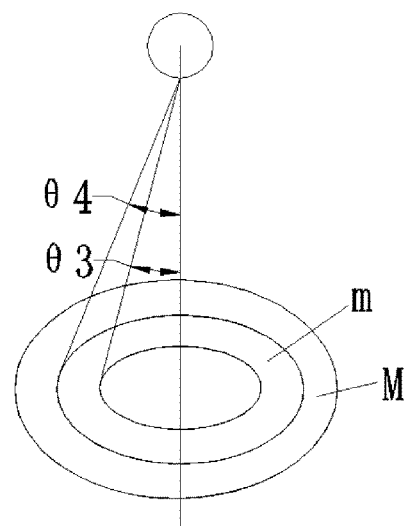
FIG. 7 is a schematic view of light projection of the LED lamp of FIG. 1.
Figure 8:
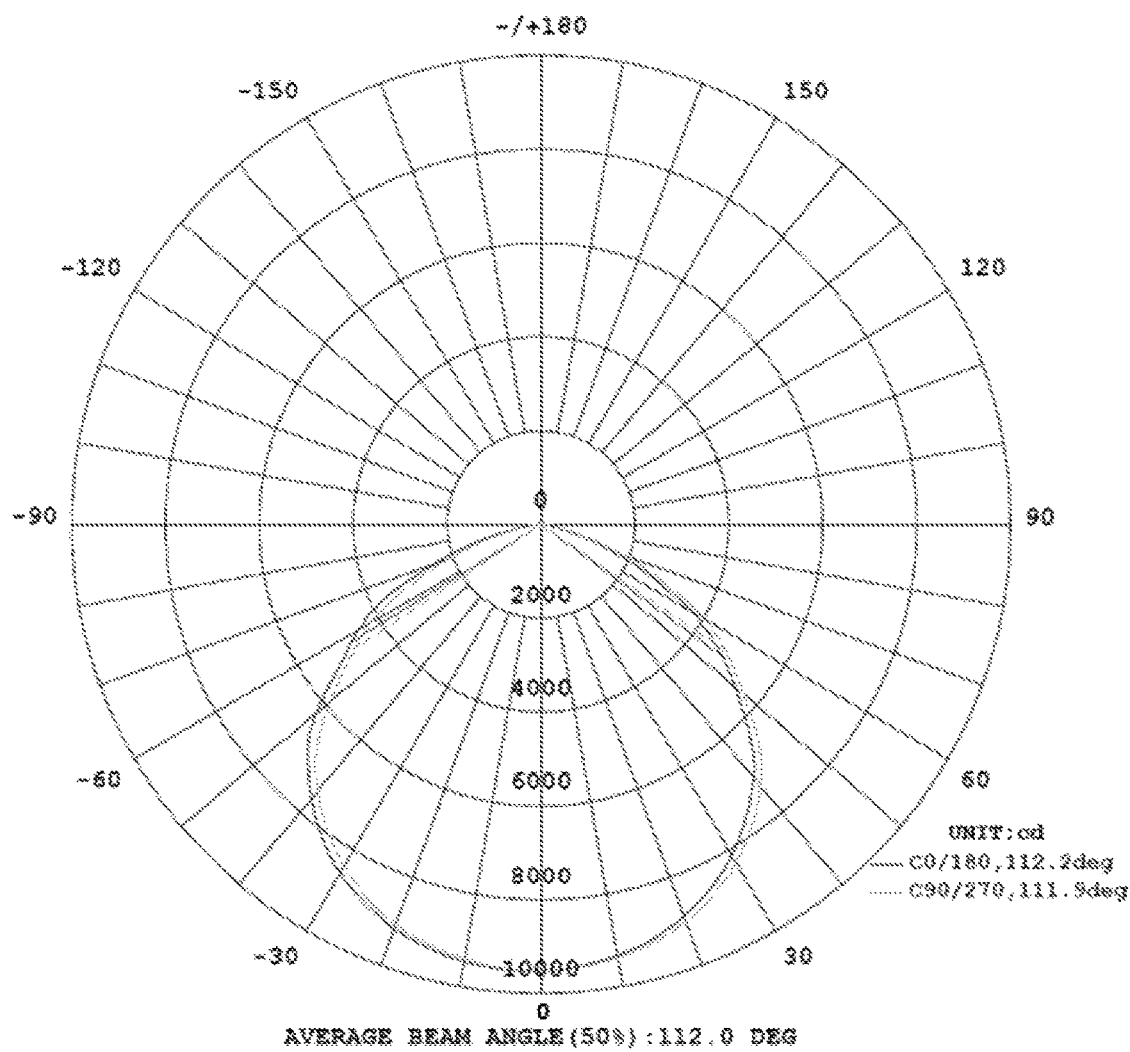
FIG. 8 is a light pattern of FIG. 7.

As shown in FIGS. 5 and 6, in this embodiment, an inner reflecting surface 4301 is disposed inside the light output surface 43 of the lamp cover 4. The inner reflecting surface 4301 is disposed in the inner circle of the array of LED chips 311. In an embodiment, an outer reflecting surface 4302 is disposed in the outer circle of the array of LED chips 311. The outer reflecting surface 4302 corresponds to the LED chips 311 on the light board 3. The arrangement of both the inner reflecting surface 4301 and the outer reflecting surface 4302 is used for adjusting a light emitting range of the LED chip set 31 to make the light concentrated and to increase brightness in a local area. For example, under the condition of the same luminous flux, illuminance of the LED lamp can be increased. In one example, all the LED chips 311 in this embodiment are mounted on the bottom side of the light board 3 (in a using status). In this embodiment, the LED lamp of the present embodiment does not emit lateral light from the LED chips 311. When working, the primary light emitting surfaces of the LED chips 311 are completely downward. At least 60% of the light from the LED chips 311 are emitted through the light output surface 43 without reflection. As a result, in comparison with those LED lamps with lateral light (the lateral light is reflected by a cover or a lampshade to be emitted downward, and in theory there must be part of light loss in the process of reflection.) The LED chips 311 in this embodiment possess better light emitting efficiency. In one example, under the condition of the same lumen value (luminous flux), the LED lamp in the present embodiment possesses higher illuminance. And the emitted light can be concentrated to increase illuminance in a local area by the arrangement of both the inner reflecting surface 4301 and the outer reflecting surface 4302, for example, in an area under the LED lamp between 120 degrees and 130 degrees (a light emitting range under the LED lamp between 120 degrees and 130 degrees). When the LED lamp is installed at a relatively high position, in the same angular range of light emitting, the lit area of the LED lamp still satisfies the requirement and illuminance in this area can be higher. FIG. 7 is a schematic view of light transmission of this embodiment and FIG. 8 is a light pattern of FIG. 7. As shown in FIGS. 5-8, in the aspect of the light emitting effect, in the projected area of the LED lamp, i.e. the projected area M under the LED lamp, there is a light concentrating area m within the projected area M, the LED lamp including the reflecting surface reflects at least part of light from the LED chips 311 onto the light concentrated area m to increase brightness of the light concentrated area m. The reflecting surface includes the inner reflecting surface 4301 and the outer reflecting surface 4302. Both the inner reflecting surface 4301 and the outer reflecting surface 4302 reflect at least part of light from the LED chips 311 onto the light concentrated area m. Preferably, in this embodiment, at least 5% of luminous flux of the light source is reflected to pass through the light output surface 43. In practice, total luminous flux of the light reflected by both the inner reflecting surface 4301 and the outer reflecting surface 4302 and emitted through the light output surface 43 is at least 1000 lm. Preferably, total luminous flux of the light reflected by both the inner reflecting surface 4301 and the outer reflecting surface 4302 and emitted through the light output surface 43 is at least 1500 lm. Total luminous flux of the light reflected by the outer reflecting surface 4302 is greater than that of the light reflected by the inner reflecting surface 4301. This shows that, about the problem of glare resulting from an LED lamp with high lumen, disposing the outer reflecting area 4302 can reflect considerable part of lateral luminous flux. This can significantly reduce the glare. In this embodiment, the light concentrated area m is an annular region. In this embodiment, a center angle between an inner edge of the light concentrated area m and an axis of the LED lamp is 20 degrees, and a center angle between an outer edge of the light concentrated area m and an axis of the LED lamp is 50 degrees. In this embodiment, luminous flux of the light projected by the LED lamp onto the light concentrated area m accounts for 35%~50% of the total luminous flux, so that the light concentrated area m possesses a better lighting effect. In addition, by the arrangement of both the inner reflecting surface 4301 and the outer reflecting surface 4302, not only can the lateral light be reduced to prevent glare, but also at least part of light from the LED chips 311 can be reflected onto the projected area M to enhance illuminance in the projected area M.

The inner reflecting surface 4301 is used for reflecting part of light emitted from the innermost LED chips 311 of the LED chip set 31. The outer reflecting surface 4302 is used for reflecting part of light emitted from the outermost LED chips of the LED chipset 31. The outermost LED chips 311 are greater than the innermost LED chips 311 in number. The outer reflecting surface 4302 is greater than the inner reflecting surface 4301 in area. Because the outermost portion of the LED chip set 31 includes more LED chips than the innermost portion, larger reflecting area is beneficial to regulate light output.

In this embodiment, the inner reflecting surface 4301 and the outer reflecting surface 4302 have first area A1 and second area A2, respectively. The LED chips 311 in the outermost portion of the LED chip set 31 and in the innermost portion of the LED chip set 31 are N1 and N2 in number, respectively. Their relationship is:

$$(A1/N1):(A2/N2)=0.4\sim1$$

When the ratio of area of the inner reflecting surface 4301 corresponding to a single LED chip 311 in the innermost portion of the LED chip set 31 to area of the outer reflecting surface 4302 corresponding to a single LED chip 311 in the outermost portion of the LED chip set 31 falls in the above range, both the LED chips 311 in the innermost portion of the LED chip set 31 and the LED chips 311 in the outermost portion of the LED chip set 31 have a better effect of light output.

As shown in FIG. 6, an inner edge of the inner reflecting surface 4301 abuts against the light board 3 to prevent light from passing through gaps between the inner reflecting surface 4301 and the light board 3 to avoid loss of part of light. Identically, an inner edge of the outer reflecting surface 4302 abuts against the light board 3 to prevent light from passing through gaps between the outer reflecting surface 4302 and the light board 3 to avoid loss of part of light.

As shown in FIG. 2, in this embodiment, an angle a is formed between two extending lines of both the inner and outer reflecting surfaces 4301, 4302. The angle a is between 80 degrees and 150 degrees. Preferably, the angle a is between 90 degrees and 135 degrees. More preferably, the angle a is between 100 degrees and 120 degrees. A reflecting-cup-like structure is formed between the inner and outer reflecting surfaces 4301, 4302 so as to control a light output range of the LED chips 311 and increase local intensity. In this embodiment, an angle between the outer reflecting surface 4302 and the light board 2 is 30 to 60 degrees. In some embodiments, the angle is 40 to 50 degrees.

As shown in FIG. 2, in this embodiment, the inner reflecting surface 4301 is lower than the outer reflecting surface 4302 in height. The height means a height of each of the both in an axis of the LED lamp. By the configuration of the inner reflecting surface 4301 being lower than the outer reflecting surface 4302 in height, decrease of a light distribution under the LED lamp can be avoided and a central portion of the light distribution region of the LED lamp can be prevented to be a dark part. In this embodiment, height of the outer reflecting surface 4302 in the axis of the LED lamp is not greater than 20 mm. Preferably, height of the outer reflecting surface 4302 in the axis of the LED lamp is not greater than 15 mm. On the other hand, to control overall height of the LED lamp, height of the outer reflecting surface 4302 accounts for not over 9% of overall height of the LED lamp. Preferably, height of the outer reflecting surface 4302 accounts for not over 6% of overall height of the LED lamp. As for functions of the outer reflecting surface 4302, in some embodiments, height of the outer reflecting surface 4302 has to account for above 2% of overall height of the LED lamp. Preferably, in some embodiment height of the outer reflecting surface 4302 accounts for above 3% of overall height of the LED lamp. In one example, comprehensively considering control of height of the LED lamp and functions of reflection, light concentration, anti-glare, etc., it is necessary that height of the outer reflecting surface 4302 accounts for 2%~9% of overall height of the LED lamp. Preferably, height of the outer reflecting surface 4302 accounts for 3%~6% of overall height of the LED lamp.

Figure 9:
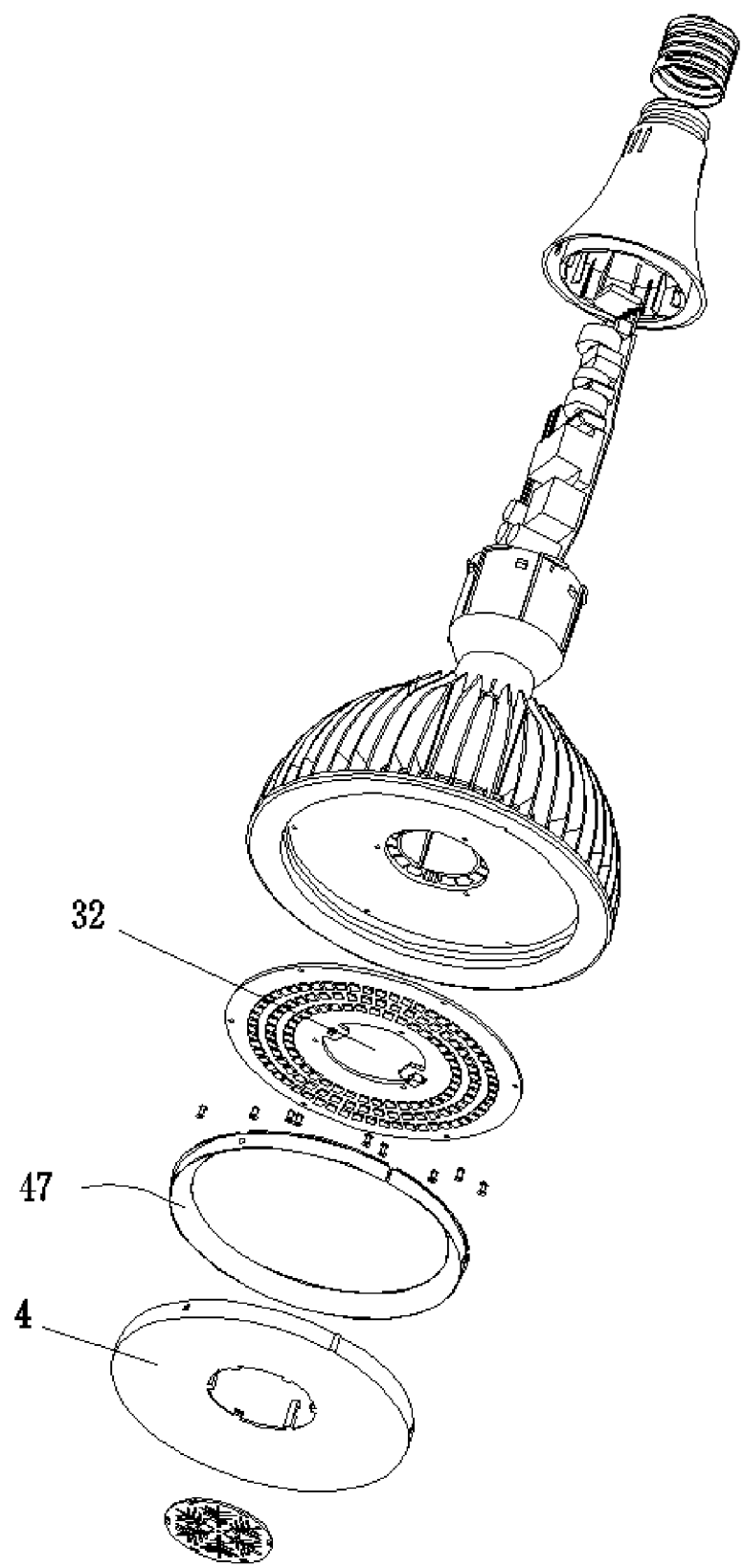
FIG. 9 is an exploded view of another embodiment of an LED lamp according to aspects of the invention, which shows a shading ring.

In the LED lamps in some embodiments, both the inner and outer reflecting surfaces can be omitted, for example, a shading ring 47 may be disposed. As shown in FIG. 9, the shading ring 47 is disposed on a periphery of the lamp cover 4 to improve efficiency of light output of the lamp. A surface of the shading ring 47 possesses a reflecting effect (similar to the outer reflecting surface 4302 as mentioned in the previous embodiment). When the lamp cover 4 is attached on the heat sink 1, the shading ring 47 nears a periphery of the light board 3, for example, an outer diameter of the shading ring 47 is the same as or slightly greater than that of the light board 3.

As show in FIGS. 5 and 6, in this embodiment, in order to prevent dust from covering on the LED chips 311 to reduce light efficiency of the LED chips or affect heat dissipation of the LED chips 311, the LED chips 311 may be received in a sealed room. For example, a sealed chamber 9 is formed between the light output surface 43, the inner reflecting surface 4301, the outer reflecting surface 4302 and the light board 3 (this term "sealed" mentioned here may mean "without obvious pores", not including unavoidable gaps in an assembling process). In some embodiments, when omitting both the inner and outer reflecting surfaces 4301, 4302, the sealed chamber 9 is formed between the light output surface 43 and the light board 3 or between the light output surface 43, the heat sink 1 and the light board 3.

Figure 10:
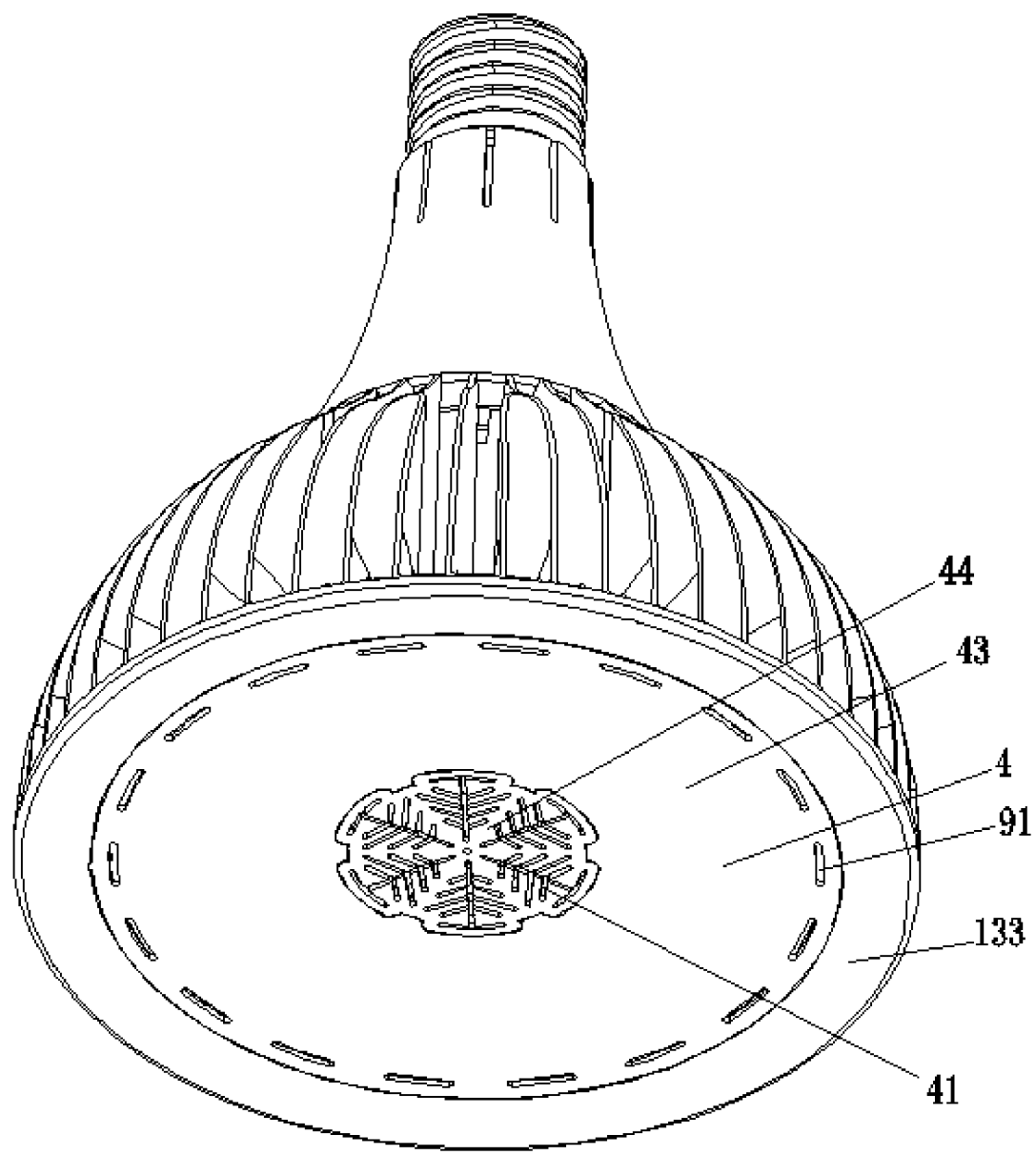
FIG. 10 is a perspective view of another embodiment of an LED lamp according to aspects of the invention.
Figure 11:
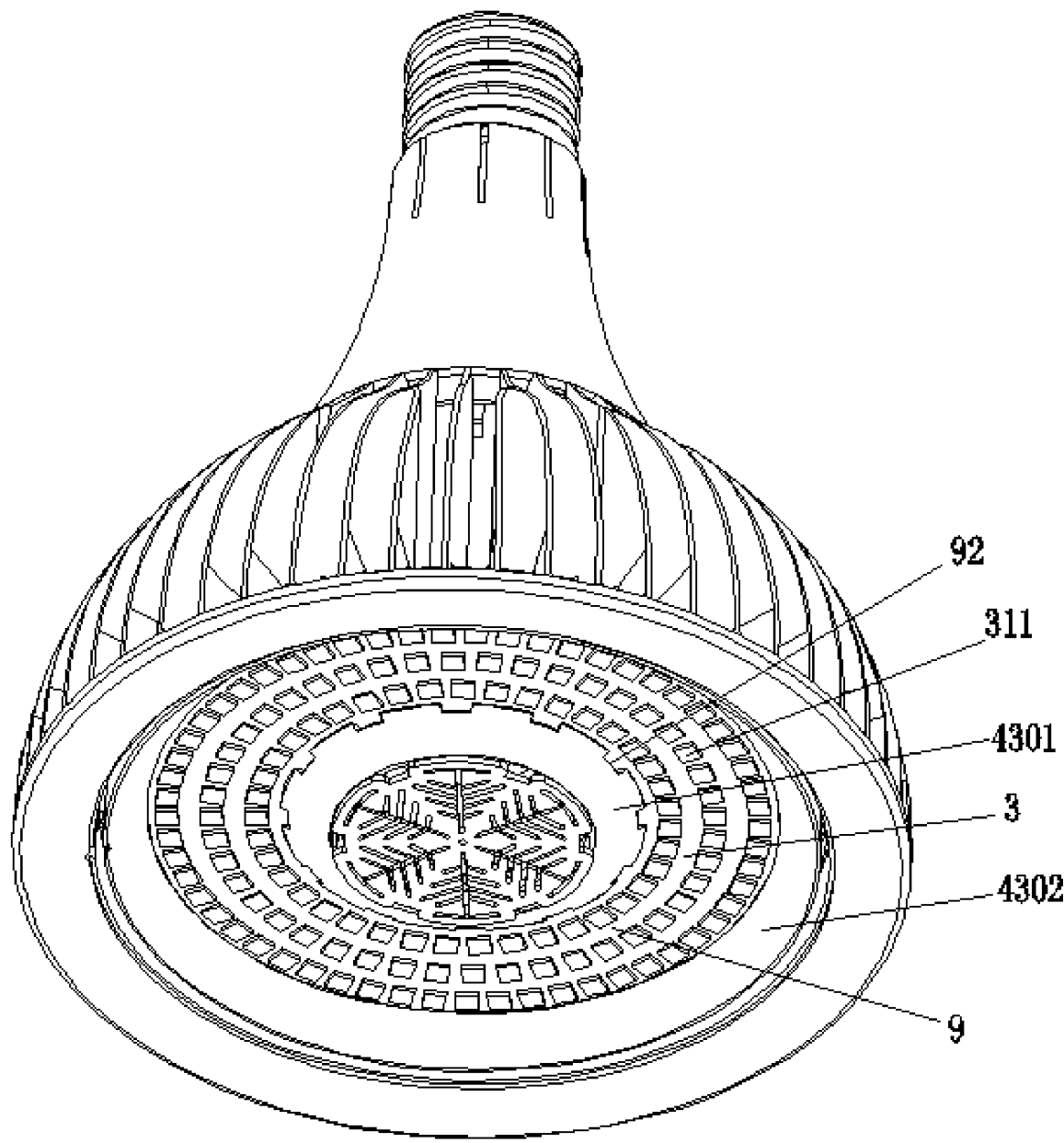
FIG. 11 is a schematic view of FIG. 10 without the light output surface.

FIG. 10 is a perspective view of another embodiment of the LED lamp of the invention. It differs from the above embodiment by holes formed in the chamber 9. FIG. 11 is a schematic view of FIG. 10 without the light output surface 43. As shown in FIGS. 10 and 11, in some embodiments, a chamber 9 is formed between the light cover 4 and the light board 3. In detail, the chamber 9 is formed between the light output surface 43, the inner reflecting surface 4301, the outer reflecting surface 4302 and the light board 3 and the LED chips of the light board 3 are located in the chamber 9. The chamber 9 has first apertures 91 and second apertures 92. The first apertures 91 are configured to communicate with the outside, and the second apertures 92 are configured to communicate simultaneously with both the first heat dissipating channel 7a and the second heat dissipating channel 7b. In an aspect of heat dissipation, air convection is formed in the chamber 9 to bring out part of heat generated from the LED chips 311, and outside air flows into the LED lamp through the chamber 9 so as to enhance convection in both the first heat dissipating channel 7a and the second heat dissipating channel 7b. In some embodiments, both the inner and outer reflecting surfaces 4301, 4302 may be omitted. In one example, a chamber 9 is formed between the light output surface 43 and the light board 3.

As shown in FIG. 10, in some embodiments, the light output surface 43 is provided with a hole to form the first apertures 91. Preferably, the first apertures 91 are annularly located at a circumferential portion of the light output surface 43 to make it not affect the effect of light penetration of the light output surface 43. In an aspect of structure, the light output surface 43 may be thermally deformed while the LED lamp is working. The first apertures 91 makes the light output surface 43 have a deformable space to prevent the light output surface 43 from being deformed to press the heat sink and cause damage of the light output surface 43. In this embodiment, the first apertures 91 are annularly located at a circumferential portion of the light output surface 43. As a result, air convection can be enhanced and structural strength of the light output surface 43 heated can also be reinforced.

As shown in FIG. 11, in some embodiments, the inner reflecting surface 4301 is provided with notches to form the second apertures 92. In this embodiment, the second apertures 92 are annularly located at a circumferential portion of the inner reflecting surface 4301. The ratio of the number of the second apertures 92 to that of the first apertures 91 is about 1:1~2, preferably, 1:1.5. Thus, air intake and outtake can be balanced. In other embodiments, both the first apertures 91 and the second apertures 92 may also be formed at other portions of the lamp cover 4 such as the light board 3 or the base 13 of the heat sink 1.

As shown in FIGS. 10 and 11, in some embodiments, a chamber 9 is formed between the light cover 4 and the light board 3. In detail, the chamber 9 is formed between the light output surface 43, the inner reflecting surface 4301, the outer reflecting surface 4302 and the light board 3 and the LED chips 311 of the light board 3 are located in the chamber 9. The chamber 9 has pressure release apertures to prevent temperature and pressure in the chamber from being raised by the working LED chips 311. The pressure release aperture may be the first apertures 91 of the light output surface 43, the second apertures 92 of the inner reflecting surface 4301, or holes at the heat sink 1 or the light board 3, which communicate with the chamber 9.

As shown in FIG. 4, the distance between the light output surface 43 and the light board 3 is gradually outwardly larger and larger so as to make the light output surface 43 concave. Thus, in comparison with a flat surface, such a light output surface 43 can be structurally reinforced. In addition, the gradually smooth slant of the light output surface 43 does not has an angle so as to make thickness of the light output surface 43 even not to affect an effect of light output. Finally, in an aspect of use, the light board 3 generates heat from the light source while the LED lamp is working. If the light output surface 43 is a flat plane parallel to the horizon (the LED lamp is hung on a ceiling), then the heated light output surface 43 will horizontally thermally expand. As a result, the heat sink 1 may be damaged by being pressed. In this embodiment, when the light output surface 43 is of a concave shape, its expansion direction will be different from the above, for example, the expansion direction is divided into a horizontal portion and a downward vertical portion. This can reduce the thermal expansion in the horizontal direction to prevent the lamp cover 4 from being damaged by being pressed by the heat sink 1.

Figure 12:
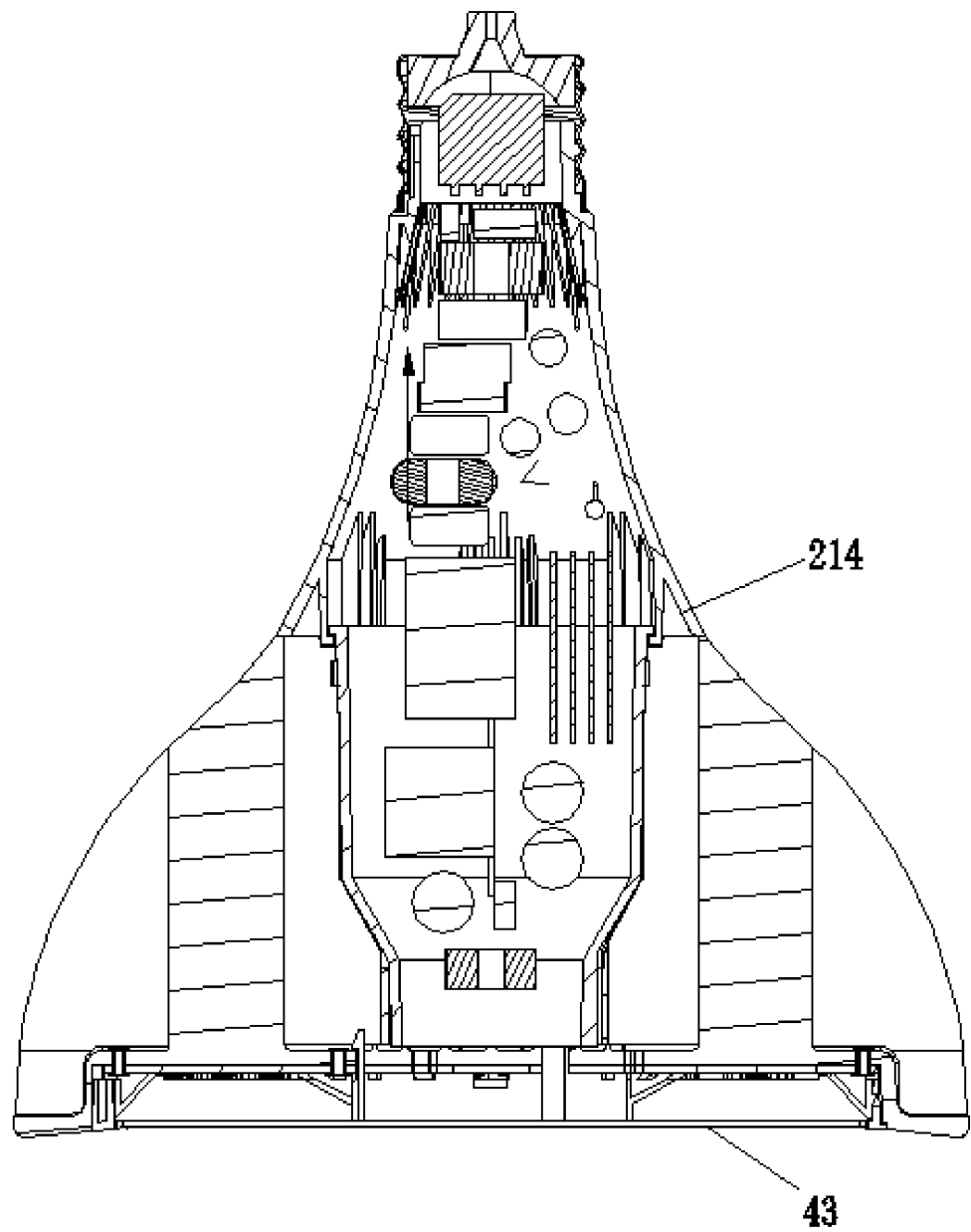
FIG. 12 is a cross-sectional view of another embodiment of the LED lamp according to aspects of the invention, which shows the flat light output surface.

As shown in FIG. 12, in some embodiments, the light output surface 43 may also be a flat plane, but a thermal expansion coefficient of the material of the light output surface 43, a distance between the light output surface 43 and the heat sink 1 and resistance to deformation of the light output surface 43 should be seriously considered. For example, when the light output surface 43 is a flat plane, the distance between the light output surface 43 and the heat sink 1 should be large enough to guarantee expansion of the light output surface 43 not to be pressed by the heat sink 1.

Figure 13A:
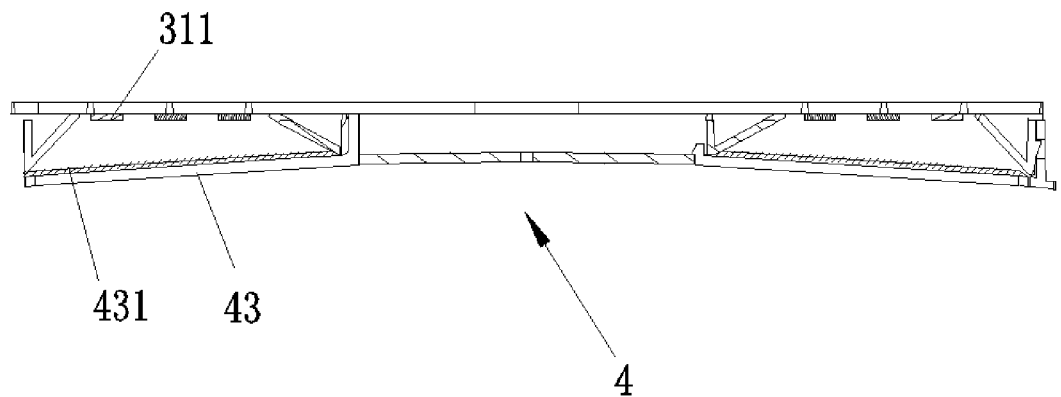
FIG. 13A is a schematic view of an embodiment of the combination of the light board and the lamp cover.
Figure 13B:
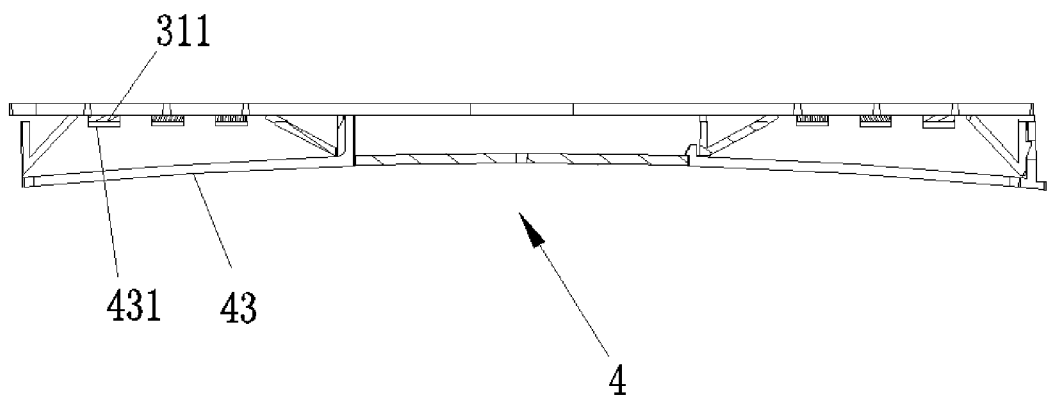
FIG. 13B is a schematic view of another embodiment of the combination of the light board and the lamp cover.
Figure 13C:
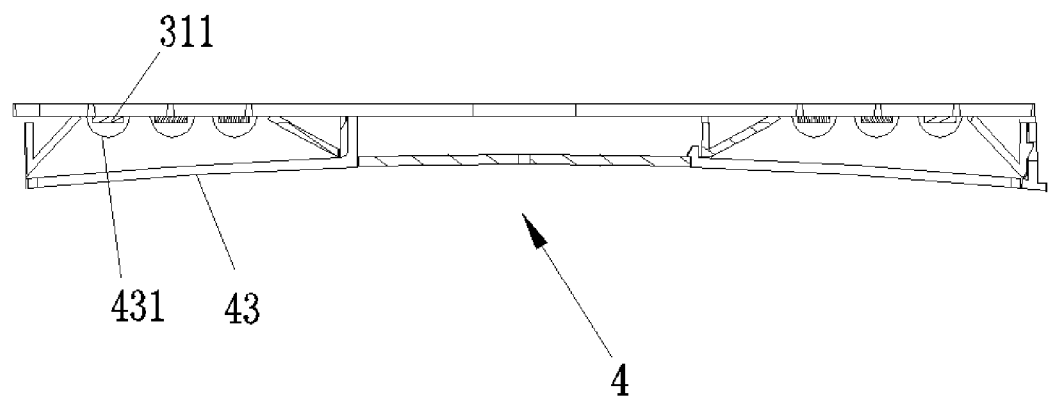
FIG. 13C is a schematic view of still another embodiment of the combination of the light board and the lamp cover.

In some embodiments, the light output surface 43 is provided with an optical coating, for example, the light output surface 43 is coated with a diffusion film 431 through which light emitted from the LED chips 311 passes to penetrate the lamp cover 4. In a few words, the diffusion film 431 diffuses light emitted from the LED chips 311. The diffusion film 431 can be disposed in various manners, for example, the diffusion film may be coated or cover an inner surface of the light output surface 43 (as shown in FIG. 13A), or a diffusion coating coated on the LED chips 311 (as shown in FIG. 13B), or a cloak covering the LED chips 311 (as shown in FIG. 13C).

Figure 14:
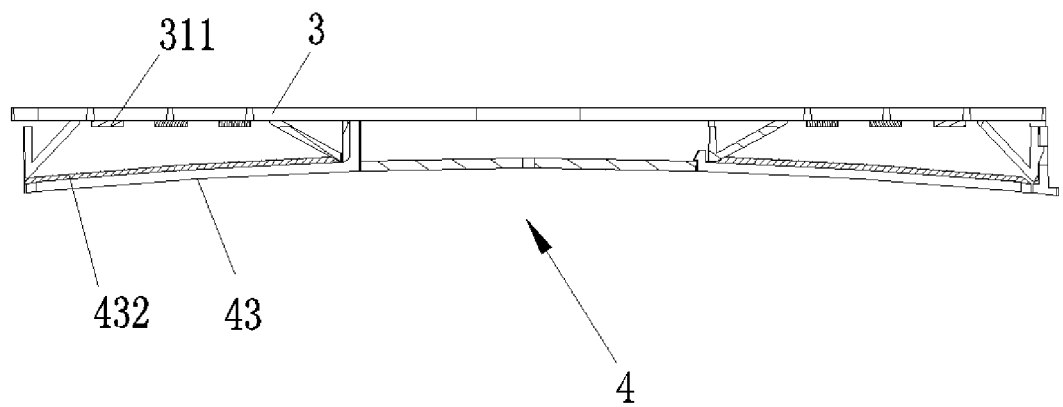
FIG. 14 is a schematic view of yet another embodiment of the combination of the light board and the lamp cover.

FIG. 14 is a schematic view of the combination of the light board 3 and the lamp cover 4. As shown, in some embodiments, a side of the light output surface 43, which nears the LED chips 311, i.e. an inner side of the light output surface 43, is provided with an anti-reflection coating 432 to reduce reflection of light from the LED chips 311 to the light output surface 43 and increase light-permeability of the light output surface 43. The refractive index of the anti-reflection coating 432 in this embodiment is between the reflectivity of air and glass. The anti-reflection coating 432 includes metal oxide which accounts 1%-99% of overall weight of the anti-reflection coating 432. The reflectivity of the anti-reflection coating 432 is less than 2%. Metal oxide in this embodiment may be zirconia, tin oxide, tin oxide, aluminum oxide, etc.

The diffusion film 431 (in FIG. 13) and the anti-reflection coating 432 may be used together or alternatively used. It can be selected according to actual requirements.

Figure 15:
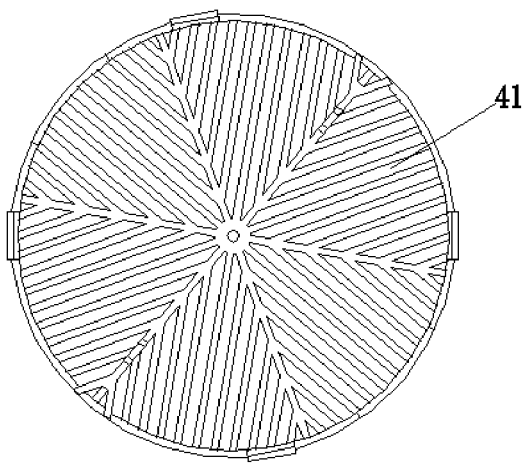
FIG. 15 is a schematic view of an end surface of the lamp cover of an embodiment.

FIG. 15 is a schematic view of an end surface 44 of the lamp cover 4 of an embodiment. As shown, the ratio of a total of cross-sectional area of the vent 41 to overall area of the end surface 44 (area of a single side of the end surface 44, such as the side away from the LED chips 311) is 0.01~0.7. Preferably, the ratio of a total of cross-sectional area of the vent 41 to overall area of the end surface 44 is 0.3~0.6. More preferably, the ratio of a total of cross-sectional area of the vent 41 to overall area of the end surface 44 is 0.4~0.55. By limiting the ratio of a total of cross-sectional of the vent 41 to overall area of the end surface 44 to the above ranges, not only can air intake of the vent 41 be guaranteed, but also adjustment of area of the vent 41 is implemented under ensuring structural strength of the end surface 44. When the ratio of area of the vent 41 to area of the end surface 44 is 0.4~0.55, not only can air intake of the vent 41 be guaranteed to satisfy requirements of heat dissipation of the LED lamp, but also the vent 41 does not affect structural strength of the end surface 44 to prevent the end surface 44 with the vent 41 from being fragile due to collision or pressure.

Figure 16:
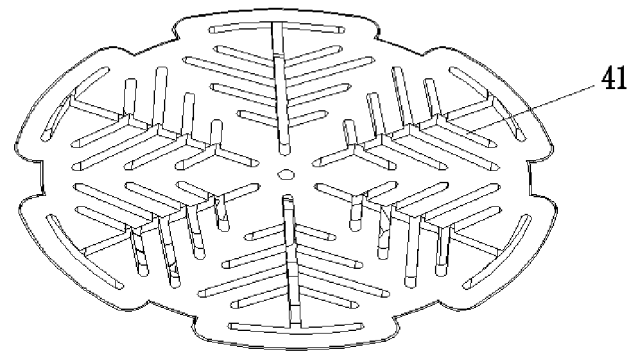
FIG. 16 is a schematic view of an end surface of the lamp cover, according to another embodiment of the present invention.
Figure 17:
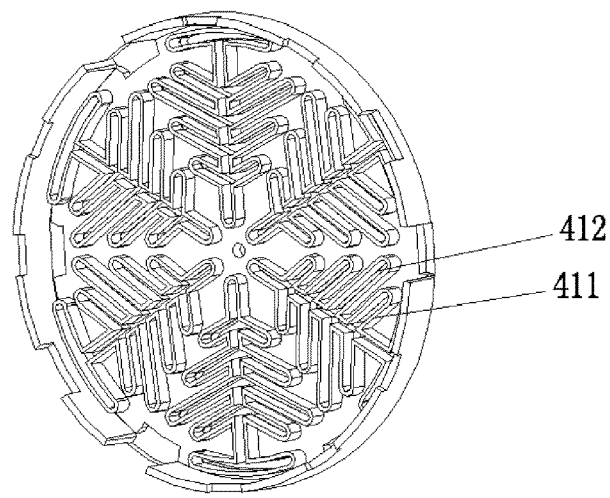
FIG. 17 is another view of the end surface of FIG. 16.

FIG. 16 is a schematic view of an end surface 44 of the lamp cover 4 of another embodiment. As shown in FIGS. 16 and 17, a periphery of the vent 41 has an enlarged thickness to form rib portions 411. An air guide opening 412 in a direction of air intake of the vent 41 is formed between adjacent two of the rib portions 411. A periphery of the vent 41 with an enlarged thickness can enhance structural strength of the end surface 44 to avoid reduction of overall structural strength due to the vent 41. On the other hand, the air guide opening 412 has an effect of air guiding to make air flowing into the air guide opening 412 have a specific direction. In addition, when the end surface 44 is being formed, the rib portion 411 avoid reduction of overall structural strength of the end surface 44. Thus, the end surface 44 is hard to be deformed because of the vent 41 to increase the yield rate of manufacture. In this embodiment, the rib portions 411 are formed on the side of the end surface 44, which is adjacent to the light board.

As shown in FIG. 17, the thickness of periphery of the vent 41 is greater than that of other portions of the end surface 44 so as to improve strength of the parts around the vent 41 and the effect of air guiding.

As shown in FIG. 15, a diameter of a maximum inscribed circle of the vent 41 is less than 2 mm, preferably, 1.0~1.9 mm. As a result, both bugs and most dust can be resisted, and venting efficiency of the vent 41 can be kept great enough. In one example, alternatively, the vent 41 defines both a length direction and a width direction, i.e. the vent has a length and a width, and the length is greater than the width. The largest width of inscribed circle of the vent 41 may be less than 2 mm. In an embodiment, the largest width is from 1 mm to 1.9 mm. In addition, the largest width of the vent 41 may be greater than 1 mm. If the width of the vent 41 is less than 1 mm, then more pressure is required to push air to enter the vent 41, which is advanced for venting.

Figure 18A:
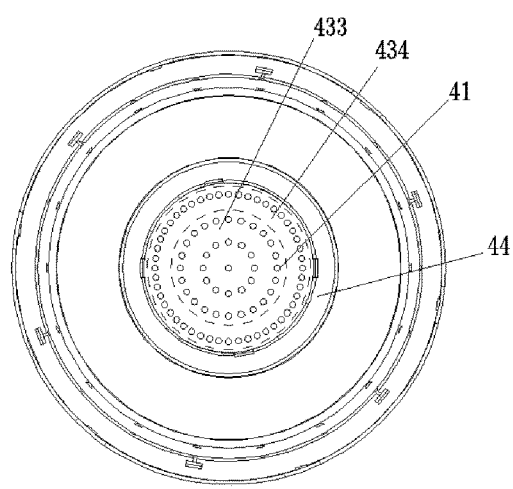
FIGS. 18A~18G are schematic views of some embodiments of the lamp cover.
Figure 18B:
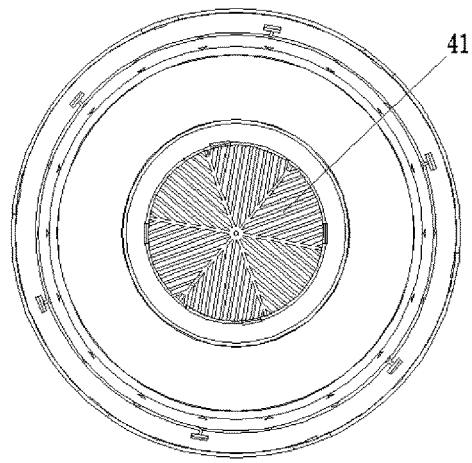
Figure 18C:
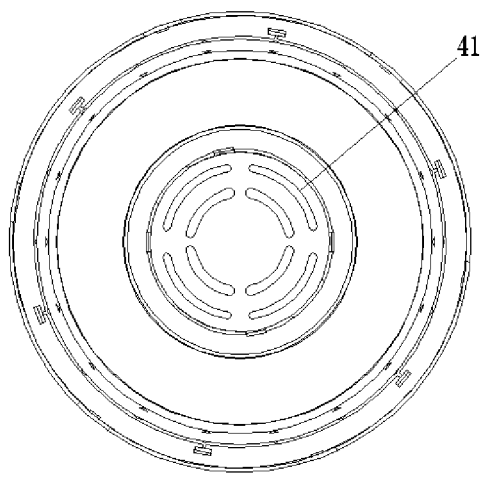
Figure 18D:
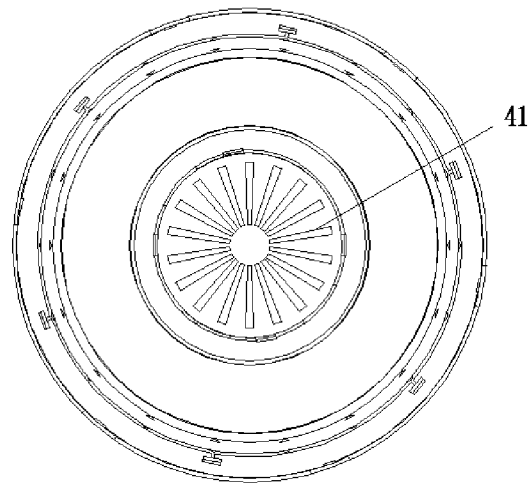
Figure 18E:
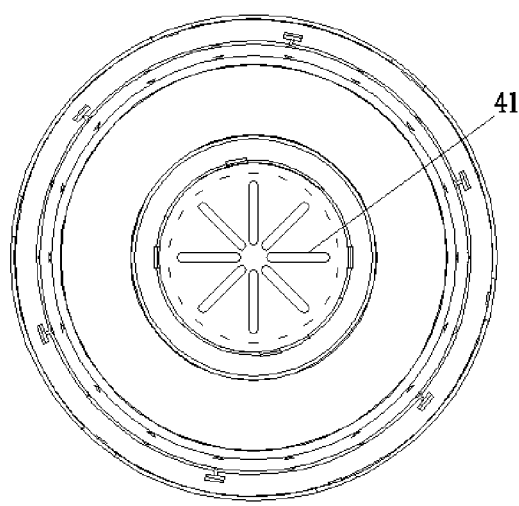
Figure 18F:
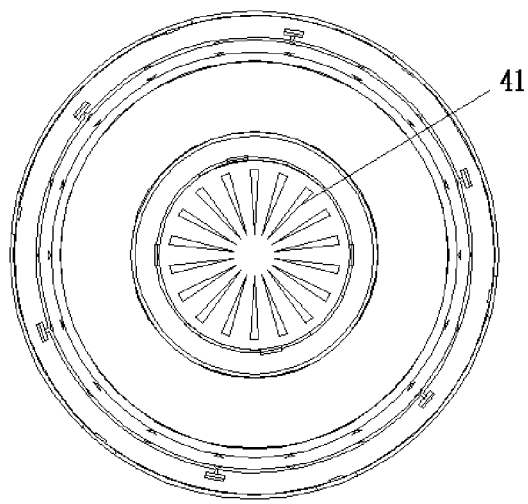
Figure 18G:
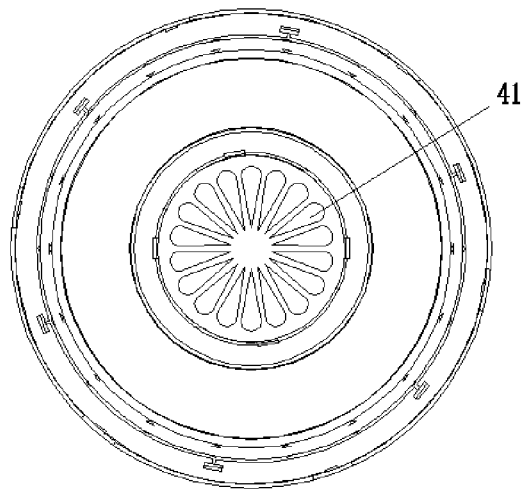

FIGS. 18A~18G show shapes of some embodiments of the vent 41. As shown in FIGS. 18A~18G, the vent 41 may be circular, strip-shaped, arced, trapezoidal, diamond or their combination. As shown in FIG. 18A, when the vent 41 is configured to be circular, its diameter should be less than 2 mm to resist bugs and most dust and venting efficiency of the vent 41 can be kept great enough. As shown in FIGS. 18B and 18C, when the vent 41 is configured to be strip-shaped or arced, its width should be less than 2 mm to accomplish the above effects. As shown in FIG. 18D, when the vent 41 is configured to be trapezoidal, its lower base should be less than 2 mm to accomplish the above effects. As shown in FIG. 18E, when the vent 41 is configured to be round-cornered rectangular, its width should be less than 2 mm to accomplish the above effects. As shown in FIGS. 18F and 18G, when the vent 41 is configured to be triangular or drop-shaped, a diameter of its maximum inscribed circle should be less than 2 mm.

In some embodiments, the vent 41 on the end surface 44 is multiple in numbers. For example, the vents 41 may be annularly arranged on the end surface 44 for even air intake. The vents 41 may also be radially arranged on the end surface 44. The vents 41 may also be irregularly arranged.

In FIG. 18A, there are two broken lines on the end surface 44. The inner broken line represents a position the first air inlet 2201 (as shown in FIG. 2) is projected onto the end surface 44. The region within the inner broken line is defined as a first portion (first opening region 433). The region between the inner circle and the outer circle is defined as a second portion (second opening region 434). In this embodiment, the first air inlet 2201 is projected onto the end surface in an axis of the LED lamp to occupy an area on the end surface 44, it is the first portion (first opening region 433). The other area on the end surface 44 is the second portion (second opening region 434). The vent 41 in the first portion is greater than the vent 41 in the second portion in area. Such an arrangement is advantageous to making most air flow into the first heat dissipating channel 7a for better effect of heat dissipation to the power source 5 and reduction of rapidly aging of electronic components of the power source 5. These features are also available to the vent 41 in other embodiments.

In other embodiments, the first air inlet 2201 is projected onto the end surface 44 in an axis of the LED lamp to occupy an area on the end surface 44, which may be a first portion (first opening region 433). The other area on the end surface 44 may be a second portion (second opening region 434). The vent 41 in the first portion is smaller than the vent 41 in the second portion in area. As a result, heat of the fins 11 can be better dissipated to perform better heat dissipation to the LED chips 311 and prevent a region around the LED chips 311 from forming high temperature. In detail, area of both the first portion and the second portion can be selected according to actual requirements.

In some applications, there may be a limit of overall weight of an LED lamp. For example, when an LED lamp adopts an E39 head, its maximum weight limit is 1.7 Kg. Thus, besides the fundamental elements such as a power source, a lamp cover and a lamp shell, in some embodiments, weight of a heat sink is limited within 1.2 Kg. For some high-power LED lamps, the power is about 150 W~300 W, and their luminous flux can reach 20000 lumens to 45000 lumens. Under a limit of weight, a heat sink should dissipate heat from an LED lamp with 20000~45000 lumens. Under a condition of heat dissipation of natural convection, usually power of 1 W needs area of heat dissipation of at least 35 square cm. The following embodiments intend to reduce area of heat dissipation for power of 1 W under guarantee of a receiving space of the power source 5 and effect of heat dissipation. Under a precondition of weight limit of the heat sink 1 and limit of the power source 5, the best effect of heat dissipation can be accomplished.

Figure 19A:
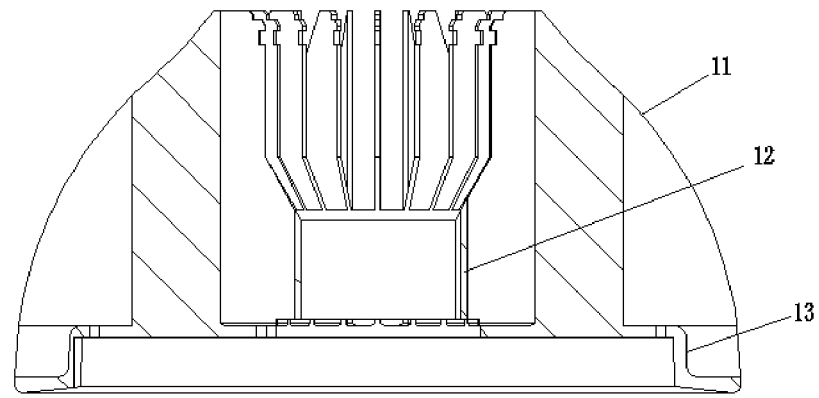
FIG. 19A is a cross-sectional view of the heat sink, according to another embodiment of the present invention.
Figure 19B:
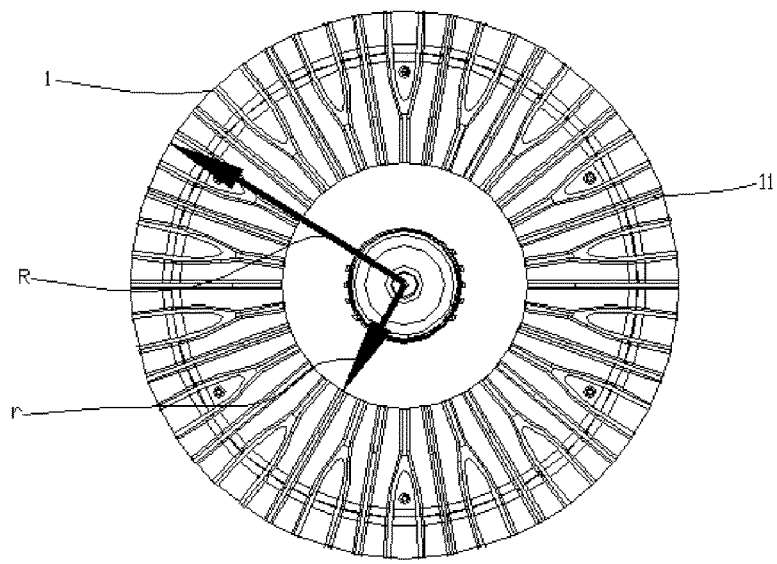
FIG. 19B is a schematic view of an LED lamp using the heat sink of FIG. 19A.

As shown in FIGS. 1 and 2, in this embodiment, the LED lamp includes passive heat dissipating elements which adopt natural convection and radiation as a heat dissipating manner without any active heat dissipating elements such as a fan. The passive heat dissipating element in this embodiment includes a heat sink 1 composed of fins 11 and a base 13. The fins 11 radially extend from and connect to the base 13. When using the LED lamp, at least part of heat from the LED chips 311 is conducted to the heat sink 1 by thermal conduction. At least part of heat occurring from the heat sink 1 is transferred to external air by thermal convection and radiation. A diameter of a radial outline of the heat sink 1, in a hanging status as shown in the figures, tapers off upward or is substantially in a taper shape for a better match with a lampshade. When the heat sink 1 in this embodiment is dissipating heat, at least part of heat is thermally radiated to air therearound to perform heat dissipation. An important factor of thermal radiation is emissivity. To improve emissivity of the heat sink 1, surfaces of the heat sink in this embodiment are specially treated. For example, surfaces of the heat sink 1 are provided with radiation heat-dissipating paint or electrophoretic coating to increase efficiency of thermal radiation and to rapidly dissipate heat of the heat sink 1. Another solution is forming a nanostructured porous alumina layer on the surfaces of the fins 11 by anodization in an electrolyte to form a layer of nanostructured porous alumina. As a result, ability of heat dissipation of the fins 11 can be enhanced without adding the number of the fins 11. Alternatively, the surfaces of the fins 11 may be coated with an anti-thermal-radiation layer to reduce thermal radiation between the fins 11. This can make more heat radiate to air. The anti-thermal-radiation layer may adopt paint or oxide coating, in which the paint may be normal paint or radiation heat dissipation paint. To further enhance heat dissipating effect of the heat sink 1. Preferably, it further contains aluminum such as a small or micro amount of aluminum. Adopting both zinc and magnesium with the above percentages can form $MgZn_2$ with a reinforcement effect. This makes a heat treatment effect of the heat sink 1 far better than a one zinc binary alloy. Tensile strength can be significantly increased. Both resistance to stress corrosion and flaking corrosion resistance also increases. Performance of thermal conduction also increases. In sum, performance of heat dissipation of the heat sink 1 is better. In addition, the heat sink 1 may be made of a material with low thermal resistance/high thermal conductivity, such as an aluminum alloy. In some embodiments, the heat sink 1 can be made of an anodized 6061 T6 aluminum alloy with thermal conductivity k=167 W/m·k. and thermal emissivity e=0.7. In other embodiments, other materials are available, such as a 6063 T6 or 1050 aluminum alloy with thermal conductivity k=225 W/m·k. and thermal emissivity e=0.9. In other embodiments, other alloys are still available, such as AL 1100, etc. In some embodiments, a die casting alloy with thermal conductivity is available. In other embodiments, the heat sink 1 may include other metals such as copper. FIG. 19A is a cross-sectional view of the heat sink 1 of an embodiment. As shown, in some embodiments, the heat sink 1 is added with a heat dissipating pillar 12. In detail, the heat sink 1 includes a heat dissipating pillar 12, fins 11 and a base 13. The heat dissipating pillar 12 connects to the base 13. The fins 11 are radially disposed around the heat dissipating pillar 12. A root portion of the fins 11 connects to the base 13 on a circle around the heat dissipating pillar 12. The heat dissipating pillar 12 supports the fins 11 to prevent the fins 11 from being skewed in machining. When using the LED lamp, the heat dissipating pillar 12 or the base 13 transfers heat from the LED chips 311 to the fins 11. The heat dissipating pillar 12 is a hollow body with two opening ends, for example, the heat dissipating pillar 12 may be hollow cylinder. The heat dissipating pillar 12 may be made of a material which is the same as the heat sink 1. This material possesses great thermal conductivity, such as an alloy, to implement light weight and low cost. In other embodiments, the heat dissipating pillar 12 may be made of copper to enhance thermal conductivity of the heat sink 1 and implement rapid heat transfer. In other embodiments, an inner wall of the heat dissipating pillar 12 may be provided with a heat conduction layer with a thickness of 0.1 mm~0.5 mm to further improve an effect of heat dissipation. Specific surface area of the fins 11 is 4~10 times of specific surface area of the heat dissipating pillar 12, preferably, 6~8 times. FIG. 19B is a top view of an LED lamp using the heat sink of FIG. 19A. As shown, when the LED lamp is a high-power lighting device, an inner diameter r of the bottom of the heat dissipating pillar 12 may be 10~15 mm. That is, a distance from the central axis XX of the heat dissipating pillar 12 to an inner surface of the heat dissipating pillar 12 may be 10~15 mm. Because the fins 11 radially extend from the heat dissipating pillar 12, a diameter R from the axis to an outer edge of the fins 11 may be greater than or equal to 15 mm and less than 20 mm. That is, a distance from the central axis of the heat sink 1 to an outer edge of the fins 11 may be greater than or equal to 15 mm and less than 20 mm. From the bottom to the top of the heat sink 1, an inner diameter defined by the fins 11 may be identical or different. In one example, length (R-r) extending from each fin 11 to the central axis XX of the heat sink 1 may be constant along a height direction of the heat sink 1 or may vary along a height direction of the heat sink 1. Length of each fin 11 extending from an inner surface of the heat sink 1 may be identical or different. That is, length of the fins 11 may be identical or different in length. Each fin 11 may extend from the inner surface of the heat sink 1 in a direction parallel to the central axis of the heat sink 1 or spirally extend from the inner surface of the heat sink 1.

As shown in FIGS. 2, 4 and 5, the base 13 of the heat sink 1 has a lower end 133 located under the base 13, i.e. both the lower end 133 and the light board 3 are located on the same side. In this embodiment, the lower end 133 protrudes from the light board 3 in an axis of the LED lamp. In a using (hanging) status of the light board 3 being downward, the lower end 133 is lower than the light board 3 in position. As a result, the position of the lower end 133 can protect the LED board 3. When collision occurs, the lower end 133 will collide first to prevent the light board 3 from colliding. As shown in FIGS. 2 and 4, in another aspect, the base 13 has a recess 132 in which the light board 3 is placed. The recess 132 is of a cylindrical shape or a substantially cylindrical shape, or a cylindrical platform structure. When the recess 132 is of a cylindrical shape, a diameter of the cylinder is less than that of the base 13. The recess 132 in the base 13 is advantageous to reducing a glare effect of the LED lamp and improve direct vision and comfort of users (inner walls of the recess 132 screen at least part of lateral light from the LED chips 311 to decrease glare). In some embodiments, the base 13 may have no recess. In some embodiments, to make both the light board 3 and the heat sink 1 have maximum contact area to guarantee a heat dissipation effect, a surface of the base 13 is a flat plane.

Figure 20:
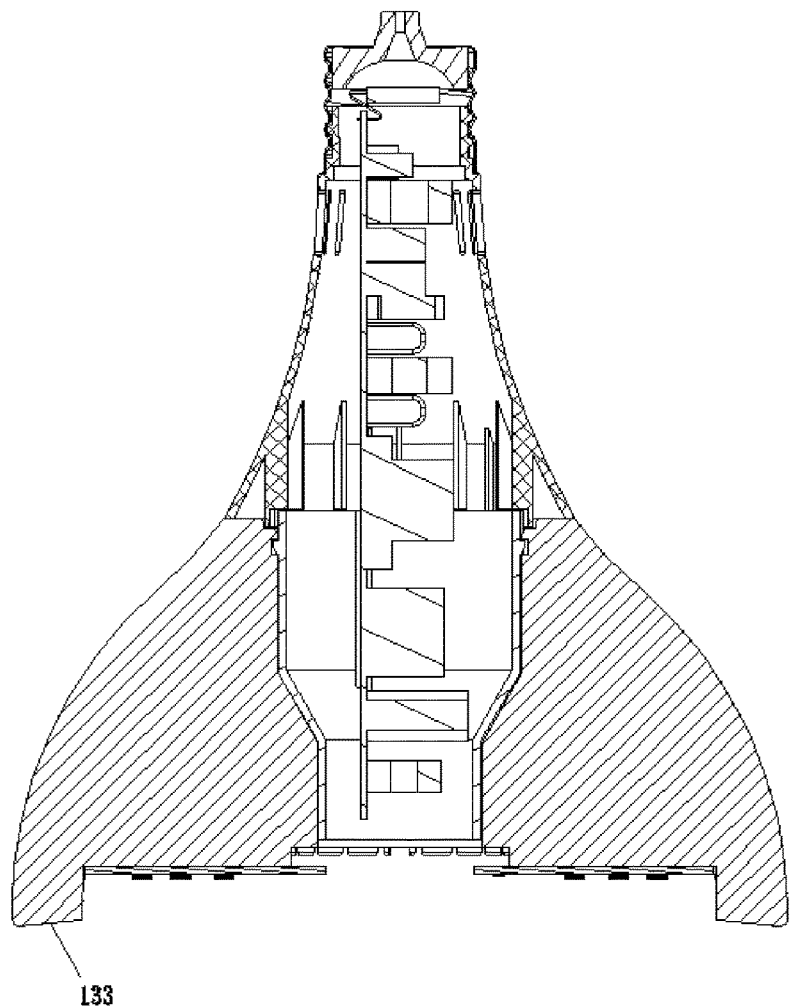
FIG. 20 is a cross-sectional view of an LED lamp without a lamp cover, according to another embodiment of the present invention.

FIG. 20 is a cross-sectional view of an LED lamp of an embodiment without the lamp cover 4. As shown, in some embodiments, the lower end 133 is configured to be slanted (relative to the horizon when the LED lamp is being hung). When the slant is flat and straight in a radial direction, an angle between the slant and the horizon is 3~4 degrees. In other embodiments, the angle is greater than 0 degrees but less than 6 degrees. In some embodiments, when the slant is arced in a radial direction, an angle between a tangent plane of the arced surface and the horizon is 3~4 degrees. In other embodiments, the angle is greater than 0 degrees but less than 6 degrees. When the lower end 133 is inclined to a specific angle (e.g. an angle between the lower end 133 and the outer reflecting surface 4302 is 120~180 degrees), it could serve as an extension of the outer reflecting surface 4302 to perform reflection.

Figure 21:
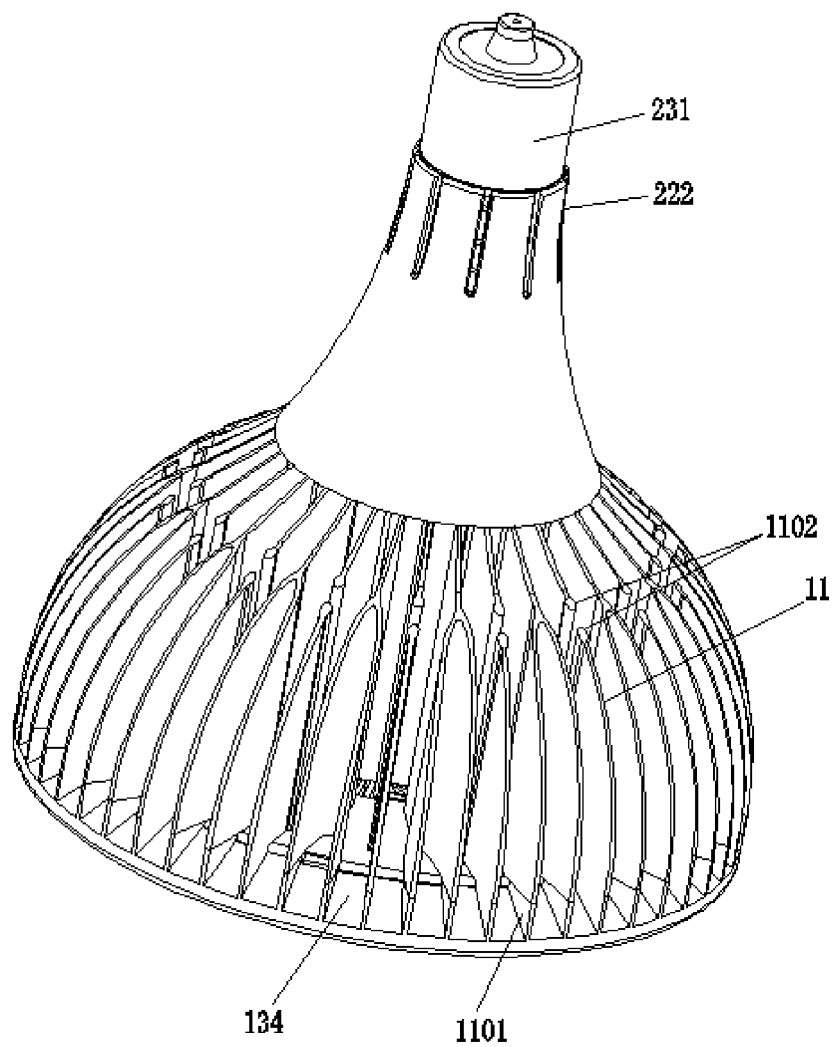
FIG. 21 is a perspective view of an LED lamp, according to another embodiment of the present invention.

FIG. 21 is a perspective view of an LED lamp of an embodiment of the present invention. As shown in FIGS. 2 and 21, another side of the base 13 of the heat sink 1, which is opposite to the lower end 133, has a back side 134. An end of each fin 11 extends to connect with the back side 134. Thus, At least part of each fin 11 projects from the LED light board 3 in an axis. In one example, in an axial direction of the LED lamp, each of the fins 11 is formed with an extension portion 1101 between the back side 134 of the base 13 and the light board 3. The extension portions 1101 can increase area of heat dissipation of the fins 11 and improve an effect of heat dissipation. In addition, the extension portion 1101 does not increase overall height of the LED lamp so as to be advantageous to controlling overall height of the LED lamp.

Figure 22:
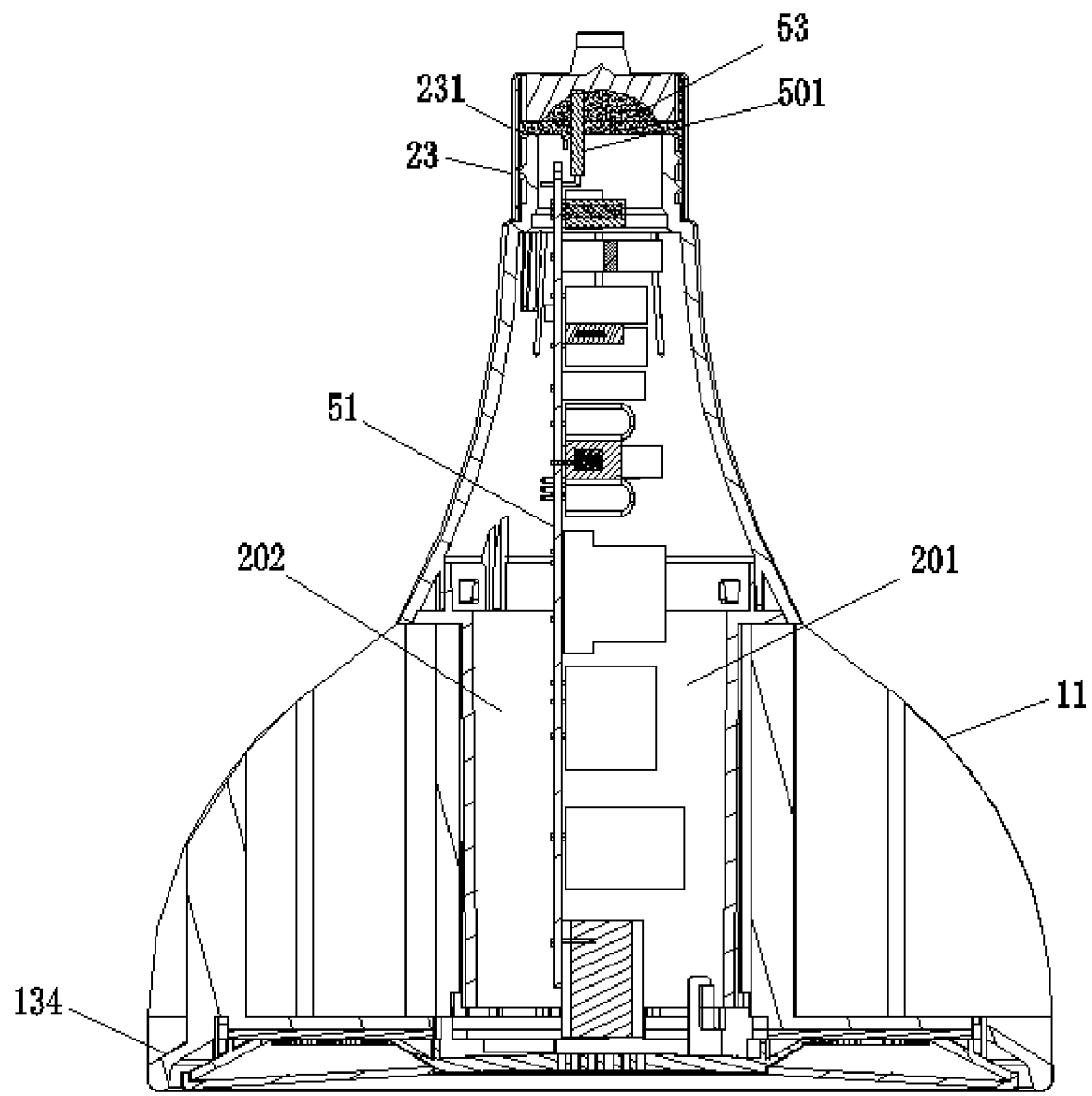
FIG. 22 is a cross-sectional view of the LED lamp of FIG. 21.

FIG. 22 is a cross-sectional view of the LED lamp of this embodiment. As shown, in this embodiment, the back side 134 of the base 13 is slanted. For example, when the LED lamp is being hung, in an inward radial direction, the back side 134 is upwardly slanted. In another aspect, in a radial direction of the LED lamp toward an axis of the LED lamp, an axial distance from the back side 134 to the light board 3 is progressively increased. Such an arrangement is advantageous to convection air is introduced along the back side 134 to bring out heat of the back side 134 and prevents the back side 134 from obstructing air flowing into.

As shown in FIGS. 2 and 5, in a using status, the light board 3 is downwardly arranged, a position of the lower end 133 is lower than an end side 44 of the lamp cover 4 and the light output surface 43. As a result, when packing, transporting or using the LED lamp, if collision occurs, then the lower end 133 will collide to prevent the lamp cover from colliding to damage the end side 44 or the light output surface 43.

As shown in FIGS. 2 and 5, a receiving space (indent 132) is encompassed by the lower ends 133 for receiving the lamp cover 4. Height of the lamp cover 4 received in the receiving space does not project from the lower end 133. Height of the LED lamp mainly includes height of the lamp shell 2, height of the heat sink 1 and height of the lamp cover 4. In this embodiment, the lamp cover 4 does not project from the lower end 133, this can control overall height of the lamp and the lamp cover 4 does not increase overall height of the lamp. In another aspect, the heat sink 1 additionally increases heat dissipating portion (downward protruding part of the light board 3 corresponding to the lower end 133). In other embodiments, a part of the lamp cover 4 may project from the lower end 133.

As shown in FIGS. 2, 4 and 5, a gap is kept between the end side 44 and the light board 3 to form a room 8. The room 8 communicates with both the first air inlet 2201 of the first heat dissipating channel 7a and the second air inlet 1301 of the second heat dissipating channel 7b. Air flows into the room 8 through the vent 41 of the end side 44 and then flows into both the first heat dissipating channel 7a and the second heat dissipating channel 7b. The room 8 allows air therein to mix and the mixed air is distributed according to negative pressure (resulting from temperature difference) of both the first and second heat dissipating channels 7a, 7b so as to make distribution of air more reasonable.

In this embodiment, when a passive heat dissipation manner (fanless) is adopted, the ratio of power (W) of the LED lamp to heat dissipating surface area (square cm) of the heat sink 1 is 1:20~30. That is, each watt needs heat dissipating surface area of 20~30 square cm for heat dissipation. Preferably, the ratio of power of the LED lamp to heat dissipating surface area of the heat sink 1 is 1:22~26. More preferably, the ratio of power of the LED lamp to heat dissipating surface area of the heat sink 1 is 1:25. The first heat dissipating channel 7a is formed in the lamp shell 2, the first heat dissipating channel 7a has the first air inlet 2201 at an end of the lamp shell 2, and another end of the lamp shell 2 has the venting hole 222. Air flows into the first air inlet 2201 and flows out from the venting hole 222 to bring out heat in the first heat dissipating channel 7a. The second heat dissipating channel 7b is formed in the fins 11 and the base 13 and the second heat dissipating channel 7b has the second air inlet 1301. Air flows into the second air inlet 1301, passes the second heat dissipating channel 7b, and finally flows out from the spaces between the fins 11 to bring out heat radiated from the fins 11 to air therearound and enhance heat dissipation of the fins 11. By both the first and second heat dissipating channels 7a, 7b, efficiency of natural convection can be increased. This reduces required area of heat dissipation of the heat sink 1 so as to make the ratio of power of the LED lamp to heat dissipating area of the heat sink 1 be between 20 and 30. In this embodiment, overall weight of the LED lamp is less than 1.7 Kg. When the LED lamp is provided with power of about 200 W (below 300 W, preferably, below 250 W), the LED chips 311 are lit up and emit luminous flux of at least 25000 lumens.

As shown in FIG. 1, weight of the heat sink 1 in this embodiment accounts for above 50% of weight of the LED lamp. In some embodiments, weight of the heat sink 1 accounts for 55~65% of weight of the LED lamp. Under this condition, volume of the heat sink 1 accounts for above 20% of volume of the overall LED lamp. Under a condition of the same thermal conductivity of the heat sink 1 (i.e. overall heat sink 1 uses a single material or two different materials with almost identical thermal conductivity), the larger the volume occupied by the heat sink 1 is, the larger the heat dissipating area which can be provided by the heat sink 1 is. As a result, when volumes of the heat sink 1 account for above 20% of volume of the overall LED lamp, the heat sink 1 may have more usable space to increase its heat dissipating area. Considering the arrangement space of the power source 5, the lamp cover 4 and the lamp shell 2, preferably, volume of the heat sink 1 accounts for 20%~60% of volume of the overall LED lamp. More preferably, volume of the heat sink 1 accounts for above 25~50% of volume of the overall LED lamp. Accordingly, although the overall size of the LED lamp is limited and the space for receiving the power source 5, the lamp cover 4 and the lamp shell 2 must be kept, volume of the heat sink 1 can still be maximized. This is advantageous to design of overall heat dissipation of the LED lamp.

Figure 23:
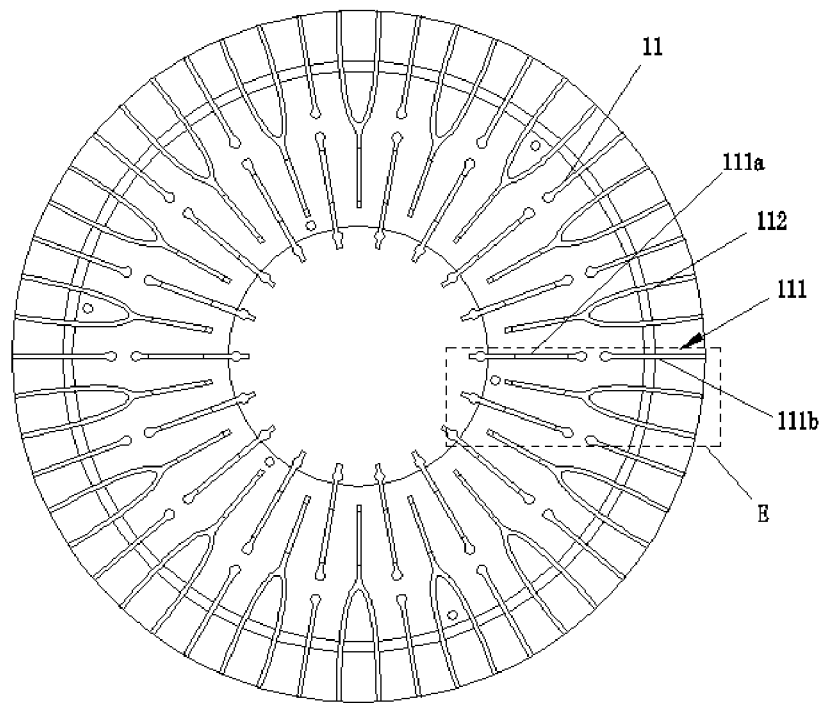
FIG. 23 is a top view of the heat sink of the LED lamp of FIG. 21.

FIG. 23 is top view of the heat sink 1 of the LED lamp of an embodiment. As shown, the heat sink 1 suffers the above volume limit, so at least part of the fins 11 are extended outward in a radial direction of the LED lamp with at least two sheets at an interval. By such an arrangement, the fins 11 in a fixed space can have larger area of heat dissipation.

In addition, the extended sheets form support to the fins 11 to make the fins firmly supported on the base 13 to prevent the fins 11 from deflecting.

In detail, as shown in FIG. 23, the fins include first fins 111 and second fins 112. The bottoms of both the first fins 111 and the second fins 112 in an axis of the LED lamp connect to the base 13. The first fins 111 interlace with the second fins 112 at regular intervals. Being projected from the axial direction of the LED lamp, each of the second fins 112 is to be seen as a Y-shape. Such Y-shaped second fins 112 can have more heat dissipating area under a condition of the heat sink 1 occupying the same volume. In this embodiment, both the first fins 111 and the second fins are evenly distributed on a circumference, respectively. Every adjacent two of the second fins 112 are symmetrical about one of the first fins 111. In this embodiment, an interval between one of the first fins 111 and adjacent one of the second fins 112 is 8~12 mm. In general, to make air flow in the heat sink 1 smooth and to make the heat sink perform a maximum effect of heat dissipation, intervals between the fins 11 should be as uniform as possible.

Figure 27:
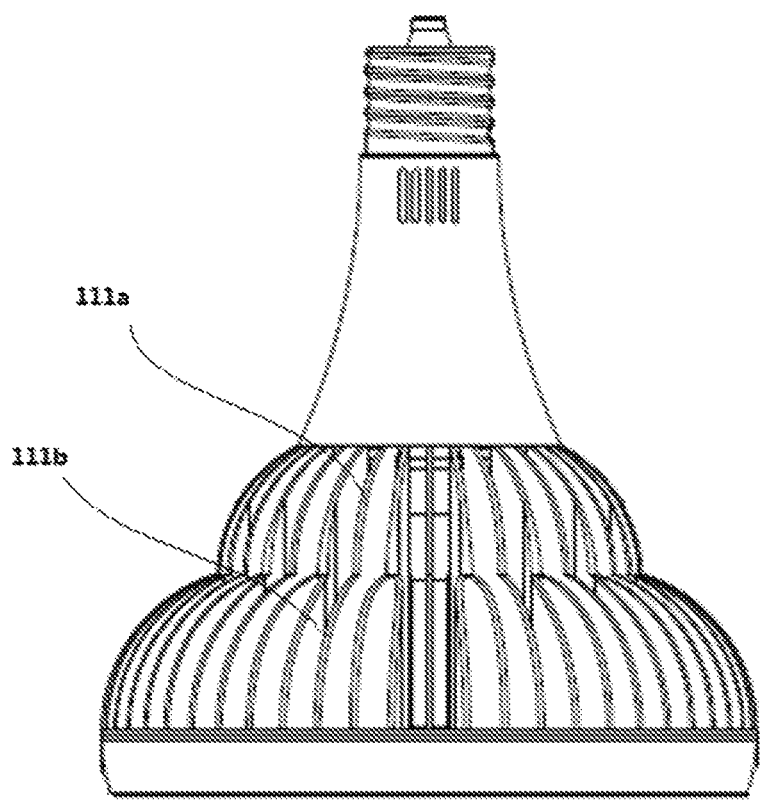
FIG. 27 is a main view of an LED lamp of another embodiment.

FIG. 27 is a main view of an LED lamp of another embodiment. As shown, the fins 11 are divided into two portions in a radial direction of the LED lamp. The first portion 111a is less than the second portion 111b in curvature (where the curvature means curvature on an outline of the LED lamp). In other embodiment, the first portion 111a is greater than or equal to the second portion 111b in curvature.

Figure 28:
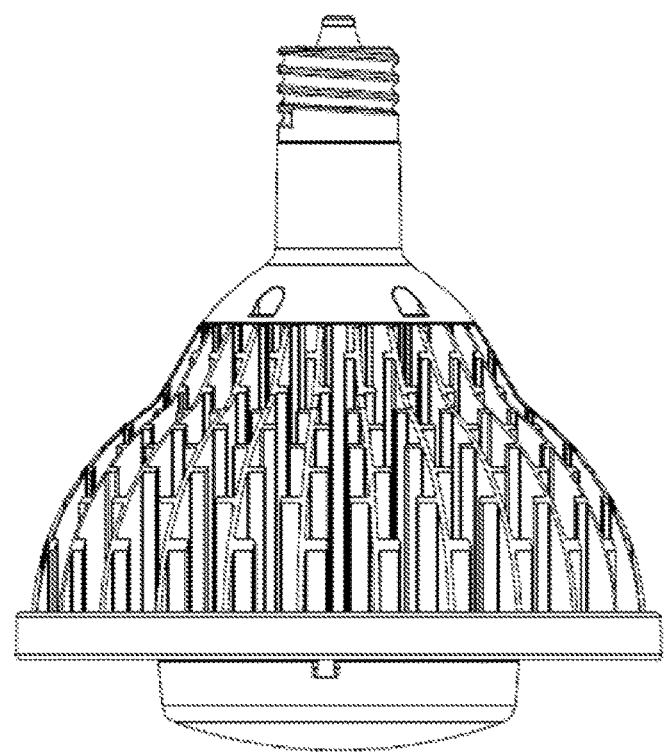
FIG. 28 is a main view of an LED lamp of another embodiment.

FIG. 28 is a main view of an LED lamp of another embodiment. As shown, two sides of each fin 11 are provided with heat dissipating bars 16. Each of the heat dissipating bar 16 on a side is located between adjacent two of the heat dissipating bars on the other side. For example, the heat dissipating bars 16 on two opposite sides do not superpose each other in a projective direction. In this embodiment, a distance between every two of the heat dissipating bars on a side is the same as a distance between every two of the heat dissipating bars on the other side. Such heat dissipating bars 16 can increase overall surface area of the fins 11 to make the fins 11 have more heat dissipating area for heat dissipation for improving performance of heat dissipation of the heat sink 1. In this embodiment, to increase surface area of the fins 11, surfaces of the fins 11 may be configured to be of a waved shape.

As shown in FIGS. 11 and 23, at least one of the fins 11 is divided into two portions in a radial direction of the LED lamp. Thus, a gap between the two portions forms a passage to allow air to pass. In addition, the projecting area of the gap directly exactly corresponds to an area that the LED chips 311 are positioned on the LED board 3 to enhance convection and improve an effect of heat dissipation to the LED chips 311. In an aspect of limited overall weight of the LED lamp, part of the fins 11 divided with a gap reduces the amount of the fins 11, decreases overall weight of the heat sink 1, and provides a surplus space to accommodate other elements. In this embodiment, as shown in FIG. 27, the fins 11 may have no above gap. That is, each of the fins 11 is a single piece in a radial direction.

Figure 24:
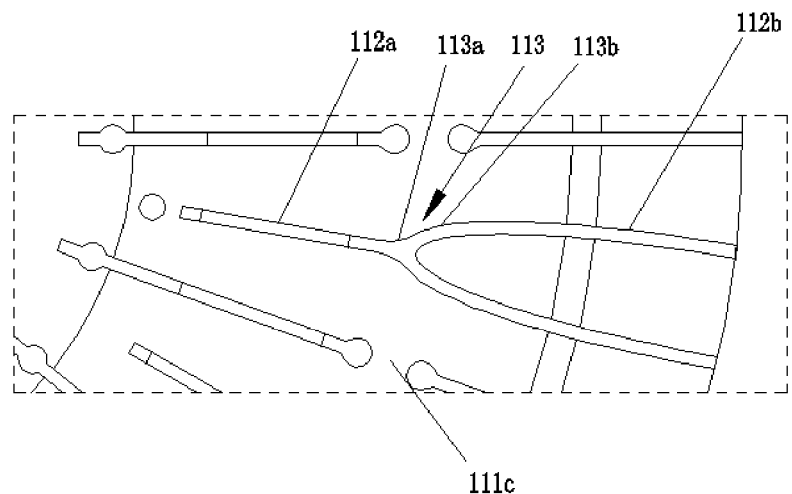
FIG. 24 is an enlarged view of portion E in FIG. 23.
Figure 25:
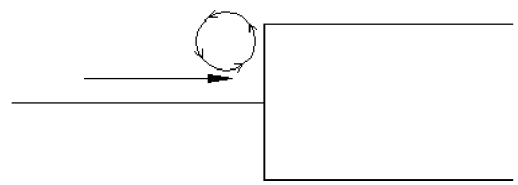
FIG. 25 is a schematic view showing a vortex formed by air near the second fins according to another embodiment of the present invention.

FIG. 24 is an enlarged view of portion E in FIG. 23. As shown in FIGS. 23 and 24, the fins 11 include first fins 111 and second fins 112. Each of the first fins 11 is divided into two portions in a radial direction of the LED lamp, i.e. a first portion 111a and a second portion 111b. The two portions are divided with a gap portion 111c. The first portion 111a is located inside the second portion 111b in a radial direction. Each of the second fins 112 has a third portion 112a and a fourth portion 112b extending therefrom. The fourth portions 112b are located radially outside the third portions 112a to increase space utilization and make the fins have more heat dissipating are for heat dissipation. As shown in FIG. 24, the third portion 112a is connected to the fourth portion 112b through a transition portion 113. The transition portion 113 has a buffer section 113a and a guide section 113b. At least one or both of the buffer section 113a and the guide section 113b are arced in shape. In other embodiment, both the buffer section 113a and the guide section 113b are formed into an S-shape or an inverted S-shape. The buffer section 113a is configured to prevent air radially outward flowing along the second fins 112 from being obstructed to cause vortexes. Instead, the guide section 113b is configured to be able to guide convection air to radially outward flow along the second fins 112 without interference (as shown id FIG. 25).

As shown in FIG. 24, one of the second fins 112 includes a third portion 112a and two fourth portions 112b. The two fourth portions 112b are symmetrical about the third portion 112a. In other embodiments, one of the second fins 112 may include a third portion 112a and multiple fourth portions 112b such as three or four fourth portions 112b (not shown). The multiple fourth portions 112b of the second fin 112 are located between two first fins 111.

As shown in FIG. 24, a direction of any tangent of the guide section 113b is separate from the gap portion 111c to prevent convection air from flowing into the gap portion 111c through the guide portion 113b, such that the poor efficiency of heat dissipation caused by longer convection paths is able to be avoiding as well. Preferably, a direction of any tangent of the guide section 113b is located radially outside the gap portion 111c. In other embodiments, a direction of any tangent of the guide section 113b is located radially inside the gap portion 111c.

Figure 26:
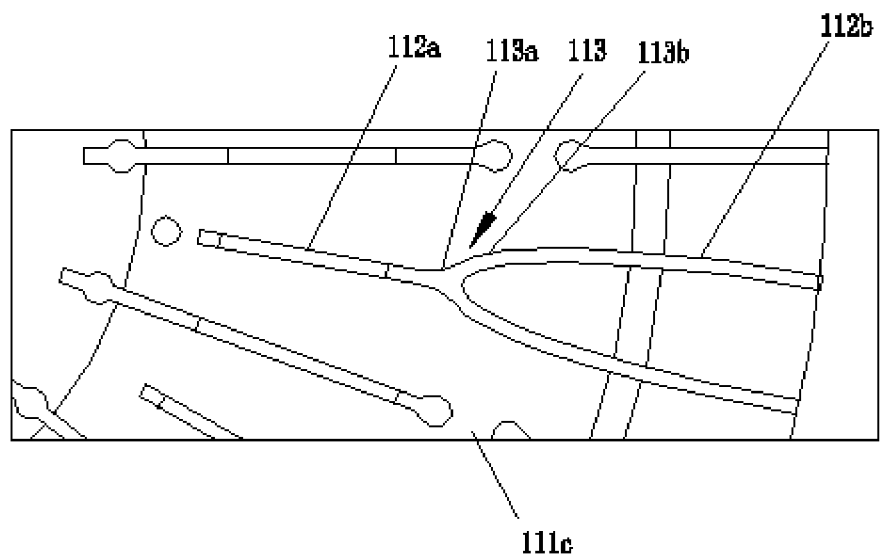
FIG. 26 is a partially schematic view of the heat sink of another embodiment.

As shown in FIG. 26, in another embodiment, a direction of any tangent of the guide section 113b falls in the gap portion 111c to make convection more sufficient but convection paths will increase.

As shown in FIG. 21, at least partially of fin 11 has a protrusion 1102 projecting from a surface of the fin 11. The protrusions 1102 extend along an axis of the LED lamp and are in contact with the base 13. A surface of the protrusion 1102 may selectively adopt a cylindrical shape or a regular or an irregular polygonal cylinder. The protrusions 1102 increase surface area of the fins 11 to enhance efficiency of heat dissipation. In addition, the protrusions 1102 also form a support effect to the fins 11 to prevent the fins 11 from being inflected in manufacture. In some embodiments, a single fin 11 is divided into two portions in a radial direction of the LED lamp. Each portion is provided with at least one protrusion 1102 to support the two portions. In this embodiment, the protrusion 1102 is located at an end portion of each fin 11 in a radial direction of the LED lamp, for example, at end portions of the first portions 111a, 111 b (the ends near the gap portion 111c).

In some embodiments, when each fin 11 is a single piece without the gap portion, the protrusion 1102 may also be disposed on a surface of each fin 11 (not shown) to increase surface area of heat dissipation of the fins 11 and have a support effect to the fins 11 to prevent the fins 11 from being inflected in manufacture.

Figure 29:
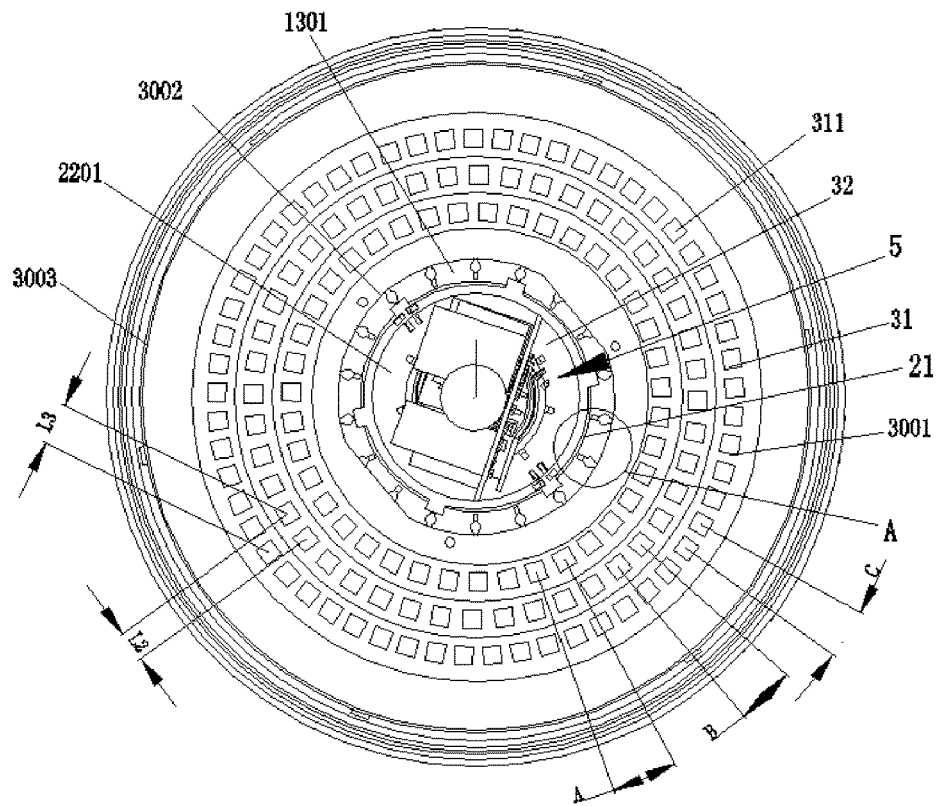
FIG. 29 is a bottom view of the LED lamp of FIG. 1 without the lamp cover.
Figure 30:
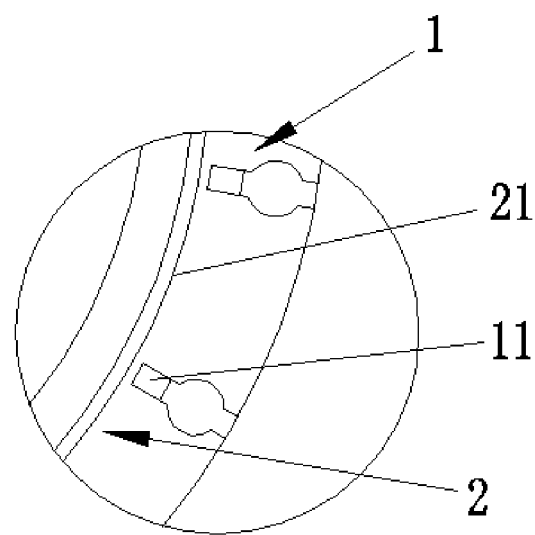
FIG. 30 is an enlarged view of portion A in FIG. 29.

FIG. 29 is a bottom view of the LED lamp of FIG. 1 without the lamp cover 4. FIG. 30 is an enlarged view of portion A in FIG. 29. As shown in FIGS. 29 and 30, the heat sink 1 is disposed outwardly of the sleeve 21, and the power source 5 is disposed in the inner space of the sleeve 21. A distance is kept between distal ends of the fins 11 and the sleeve 21. Accordingly, the sleeve 21 which has been heated to be thermally expanded will not be pressed by the fins 11 to be damaged. Also, heat from the fins 11 will not be directly conducted to the sleeve 21 to adversely affect electronic components of the power source 5 in the sleeve 21. Finally, air existing in the distance between the fins 11 and the sleeve 21 of the lamp shell 2 (as shown in FIG. 3) possesses an effect of thermal isolation so as to further prevent heat of the heat sink 1 from affecting the power source 5 in the sleeve 21. In other embodiments, to make the fins 11 have radial support to the sleeve 21, distal ends of the fins 11 may be in contact with an outer surface of the sleeve 21 and another part of the fins 11 are not in contact with the sleeve 21. Such a design may be applied in the LED lamp shown in FIG. 29. As shown in FIG. 29, the light board 3 includes a third aperture 32 for exposing both the first air inlet 2201 of the first heat dissipating channel 7a and the second air inlet 1301 of the second heat dissipating channel 7b. In some embodiments, to rapidly dissipate heat from the power source 5, the ratio of cross-sectional area of the first air inlet 2201 to cross-sectional area of the second air inlet 1301 is greater than 1 but less than or equal to 2. In some embodiments, to rapidly dissipate heat from the power source 5, the ratio of cross-sectional area of the second air inlet 1301 to cross-sectional area of the first air inlet 2201 is greater than 1 but less than or equal to 1.5.

As shown in FIGS. 21 and 22, the innermost of the fins 11 in a radial direction of the LED lamp is located outside the venting hole 222 in a radial direction of the LED lamp. In one example, an interval is kept between the innermost of the fins 11 in a radial direction of the LED lamp and the venting hole 222 in a radial direction of the LED lamp. As a result, heat from the fins 11 flowing upward will not gather to the venting hole 222 to keep an interval with the venting hole 222. This avoids heat making air around the venting hole 222 heat up to affect convection temperature speed of the first heat dissipating channel 7a (the convection speed depends upon a temperature difference between two sides of the first heat dissipating channel 7a, when air temperature near the venting hole 222 rises, the convection speed will correspondingly slowdown.).

Figure 31:
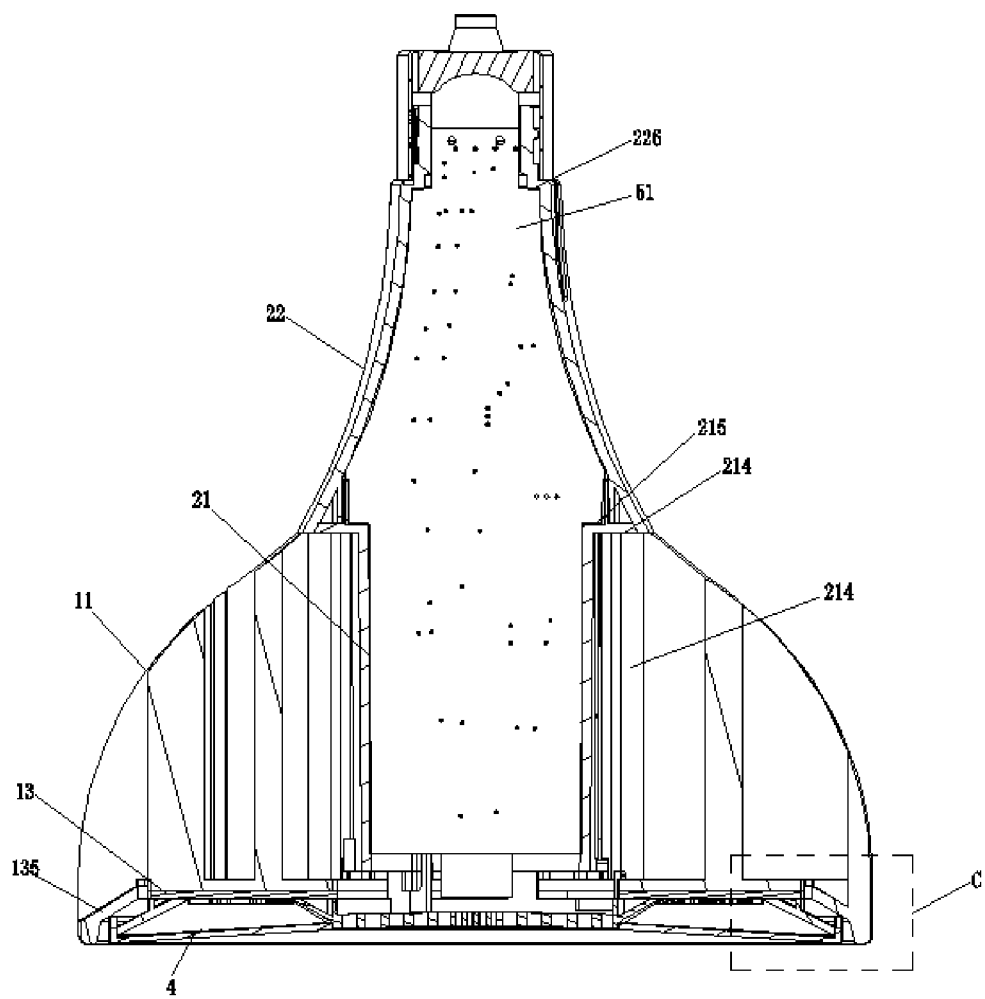
FIG. 31 is a cross-sectional view of an LED lamp, according to another embodiment of the present invention.
Figure 32:
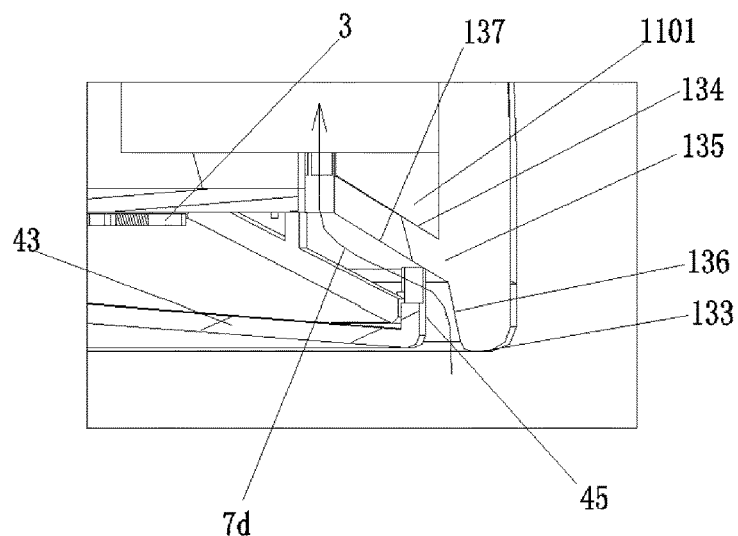
FIG. 32 is an enlarged view of the LED lamp of portion C in FIG. 31.

FIG. 31 is a cross-sectional view of an LED lamp of an embodiment. FIG. 32 is an enlarged view of the LED lamp of portion C in FIG. 31. As shown, the heat sink 1 includes the fins 11 and the base 13. The base 13 has a projecting portion 135 which is downwardly formed in an axial direction of the LED lamp. The projecting portion 135 protrudes from the light board 3 in an axial direction of the LED lamp. The lowermost position of the projecting portion 135 (lower end 133) is substantially flush with the light output surface 43 of the light cover 4 (in an axial direction of the LED lamp) or the lowermost position of the projecting portion 135 slightly protrudes from the light output surface 43. For example, the lowermost position of the projecting portion 135 protrudes from the light output surface 43 by about 1~10 mm to keep overall height of the heat sink 1 in the LED lamp unvarying or slightly increase volume for obtaining more heat dissipating area of both the fins 11 and the base 13.

The projecting portion 135 in this embodiment is configured to be annular and a concave structure is defined by both the projecting portion 135 and the base 13 for receiving and protecting both the light source and the light cover 4. Also, the concave structure can perform an effect of anti-flare (because the concave structure shades lateral light from the light source).

As shown in FIG. 32, the base 13 has a first inner surface 136 and the lamp cover 4 has a peripheral wall 45. When the lamp cover 4 has been correctly installed to the LED lamp, the first inner surface 136 corresponds to the peripheral wall 45 (the outer wall of the lamp cover 4). A gap is kept between the first inner surface 136 and the peripheral wall 45 to prevent the lamp cover 4 from thermally expanding and being pressed by the first inner surface 136 to be damaged. The gap between the first inner surface 136 and the peripheral wall 45 can reduce or avoid the abovementioned pressing. In other embodiments, a part of the peripheral wall 45 is in contact with the first inner surface 136 to radially support the lamp cover 4 by the first inner surface 136. Gaps are still kept between the other parts of the peripheral wall 45 and the first inner surface 136.

As shown in FIG. 32, the first inner surface 136 is configured to be a slant and an angle is formed between the first inner surface 136 and the light board 3. The angle may be an obtuse angle. Thus, when the lamp cover 4 is thermally expanded and its peripheral wall 45 presses the slant, the pressure exerted from the first inner surface 136 to an outer portion of the lamp cover 4 is divided into a downward component and a horizontal component to reduce horizontal pressure to the lamp cover 4 (horizontal pressure is a main cause of damage). In other embodiments, the peripheral wall 45 may abut against the first inner surface 136 (not shown) so as to support or limit the lamp cover 4. Also, because the first inner surface 136 is a slant, damage of the lamp cover 4 resulting from pressure of thermal expansion can be decreased. An end portion of the peripheral wall 45 may abut against the first inner surface 136 to decrease contact area between overall peripheral wall 45 and the base 13 and avoid excessive thermal conduction.

As shown in FIG. 32, the base further includes a second inner surface 137 and the lamp cover 4 has a peripheral wall 45. A gap is kept between the peripheral wall 45 and the first inner surface 136. An end portion of the peripheral wall 45 abuts against the second inner surface 137. An angle between the first inner surface 136 and the light board 3 is less than an angle between the second inner surface 137 and the light board 3. That is, the second inner surface 137 is flatter than the first inner surface 136. As a result, when the peripheral wall 45 abuts against the second inner surface 137 and the lamp cover 4 is thermally expanded, the horizontal pressure from the second inner surface 137 to the lamp cover 4 becomes less. In this embodiment, the angle between the second inner surface 137 and the light board 3 is between 120 degrees and 150 degrees. If the angle is too big, then radial support to the lamp cover 4 in a radial direction of the LED lamp will not be sufficient enough. While if the angle is too small, not only can the horizontal pressure exerted to the lamp cover 4 which has been thermally expanded not be reduced, but also limiting and supporting the lamp cover 4 in an axial direction of the LED lamp cannot be obtained. When the angle falls in the above range, a great balance can be accomplished. In other embodiments, both the second inner surface 137 and the first inner surface 136 may be curved. A distance difference between the second inner surface 137 and the axis of the LED lamp and between the first inner surface 136 and the axis of the LED lamp downward progressively increases. However, in general, the second inner surface 137 is flatter than the first inner surface 136.

Figure 33:
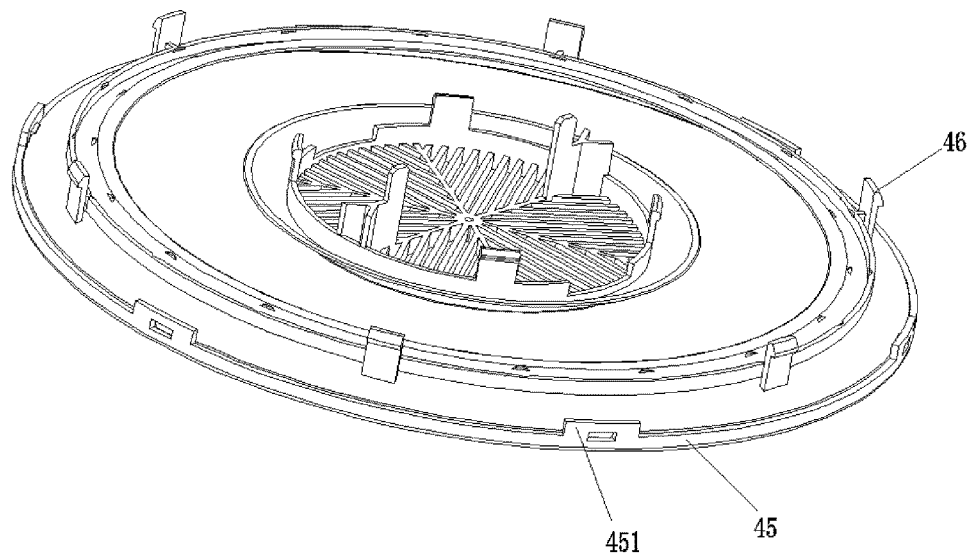
FIG. 33 is a perspective view of a lamp cover, according to another embodiment of the present invention.

As shown in FIG. 33, the end portion of the peripheral wall 45 is provided with protruding plates 451 upward extending from the peripheral wall 45 at regular intervals. The protruding plates 451 are the parts that the end portion of the peripheral wall 45 is in actual contact with the second inner surface 137. The protruding plates 451 can reduce contact area between the peripheral wall 45 and the base 13 to prevent heat of the heat sink 1 from being conducted to the lamp cover 4 to make the lamp cover 4 overheat.

As shown in FIGS. 31 and 32, a gap is formed between the peripheral wall 45 and the base 13 and the base 13 is formed with a hole. A side of the hole communicates with the gap and the other side corresponds to the fins 11. In one example, air may flow into the gap, passes the hole and reaches the fins 11 to enhance convection. The convection path as shown by the arrow in FIG. 32 may form a fourth heat dissipating channel 7d of the LED lamp in this embodiment. Because the protruding plates 451 are arranged on the peripheral wall 45 at regular intervals, air can pass through intervals between the protruding plates 451 (as shown in FIG. 33) to accomplish the abovementioned convection. In another embodiment, the fourth heat dissipating channel 7d may also be disposed at other positions as long as a region between a lower portion of the LED lamp and the fins 11 are communicated. For example, a through hole 315 is formed between adjacent two LED chip sets 31. At this time, the lamp cover 4 may be configured to be separate, i.e. include multiple parts to separately cover different LED chip sets 31. The through hole 315 is located between two parts of the lamp cover 4 to make the through hole 315 communicate with the lower portion of the LED lamp and communicate with the spaces between the fins 11.

The heat sink 1 in this embodiment is an integrated structure so as to advantageous to reducing thermal resistance between the fins 11 and the base 13. In other embodiments, in order to be convenient to be machined and formed, the fins 11 and the base 13 may also be configured to be detachable.

In this embodiment, different positions of the fins 11 have different temperature. For example, when the LED lamp is working, a portion near the LED chips 311 is around 80° C., but the temperature of the upper portion (the opposite portion to the portion near the LED chips 311) of the fins 11 would slightly decrease. With different distribution of temperature inside the fins 11, the heat dissipation efficiency of the fin 11 is defined as a percentage of the post-dissipation temperature to the average temperature of the fins 11. The heat dissipation efficiency of the fins 11 can be calculated by thermal conductivity and size. The heat dissipation efficiency of the fins 11 is relative with thermal conductivity, thickness, width and height of the fins 11.

LEDs generate heat while they are emitting. A key parameter in considering of thermal conduction of LEDs is thermal resistance. The smaller the thermal resistance is, the better the thermal conduction is. Primarily, factors of thermal resistance include length of conduction path, conduction area and thermal conductivity of a thermo-conductive material. It can be expressed by the following formula:

Thermal resistance=length of conduction path $L$/(conduction area $S$*thermal conductivity)

That is to say, the shorter the conduction path is and the larger the conduction area is, the lower the thermal conductivity is.

As shown in FIG. 29, in this embodiment, the light board 3 includes at least one LED chip set 31 having LED chips 311.

As shown in FIG. 29, in this embodiment, the light board 3 is divided into three areas comprising an inner ring, a middle ring and an outer ring. All the LED chip sets 31 are located in the three areas. In one example, the inner ring, the middle ring and the outer ring are separately mounted by different amount of LED chip sets 31. In another aspect, the light board 3 includes three LED chip set 31. The three LED chip sets 31 are respectively located in the inner ring, the middle ring and the outer ring. Each of the LED chip sets 31 separately in the inner ring, the middle ring and the outer ring has at least one LED chip 311.

Four hypothetical circle lines are defined on the light board 3 as shown in FIG. 29. The outer ring is defined by the area between the outermost two circle lines of the four, the inner ring is defined by the area between the innermost two circle lines of the four, and the middle ring is located between the two areas mentioned above. In another embodiment, the light board 3 is separated into two rings (areas), and the chip sets 31 are divided to be mounted on the two rings.

As shown in FIG. 29, several LED chips 311 in a circle or approximately in a circle compose an LED chip set. There are several LED chip sets 31 on the light board 3. In a single LED chip set 31, a center distance between two adjacent LED chips 311 is L2. A center distance between any LED chip 311 of any LED chip set 31 and the nearest LED chip 311 of an adjacent LED chip set 31 is L3. The ratio of L2 to L3 is 1:0.8~2, preferably, L2:L3 is 1:1~1.5. This makes distribution of the LED chips 311 so even to accomplish an object of even light output.

Figure 34:
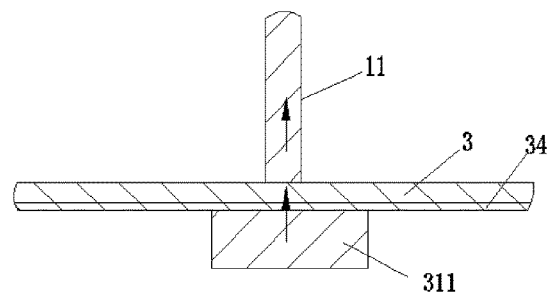
FIG. 34 is a schematic view of the combination of the fins and the LED chips of an embodiment.
Figure 35:
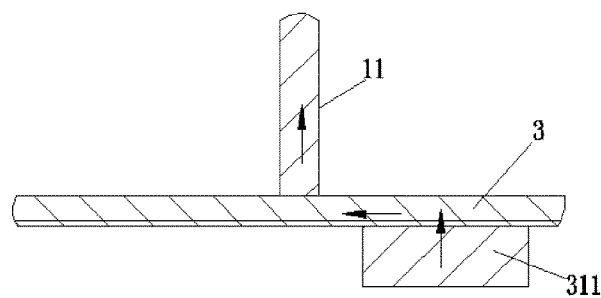
FIG. 35 is a schematic view of the combination of the fins and the LED chips, according to some embodiments of the present invention.

FIG. 34 is a schematic view of the combination of the fins 11 and the LED chips 311 of one embodiment. As shown in FIGS. 29 and 34, in this embodiment, when at least one fin 11 is projected onto the plane on which the LED chip sets 31 are located along the axial direction of the LED lamp, a projection of the fin 11 at least touches at least one LED chip 311 of the LED chip set 31. In detail, when at least one fin 11 is projected onto a plane on which the LED chip set 31 is located along the axial direction of the LED lamp, a projection of the fin 11 at least touches at least one LED chip 311 of the LED chip set 31 in the inner ring, the middle ring or the outer ring. As shown in FIG. 34, the projection of the fin 11 touches an LED chip 311. As indicated by the arrow in the figure, it is a heat dissipating path of the LED chip 311 and the fin 11. As shown in FIG. 35, the projection of the fin 11 does not touch the LED chip 311 in the figure. As indicated by the arrow in the figure, it is a heat dissipating path of the LED chip 311 and the fin 11. It can be seen that the heat dissipating path of the latter is longer than the former's. As a result, by means of a projection of a fin at least touching at least one LED chip 311 of the LED chip set 31 in the inner ring, the middle ring or the outer ring, a heat dissipating path of the LED chip 311 can be shortened. This can reduce thermal resistance to be advantageous to thermal conduction. Preferably, a fin 11 is projected onto a plane on which the LED chip set 31 is located along the axial direction of the LED lamp, a projection of any fin 11 (the first fin 111 or the second fin 112) at least touches at least one LED chip 311 of the LED chip set 31.

In this embodiment, the LED chip sets 31 in outer rings corresponding to the fins 11 are greater than the LED chip sets 31 in inner rings in number. Here the term "corresponding to" means projection relationship in the axial direction of the LED lamp, for example, when the LED chip sets 31 in outer rings are projected onto the fins 11 in the axial direction of the LED lamp, the fins 11 to which the LED chips 31 in outer rings correspond are located on a relatively outer portion of the heat sink 1. Here the LED chip sets 31 in outer rings have more LED chips 311 in number, so they need more fins 11 (area) to implement heat dissipation.

As shown in FIGS. 1 and 29, the light board 3 has an inner border 3002 and an outer border 3003. Both the inner border 3002 and the outer border 3003 separately upward extend along the axial direction of the LED lamp to form a region. An area of part of the fins 11 inside the region is greater than an area of part of the fins 11 outside the region. As a result, the most of the fins 11 can correspond to the light board 3 (a shorter heat dissipating path) to enhance heat dissipating efficiency of the fins 11 and increase effective area of heat conduction of the fins 11 to the LED chips 311.

As shown in FIGS. 3, 5 and 29, a reflecting region 3001 is disposed in a region between the inner ring and an outer edge of the light board 3 to reflect the upward light to the light output surface 43. This can reduce loss of light in an opposite direction of light output in the axial direction of the LED lamp to increase overall intensity of light output.

Figure 36:
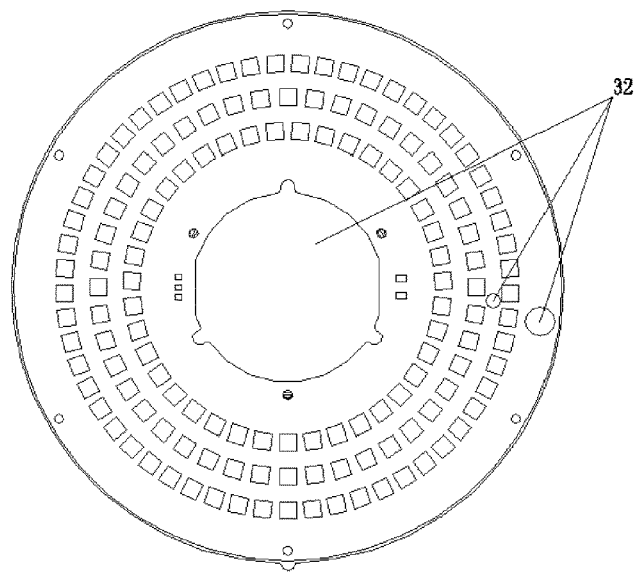
FIG. 36 is a schematic view of an embodiment of the light board.

As shown in FIGS. 4 and 29, the light board 3 is formed with a third aperture 32 separately communicating with the first heat dissipating channel 7a and the second heat dissipating channel 7b. For example, the third aperture 32 communicates with spaces between the fins 11 and the chamber of the lamp shell 2 to form air convection paths between the spaces between the fins 11 and between the chamber of the lamp shell 2 and the outside of the Led lamp. The third aperture 32 is located inside the inner ring of the LED lamp. Thus, it would not occupy the space of the reflecting region 3001 to affect reflective efficiency. In detail, the third aperture 32 is located at a central region of the light board 3 and both the first air inlet 2201 and the second air inlet 1301 make air intake through the same aperture (the third aperture 32). In one example, after convection air passes through the third aperture 32, and then enters the first air inlet 2201 and the second air inlet 1301. The third aperture 32 is located at a central region of the light board 3, so both the first air inlet 2201 and the second air inlet 1301 can commonly use the same air intake. Thus, this can prevent occupying an excessive region of the light board 3 and prevent the usable regional area of the light board 3 for disposing the LED chips 311 from decreasing due to multiple air intakes. On the other hand, the sleeve 21 corresponds to the third aperture 32, so convection air may have an effect of thermal isolation to prevent temperatures inside and outside the sleeve 21 from mutually affecting each other when air enters. In other embodiments, if both the first air inlet 2201 and the second air inlet 1301 are located at different positions, then the third aperture 32 may be multiple in numbers to correspond to both the first air inlet 2201 and the second air inlet 1301. In detail, as shown in FIG. 36, the third aperture 32 may be located at a middle portion or outer portion or between the LED chips 311 to correspond to both the first air inlet 2201 and the second air inlet 1301. stopped As shown in FIG. 29, in an embodiment, in the inner ring, both adjacent two of the LED chips 311 and the axis of the LED lamp form a center angle A; in the middle ring, both adjacent two of the LED chips 311 and the axis of the LED lamp form a center angle B. The center angle B is less than the center angle A in degree. In the outer ring, both adjacent two of the LED chips 311 and the axis of the LED lamp form a center angle C, and the center angle C is less than the center angle B in degree. For example, the LED chips 311 in the outer ring are more than those in the middle ring in number. Thus, a distance between adjacent two of the LED chips 311 in the outer ring is not much greater than a distance between adjacent two of the LED chips 311 in the middle ring, even, the two distances may be similar or identical. As a result, both distribution of the LED chips 311 and light output will be very even. In one example, the LED chip sets 31 are multiple in number and are annularly mounted on the light board 3. A center angle formed by adjacent two of the LED chips 311 in an inner portion and the axis of the LED lamp is greater than a center angle formed by adjacent two of the LED chips 311 in an outer portion and the axis of the LED lamp. That is, The LED chips 311 of outer LED chip sets 31 are greater than the LED chips 311 of inner LED chip sets 31 in number such that a distance between adjacent two of the LED chips 311 of outer LED chip sets 31 is less than a distance between adjacent two of the LED chips 311 of inner LED chip sets 31. As a result, both distribution of the LED chips 311 and light output will be very even.

As shown in FIG. 34, in one embodiment of the present invention, the light board 3 is provided with an insulative layer 34 with high reflectivity. The insulative layer 34 may adopt thermal grease. The insulative layer 34 is smeared on the light board 3 to an edge thereof. A distance between the LED chips 311 at the outermost position and an edge of the light board 3 is greater than 4 mm. Preferably, a distance between the LED chips 311 at the outermost position and an edge of the light board 3 is greater than 6.5 mm but less than 35 mm. In addition, a creepage distance between the outermost LED chips 311 and the heat sink 1 can be guaranteed to prevent arc occurring between the LED chips 311 and the heat sink. In addition, the insulative layer 34 may also have an effect of thermal isolation to prevent overheating and deformation of the lamp cover 4.

Figure 37:
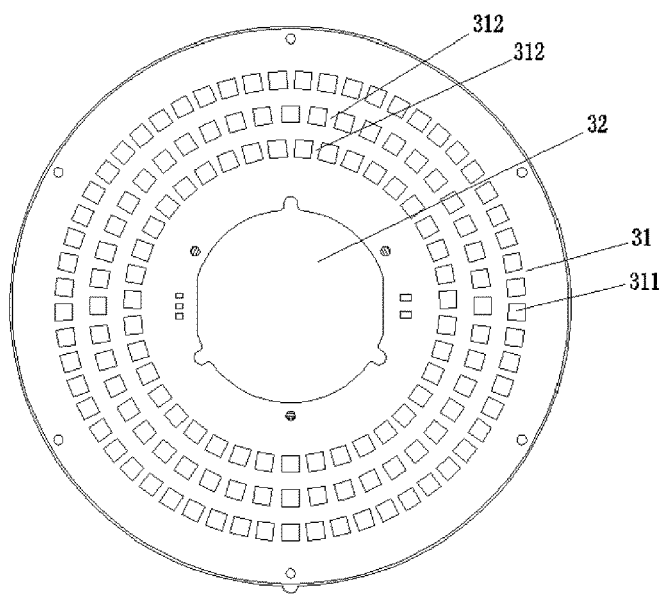
FIG. 37 is a schematic view of another embodiment of the light board.

FIG. 37 is a schematic view of the light board 3 in this embodiment. As shown in FIG. 37, in this embodiment, the LED chip sets 31 are at least two in number. The at least two LED chip sets 31 are annularly arranged on the light board 3 in order. Each LED chip set 31 includes at least one LED chip 311. Each LED chip 311 of one of the LED chip sets 31 on the light board 3 is radially interlacedly arranged with any one LED chip 311 of adjacent one of the LED chip sets 31 on the light board 3. That is, the LED chips 311 of different LED chip sets 31 are located in different directions in a radial direction of the LED lamp. In one example, if any line starting with the axis of the LED lamp and extending toward a radial direction of the LED lamp cuts two or more of the LED chips 311, then it will cut different positions of these two or more LED chips 311 and will not cut the same positions of these two or more LED chips 311. As a result, if there is convection on the light board 3 and air radially flows on the light board 3, the contact between air and the LED chips 311 will be more sufficient and a better effect of heat dissipation will be obtained because of the airflow paths. In addition, in the aspect of lighting effect, such distribution of the LED chips 311 is more advantageous to uniformity of light output.

In this embodiment, an open region 312 is formed between adjacent two of the same LED chip set 31 to allow air to flow between the LED chips 311 to bring out heat generated from the working LED chips 311. The open region 312 between any two adjacent LED chips 311 of one of adjacent two of the chip sets 31 on the light board 3 interlaces to and communicates with the open region 312 between any two adjacent LED chips 311 of another one of the chip sets 31 on the light board 3 in a radial direction of the LED board 3. As a result, if there is convection on the light board 3 and air radially flows on the light board 3, the contact between air and the LED chips 311 will be more sufficient and a better effect of heat dissipation will be obtained because of the airflow paths. If both the open region 312 between any two adjacent LED chips 311 of one of adjacent two of the chip sets 31 on the light board 3 and the open region 312 between any two adjacent LED chips 311 of another one of the chip sets 31 on the light board 3 of the LED board 3 are in the same radial direction, then air will flow along radial directions of the light board 3. The contact between air and the LED chips 311 will decrease to be disadvantageous to heat dissipation of the LED chips 311 because of the airflow paths.

For example, three LED chip sets 31 are annularly disposed along a radial direction of the light board 3 in order, any open regions 312 of the three LED chips 31 are not in the same direction in a radial direction. Thus, convection paths on the light board 3 can be optimized to increase efficiency of the heat dissipation.

In some applications, when LEDs are emitting, a light distribution region will be formed under the LED lamp. This means distribution of intensity of light source. The design of the LED lamp aims for concentrating the light distribution region to a specific zone to increase local intensity.

Figure 38A:
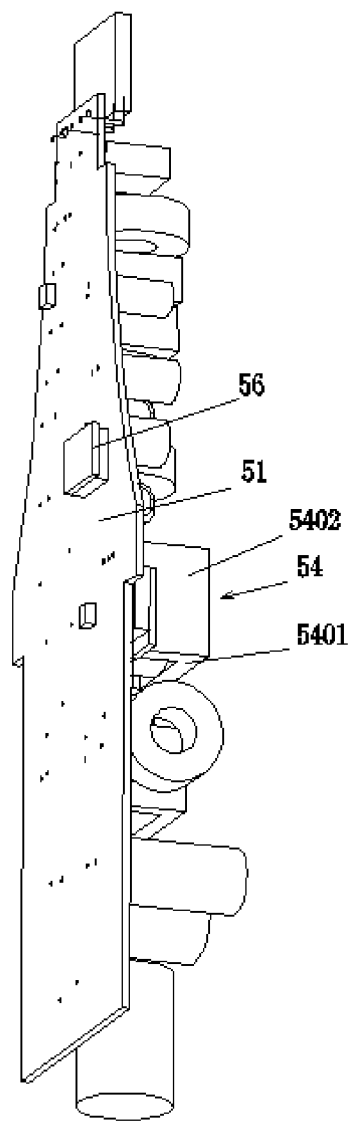
FIGS. 38A~38C are perspective views of the power source, according to some embodiments of the present invention.
Figure 38B:
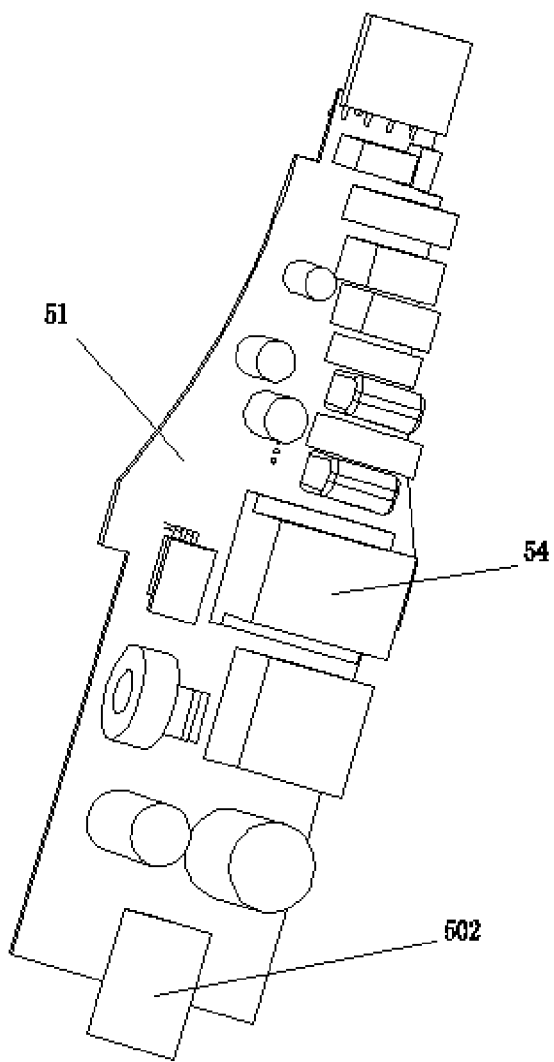
Figure 38C:
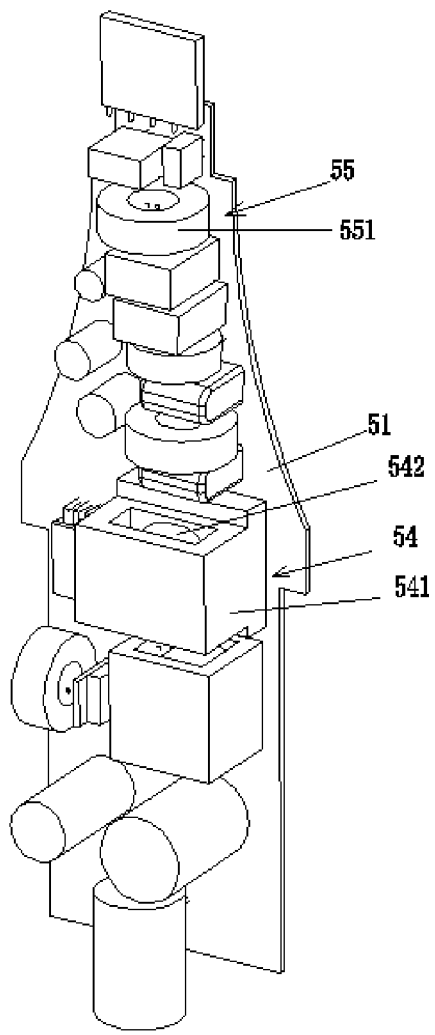
Figure 38D:
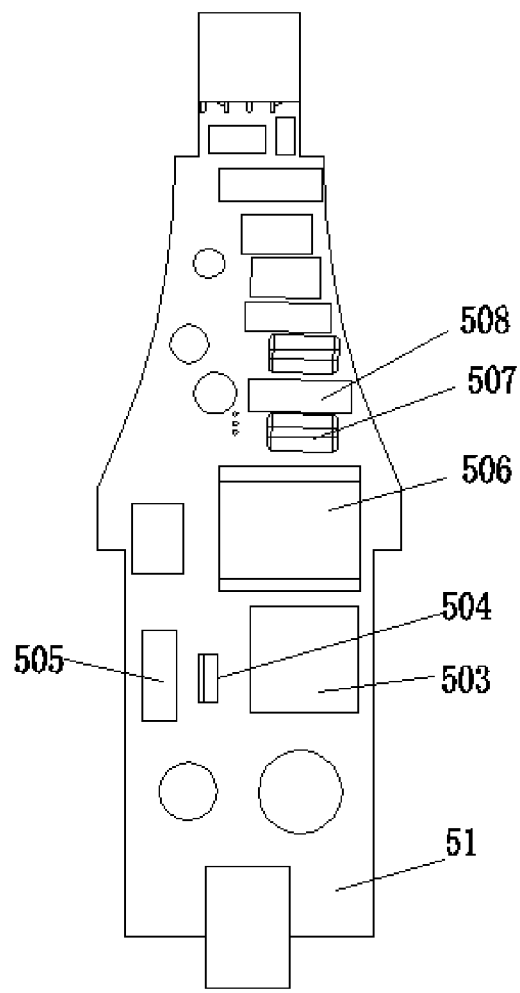
FIG. 38D is a main view of the power source of the embodiment of FIGS. 38A~38C.

FIGS. 38A-38C are perspective views of the power source 5 of one embodiment at different viewpoints. FIG. 38D is a main view of the power source 5 of one embodiment. The power source 5 is electrically connected to the LED chips 311 to power the LED chips 311. As shown in FIGS. 38A-38C, the power source 5 includes a power board 51 and a plurality of electronic components mounted thereon.

As shown in FIG. 38C, a transformer 54 in the electronic components includes a core 541 and coils 542. The core 541 has a room in which the coils 542 are received. The room has an opening in the axial direction of the LED lamp so as to make heat generated from the coils 542 and the core 541 move upward. Also, the heat dissipating direction of the transformer 54 is consistent with the convection path of the first heat dissipating channel 7a (as mentioned in the description of FIG. 4) for being advantageous to heat dissipation.

As shown in FIGS. 38B and 38C, the room is provided with two openings at two ends in the axial direction of the LED lamp to increase heat dissipating effect to the coils 542. In addition, after the coils 542 are installed in the room of the core 541, a gap is kept between the coils 542 and the room to allow air to flow. This can further increase heat dissipating effect to the coils 542.

As shown in FIG. 38B, the transformer 54 has a first side 5401 and a second side 5402, both of which are perpendicular to the power board. The first side 5401 is perpendicular to the axial direction of the lamp. The first side 5401 is less than the second side 5402 in area. Thus, such an arrangement of the small side can reduce resistance to convection of the first heat dissipating channel 7a.

As shown in FIG. 38C, the electronic components include at least one inductor 55 including an annular core 551. A coil is wound around the annular core 551 (not shown). An axis of the annular core 551 is parallel to the axis of the LED lamp to make the coil have larger area to be in contact with convection air. This can further increase heat dissipating effect to the inductor 55. In addition, a shape of the annular core 551 corresponds to the convection path of the first heat dissipating channel 7a. Thus, convection air can pass through the inside of the annular core 551 to further increase heat dissipating effect to the inductor 55.

As shown in FIGS. 38A and 38B, heat-generating elements in the electronic components include integrated circuits (ICs) 56, diodes, transistors, the transformer 54, the inductor 55 and resistors. These heat-generating elements are separately mounted on the power board 51 to distribute heat-generating sources and prevent local high temperature. In addition, the heat-generating elements may be mounted on different surfaces of the power board 51 to perform heat dissipation. At this time, the heat-generating elements are in contact with corresponding heat dissipating elements.

As shown in FIGS. 38A and 38B, at least one IC 56 is arranged to be mounted on different surface as other heat-generating elements are arranged of the power board 51. As a result, the heat-generating sources can be separated to avoid local high temperature and influence to the IC 56 from the other heat-generating elements.

As shown in FIGS. 38A and 38B, in a direction perpendicular to the power board 51 (i.e. projection relationship in a direction perpendicular to the power board 51), the IC 56 does not overlap any heat-generating elements to avoid heat accumulation.

As shown in FIG. 22, the power board 51 is parallel to the axis of the LED lamp. Thus, in the axial direction of the LED lamp, the power board 51 is divided into an upper portion and a lower portion. Arranging spaces of both the upper portion and the lower portion are identical or approximately identical to form better layout of the electronic components. Besides, if the power board 51 inclines toward the axis of the LED lamp, then air flow may be obstructed and it is disadvantageous to heat dissipation of the power source 5.

As shown in FIGS. 1 and 22, the power board 51 divides the lamp shell 2 into a first portion 201 and a second portion 202. Area of the venting hole 222 corresponding to the first portion 201 is greater than area of the venting hole 222 corresponding to the second portion 202. Thus, when implementing layout of electronic components, most or all of electronic components or some thereof which generate a large amount of heat such as inductors, resistors, transformers, rectifiers or transistors may be disposed in the first portion 201.

As shown in FIG. 22, the power board 51 divides an inner chamber of the lamp shell 2 into a first portion 201 and a second portion 202. The first portion 201 is greater than the second portion 202 in volume. When implementing layout of electronic components, most or all of electronic components or some thereof which generate a large amount of heat such as inductors, resistors, transformers, rectifiers or transistors may be disposed in the first portion 201.

Please simultaneously refer to FIGS. 22 and 29, further, area of first air inlet 2201 corresponding to the first portion 201 is greater than area of the second air inlet 2202 corresponding to the second portion 202. Thus, more air can flow into the first portion 201 to perform heat dissipation to the electronic components. Here, the specific description of the air inlet is that the first air inlet 2201 is divided into two portions by the power board 51, one of the two portions corresponds to the first portion 201 and the other one of the two portions corresponds to the second portion 202 so as to make more air flow into the first air inlet 2201 and enter the first portion 201.

As shown in FIG. 22, the electronic components 501 include heat-generating elements 501. At least one of the heat-generating elements 501 is adjacent to the lamp head 23 through which heat is dissipated without occupying resource of heat dissipation of the first heat dissipating channel 7a. The at least one heat-generating element 501 abovementioned is an inductor, a resistor, a rectifier or a control circuit.

As shown in FIG. 22, heat of the at least one heat-generating element is transferred to the lamp head 23 through thermal conduction or radiation and dissipated to air through the lamp head 23.

As shown in FIG. 22, the at least one heat-generating element 501 is in thermal contact with the lamp head 23. In detail, the at least one heat-generating element 501 is located in the lamp head 23. The heat-generating element 501 is in contact with the lamp head 23 through a thermal conductor 53 and the heat-generating element 501 is fastened to 41q the lamp head 23 through the thermal conductor 53. Therefore, the thermal conductor not only performs an effect of heat transfer but also fixes the heat-generating element 501 to avoid loosening of the heat-generating element 501. The phrase "the heat-generating element 501 is located in the lamp head 23" means both the lamp head 23 and the heat-generating element 501 have an overlapping area in a projection perpendicular to the axis of the LED lamp.

As shown in FIG. 22, the thermal conductor 53 is disposed in the lamp head 23 through filling to implement connection between the lamp head 23 and the heat-generating element 501. The thermal conductor 53 only cloaks an end portion of the power source 5 and is higher than the venting 222 in position to prevent overweight resulting from the thermal conductor 53. Additionally, the thermal conductor 53 adopts an insulative material to guarantee safety and prevent the electronic components and metal portion 231 of the lamp head 23 from being in contact. In other embodiments, the thermal conductor 53 may also be a wire connecting the power source 5 to the lamp head 23 (not shown).

As shown in FIG. 22, the lamp head 23 includes the metal portion 231, which is in thermal contact with the thermal conductor 53. That is, at least part of an inner side of the metal portion 231 constitutes a wall of the inner chamber of the lamp shell 2 to make the thermal conductor directly connect with the metal portion 231 and perform heat dissipation by the metal portion 231. Part of the metal portion 231 would perform heat dissipation through air, and another part of the metal portion would perform heat dissipation through a lamp socket connecting to the metal portion 231.

As shown in FIGS. 2 and 38A, in this embodiment, at least one of the electronic components of the power source 5, which is the most adjacent to the first air inlet 2201 of the first heat dissipating channel 7a is a heat intolerance component, such as a capacitor, especially for an electrolytic capacitor. This arrangement can avoid overheating of the heat intolerance component to affect its performance.

In addition, to reduce influence of an electrolytic capacitor 502 suffering heat from the heat-generating elements, a surface of the electrolytic capacitor can be provided with an anti-radiation layer or a thermo-isolation layer (not shown). The thermos-isolation layer may adopt existing plastic material, and the anti-radiation layer may adopt existing paint, silver plate layer, aluminum foil or other anti-radiation materials.

As shown in FIG. 38A, in this embodiment, at least part of at least one of the electrolytic capacitors 502 is not located within the power board 51, i.e. at least part of the electrolytic capacitor exceeds the power board 51 in the axial direction of the LED lamp. Under a condition of the same number of the electronic components, length and material cost of the power board 51. In addition, this can make the electrolytic capacitor further adjacent to the first air inlet 2201 to ensure the electrolytic capacitor to be located in a relatively low temperature area.

As shown in FIG. 22, a position of at least one of the heat-generating elements 501 in the axial direction of the LED lamp is higher than a position of the venting hole 222. Most heat of the heat-generating element 501 higher than the venting hole 222 is dissipated through the lamp head 23 or other paths. Thus, most heat therefrom is not dissipated through the venting hole 222, and convection speed of the first heat dissipating channel 7a would not be affected. The heat-generating element is an IC, a transistor, a transformer, an inductor, a rectifier or a resistor.

As shown in FIG. 22, the power board 51 is divided into an upper part and a lower part in the axial direction of the LED lamp. Heat-generating elements are arranged in both the upper part and the lower part. At least one of the heat-generating elements in the upper part is located above the venting hole 222 to lower the temperature of the upper part near the venting hole 222. This can increase an air temperature difference between two venting holes 222 in the upper part and the lower part to enhance convection.

As shown in FIGS. 2, 3 and 38A, when the power board 51 is assembled in the lamp shell 2, it has a first portion in the lamp neck 22 and a second portion in the sleeve 21. The second portion more adjacent to the first air inlet 2201 of the first heat dissipating channel 7a than the first portion. Because of such an arrangement, convention air will reach the second portion first. That is, the second portion is better than the first portion in an effect of heat dissipation. Thus, at least part of heat intolerance elements (e.g. electrolytic capacitors or other elements which is sensitive to high temperature) should be disposed in the second portion. Preferably, all electrolytic capacitors are disposed in the second portion. The power board 51 of the second portion is greater than the first portion in area, so the power board 51 of the second portion has more space for accommodating electronic components to be advantageous to more heat intolerance elements being disposed in the second portion. In this embodiment, heat intolerance elements/thermo-sensitive elements may be separately mounted on two opposite sides of the second portion. In other embodiments, hotter electronic components may be disposed in the second portion (e.g. transformers, inductors, resistors, ICs or transistors) for better heat dissipation.

Figure 43:
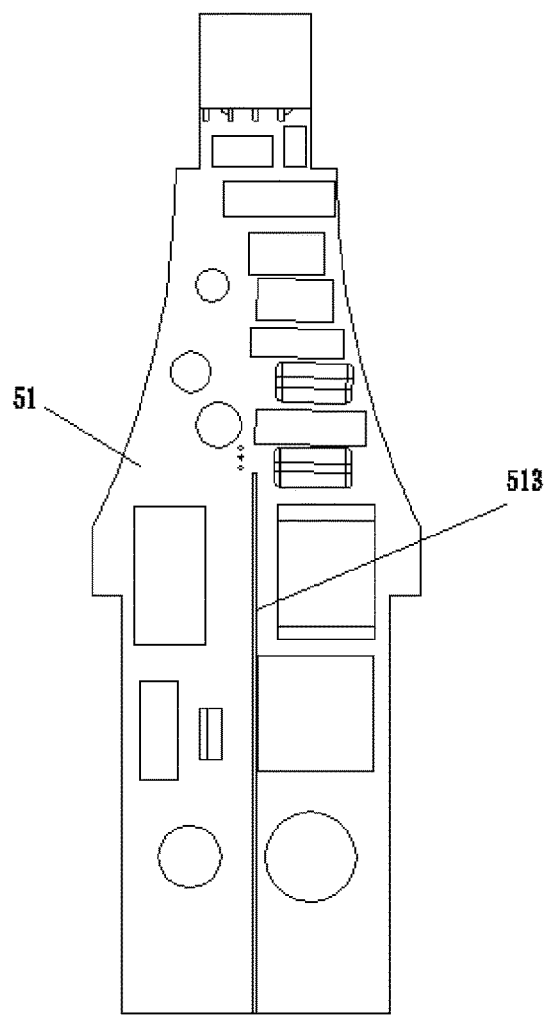
FIG. 43 is a schematic of the power source, according to an embodiment of the present invention.

FIG. 43 is a schematic of an embodiment of the power source 5. As shown in FIG. 43, the power board 51 has a thermo-isolation plate 513. The power board 51 is divided into two zones by the thermos-isolation plate 513. One of the two zones is used to be mounted by heat-generating elements (e.g. transformers, inductors, resistors, etc.), and the other zone is used to be mounted by heat intolerance/thermos-sensitive elements (e.g. electrolytic capacitors). That is, the thermos-isolation plate 513 partitions heat-generating elements and heat intolerance/thermo-sensitive elements to prevent the latter from being affected by thermal radiation from the former. In other embodiments, heat-generating elements are disposed in both zones. That is, the thermo-isolation plate 513 partitions two heat-generating elements to prevent mutual thermal radiation which causes thermal accumulation. In another aspect, temperature is an important factor of thermal radiation, so avoiding mutual thermal radiation between heat-generating elements can raise a temperature difference between a heat-generating element and air therearound so as to improve efficiency of thermal radiation. Preferably, the thermo-isolation plate 513 is arranged along the axis of the LED lamp or the convection direction of the first heat dissipating channel 7a to make heat in two sides would not make convection in a width direction of the power board 51 to prevent heat gathering when convection is processing. The thermo-isolation plate is extendedly arranged along the convection direction of the first heat dissipating channel 7a. That is, the thermo-isolation plate 513 is extendedly arranged along the axis of the LED lamp, so obstruction to convection air would not occur. In other embodiments, the thermo-isolation plate 513 may be slant to form a guiding effect to air.

Furthermore, the thermo-isolation plate 513 may be a circuit board, so the thermo-isolation plate 513 may be disposed with electronic components to increase area for mounting electronic components.

The function of the thermo-isolation plate 513 may be replaced with electronic components. As shown in FIG. 38D, there are three electronic components 503, 504, 505 on the power board 51. At least parts of projections of the three electronic components 503, 504, 505 in a radial direction of the LED lamp (or a width direction of the power board 51) overlap with another one. The one 504 of the three electronic components 503, 504, 505 is located between the other two 503, 505 to avoid mutual thermal radiation between the two electronic components 503, 505. This is advantageous to forming a greater temperature difference between the heat-generating elements and air therearound and radiating heat from the heat-generating elements to air. The abovementioned two electronic components 503, 505 are respective a heat-generating element (such as a transformer, a resistor or a transistor) and a heat intolerance elements/thermo-sensitive element (such as an electrolytic capacitor), so at least part of heat from the heat-generating elements (one of the electronic components 503 and 505) would be thermally radiated to the in-between electronic component 504 to reduce thermally radiative influence to the heat intolerance elements/thermo-sensitive element from the heat-generating elements.

In the other embodiment of the present invention, the three electronic components 503, 504, 505 on the power board 51 positioned as mentioned above, both electronic components 503, 505 are a heat-generating element (such as a transformer, a resistor or a transistor), so at least part of heat generated from the heat-generating elements (electronic components 503 and 505) would be thermally radiated to the in-between electronic component 504. Under these circumstances the electronic component 504 plays a role for preventing the heat generated from the two heat-generating elements being superposed to affect the working quality of the LED lamp due to overheated temperature occurred in the power board 51 area.

Preferably, the in-between electronic component 504 adopts non-heating or heat-resistant electronic component such as a temperature sensor or a capacitor.

As shown in FIG. 38D, in other embodiments, there are three electronic components 506, 507, 508 on the power board 51. At least parts of projections of the three electronic components 506, 507, 508 in the axial direction of the LED lamp (or in a width direction of the power board 51, i.e. along a convection direction of the first heat dissipating channel 7a) overlap with another one. The one 507 of the three electronic components 506, 507, 508 is located between the other two 506, 508 to avoid mutual thermal radiation between the two electronic components 506, 508. This is advantageous to forming a greater temperature difference between the heat-generating elements and air therearound and radiating heat from the heat-generating elements to air. The abovementioned two electronic components 506, 508 are heat-generating elements (such as transformers, resistors, inductors or transistors), so at least part of heat from the heat-generating elements 506, 508 would be thermally radiated to the in-between electronic component 507 to reduce thermally radiative influence to the heat intolerance elements/thermo-sensitive element from the heat-generating elements and to avoid heat accumulation. In this embodiment, by such an arrangement of the electronic component 507, it will obstruct upward convection air flow. For example, after heat from the lower electronic component 506 is brought out by convection air, the convection air must bypass the in-between electronic component 507 to avoid direct contact with the upper electronic component 508. In this embodiment, the in-between electronic component 507 is a non-heat-generating element (such as a capacitor). In other embodiments, the other two electronic components 506, 508 are a heat-generating element (such as transformers, resistors or inductors) and a heat intolerance element (such as a capacitor).

Figure 44:
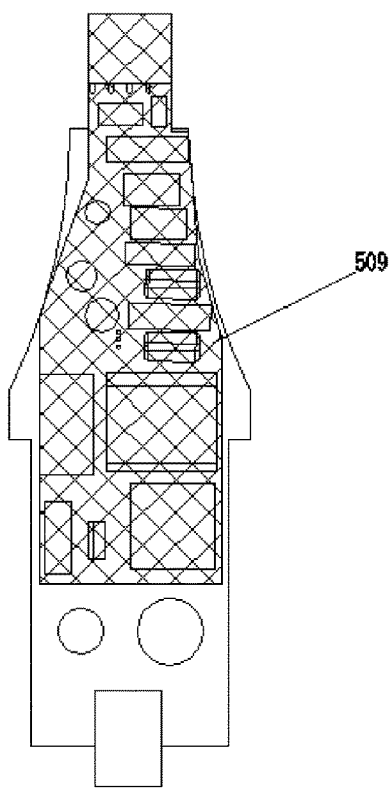
FIG. 44 is a schematic of the power source of another embodiment.

FIG. 44 is a schematic view of an embodiment of the power source 5. In some embodiments, to improve radiative efficiency of the heat-generating elements of the power source 5, a radiating layer 509 may be provided on surfaces of the heat-generating elements. Heat from working heat-generating elements can be thermally conducted to the radiating layer 509, and then the radiating layer 509 radiates the heat to surrounding air to bring out hot air when convection is processing in the first heat dissipating channel 7a. The radiating layer 509 is greater than the heat-generating elements in radiative efficiency so as to significantly improve efficiency of heat dissipation of the heat-generating elements with the radiating layer 509. In this embodiment, the radiating layer 509 may adopt existing black glue to increase an effect of radiating to air. The black glue covers a surface of the power source 5 and may be in thermal contact with the lamp head 23. That is, part of heat from the heat-generating elements of the power source 5 is radiated to surrounding air and another part thereof is thermally conducted to the lamp head 23 through the black glue (not shown). The lamp head 23 is metal, so the heat can be further dissipated to the outside through the lamp head 23. In this embodiment, the black glue is of a thin layer attached on a surface of a heat-generating element without obstructing convection in the first heat dissipating channel 7a. The black glue with light weight would not add substantial weight. In other embodiments, the black glue may be selectively disposed, for example, the black glue is disposed on heat-generating elements with high heat such as transformers, inductors or transistors.

In addition, in the above embodiment, to further increase radiative efficiency of the radiating layer 509, the radiating layer 509 can be configured to be a rough surface to increase surface area.

Figure 39:
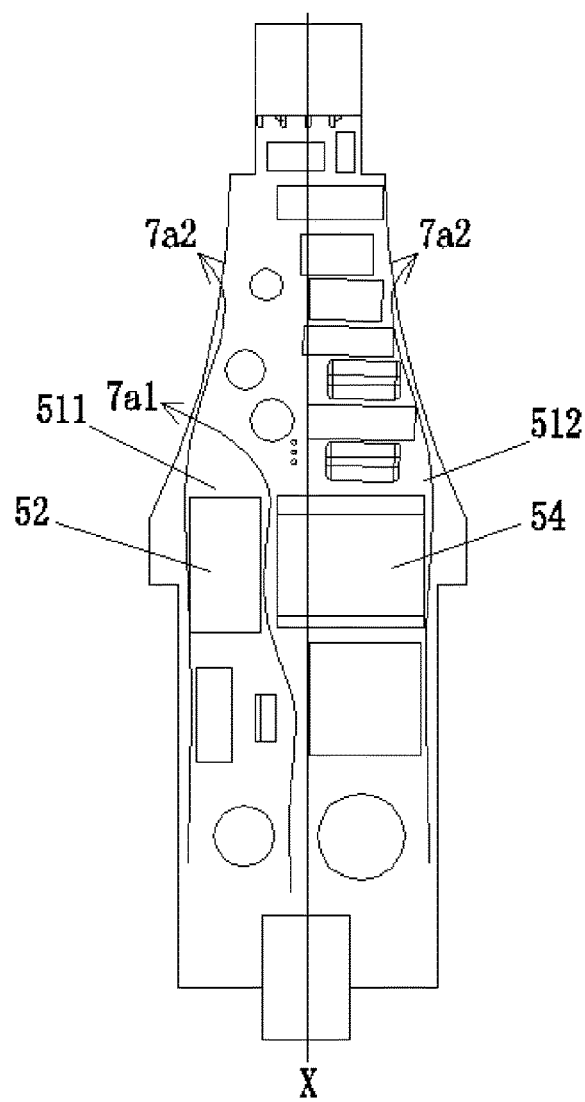
FIG. 39 is a schematic view of the power source, according to one embodiment of the present invention.

FIG. 39 is a schematic view of an embodiment of the power source 5, which can be applied to the power source 5 of the LED lamp shown in FIG. 4. As shown in FIG. 39, in some embodiments, the power board 51 is divided into a first mounting zone 511 and a second mounting zone 512 by an axis X. The axis X is between the first mounting zone 511 and the second mounting zone 512 as a border. Total weight of the electronic components on the second mounting zone 512 is greater than total weight of the electronic components on the first mounting zone 51. The first mounting zone 511 is provided with a counterweight 52 to balance the two zones 511, 512 of the power board 51 in weight. This can prevent unbalanced weight of the two zones 511, 512 of the power board 51 and prevent the hung LED lamp from tilting because of unbalanced weight.

Figure 40:
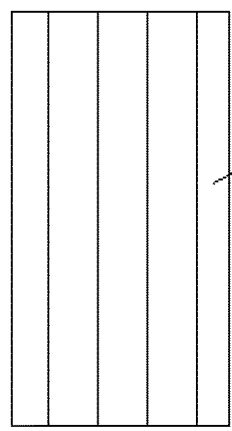
FIG. 40 is a main view of the counterweight of FIG. 39.
Figure 41:
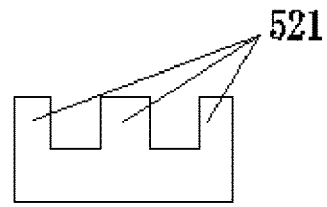
FIG. 41 is a side view of the counterweight of FIG. 40.

FIG. 40 is a main view of the counterweight 52 of FIG. 39. FIG. 41 is a side view of FIG. 40. As shown in FIGS. 40 and 41, in some embodiments, the counterweight 52 is a heat dissipating element with heat dissipating function and is disposed on the power board 51. In some embodiments, the heat dissipating assembly has fins 521 for increasing heat dissipating area. The counterweight 52 is made of metal with high thermo-conductivity such as aluminum or copper. In this embodiment, the fins 521 are extendedly arranged along the axial direction of the LED lamp. A channel is formed between two adjacent fins 521 as an air passage. Such an arrangement can increase heat dissipating area of the counterweight 52. In one embodiment, the counterweight 52 includes a long side and a short side. The channels are parallel with the long side and the long side is configured to be parallel with the axis of the LED lamp or substantially parallel with the direction of airflow to make the air flow smoothly.

As shown in FIG. 39, the electronic components include heat-generating elements which generate heat when working. At least one heat-generating element is adjacent to a heat dissipating assembly to dissipate part of heat through the heat dissipating assembly. Preferably, transformers, inductors, resistors, diodes, transistors or ICs of the heat-generating elements are adjacent to the heat dissipating assembly. More preferably, transformers, inductors, resistors, diodes, transistors or ICs of the heat-generating elements are in direct contact with the heat dissipating assembly.

In one embodiment of the present invention, two opposite sides of the circuit board all comprise the counterweight 52, such that the heat dissipating efficiency of the circuit board 51 and the weight balance between two sides of the circuit board 51 can be improved simultaneously.

As shown in FIG. 39, in some embodiments, the power board 51 is divided into a first mounting zone 511 and a second mounting zone 512 by an axis X. The axis X is between the first mounting zone 511 and the second mounting zone 512 as a border. The second mounting zone 512 is greater than the first mounting zone 511 in number of electronic components to make airflow of the first mounting zone 511 smooth and to reduce obstruction of the electronic components. In this embodiment, both the first mounting zone 511 and the second mounting zone 512 have heat-generating elements to distribute heat sources.

Figure 42:
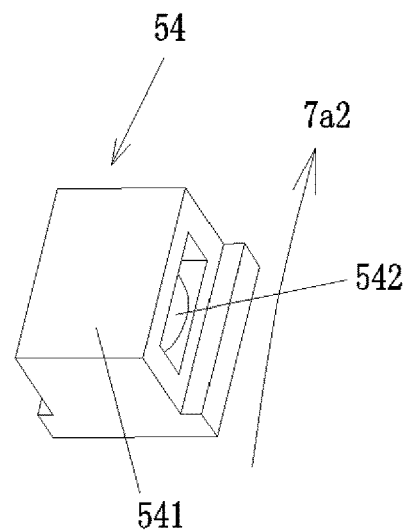
FIG. 42 is a schematic view of a transformer, according to one embodiment of the present invention.

As shown in FIGS. 4, 39 and 42, in some embodiments, the first heat dissipating channel 7a includes an inner channel 7a1 and an outer channel 7a2. The outer channel 7a2 is formed between the electronic components on an edge of the power board 51 and an inner wall of the inner chamber of the lamp shell 2. The inner channel 7a1 is formed in gaps between the electronic components. This arrangement can enhance an effect of heat dissipation of the power source 5. In detail, the power board 51 in FIG. 39 is divided into two portions (a left portion and a right portion, not necessarily symmetrical), namely, a first portion and a second portion. Both the first portion and the second portion have electronic components. The outer channel 7a2 is formed between the electronic components on both the first portion and the second portion and the inner wall of the lamp shell 2. The inner channel 7a1 is formed between the electronic components separately on the first portion and the second portion. In this embodiment, a transformer 54 of the electronic components includes a core 541 and coils 542. The core 541 has a chamber in which the coils 542 are disposed. An opening is formed at a side of the chamber in a radial direction to expose the coils 542. The opening corresponds to the inner channel 7a1 or the outer channel 7a2 to make heat from the coils 542 is rapidly ejected through convection in the inner channel 7a1 or the outer channel 7a2. Preferably, two openings are separately formed at two sides of the chamber in a radial direction. One of the two openings corresponds to the inner channel 7a1 and the other one thereof corresponds to the outer channel 7a2 to further enhance heat dissipation of the transformer.

As shown in FIGS. 1, 2, 3 and 4, the lamp shell 2 includes the lamp head 23, the lamp neck 22 and the sleeve 21. The lamp head 23 connects to the lamp neck 22 which connects to the sleeve 21. The sleeve 21 is located in the heat sink 1 (in the axial direction of the LED lamp, all or most of the sleeve 21, for example, at least 80% of height of the sleeve 21, does not exceed the heat sink 1). The lamp neck 22 projects from the heat sink 1. Both the sleeve 21 and the lamp neck 22 can provide sufficient space to receive the power source 5 and perform heat dissipation, especially for the power source 5 of a high power LED lamp (in comparison with a low power LED lamp, a power source of a high power LED lamp has more complicated composition and larger size). The power source 5 is received in both the lamp neck 22 and lamp head 23. Total height of the lamp neck 22 and the lamp head 23 is greater than height of the heat sink 1 so as to provide more space for receiving the power source 5. The heat sink 1 is separate from both the lamp neck 22 and the lamp head 23 (not overlap in the axial direction, the sleeve 21 is received in the heat sink 1). Thus, the power source 5 in both the lamp neck 22 and the lamp head 23 is affected by the heat sink 1 slightly (heat of the heat sink 1 would not be conducted to the lamp neck 22 and the lamp head 23 along a radial direction). In addition, the configuration of height of the lamp neck 22 is advantageous to the chimney effect of the first heat dissipating channel 7a to guarantee convection efficiency of the first heat dissipating channel 7a. In other embodiments, height of the lamp neck 22 is at least 80% of height of the heat sink 1 to accomplish the above function. The sleeve 21 is made of a thermo-isolated material to prevent mutual influence of heat from the fins and the power source.

As shown in FIG. 2, the second air inlet 1301 is located in a lower portion of the heat sink 1 and radially corresponds to an inner side or the inside of the heat sink 1, i.e. the second air inlet 1301 radially corresponds to the inner side or the inside of the fins 11. The inner side or the inside of the fins 11 corresponds to an outer wall (a radially inner side of the fins 11, which nears or abuts against the sleeve 21) of the sleeve 21 of the lamp shell 2. Thus, after convection air flows into the second air inlet 1301, it flows upward along the outer wall of the sleeve 21 to perform convection and radially dissipates heat in the inner side or the inside of the fins 11 and the outer wall of the sleeve 21 to implement an effect of thermal isolation. That is, this can prevent heat of the heat sink 1 is conducted from the outer wall of the sleeve 21 to the inside of the sleeve 21 not to affect the power source 5. From the above, the second heat dissipating channel 7b can not only enhance heat dissipation of the fins 11, but also implement an effect of thermal isolation. Make a positional comparison between the second air inlet 1301 and the LED chips 311, the second air inlet 1301 is located radially inside all of the LED chips 311.

Figure 45:
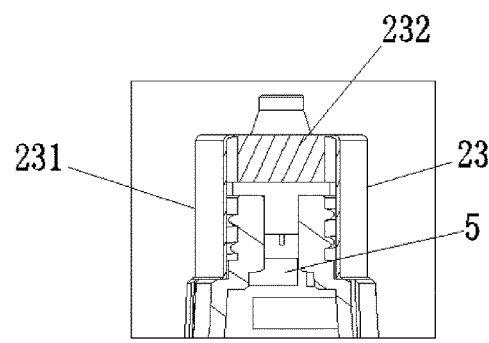
FIG. 45 is an enlarged view of portion B in FIG. 2.
Figure 46:
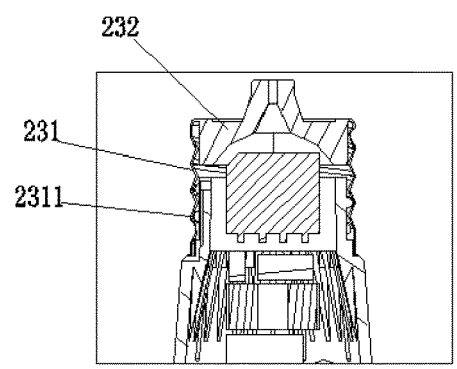
FIG. 46 is a partially schematic view of an LED lamp.

FIG. 45 is an enlarged view of portion B in FIG. 2. As shown in FIG. 45, the lamp head 23 includes a metal portion 231 and an insulative portion 232. Wires of the power source 5 penetrates through the insulative portion 232 to connect with an external power supply. The metal portion 231 connects to the lamp neck 22. In detail, as shown in FIG. 46, an inner surface of the metal portion 231 is provided with a thread through which the lamp neck 22 can be screwed on with the metal portion 231. While the metal portion 231 is dissipating heat generated from the power source 5 in the lamp shell 2 (as described in the above embodiment, at least part of the inner wall of the metal portion 231 forms a wall of the inner chamber of the lamp shell 2, so the thermal conductor directly connects with the metal portion 231 and the metal portion 231 can be used for heat dissipation), an outer surface of the metal portion 231 is formed with a projecting structure 2311 as shown in FIG. 46 to add surface area of the outer surface of the metal portion 231 and enlarge heat dissipating area of the metal portion 231 to increase efficiency of heat dissipation. As for the power source 5, at least part of the power source 5 is located in the lamp head 23, and at least part of heat generated from the power source 5 can be dissipated through the lamp head 23. The inner wall of the metal portion 231 may also be formed with a projecting structure to add surface area of the inner chamber of the lamp shell 2. In this embodiment, the projecting structure can be implemented by forming a thread on the inner surface of the metal portion 231.

Figure 47A:
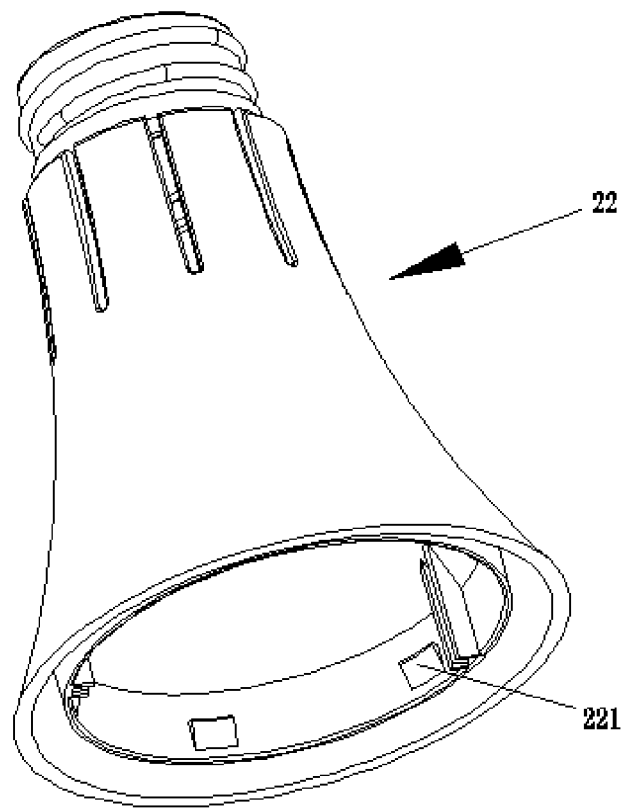
FIGS. 47A~47B are perspective views of the lamp neck of an embodiment.
Figure 47B:
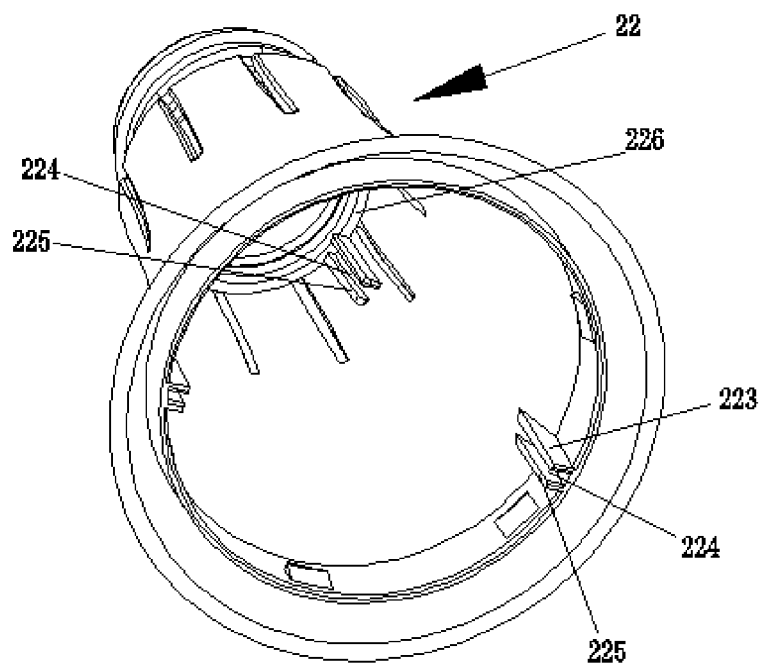
Figure 47C:
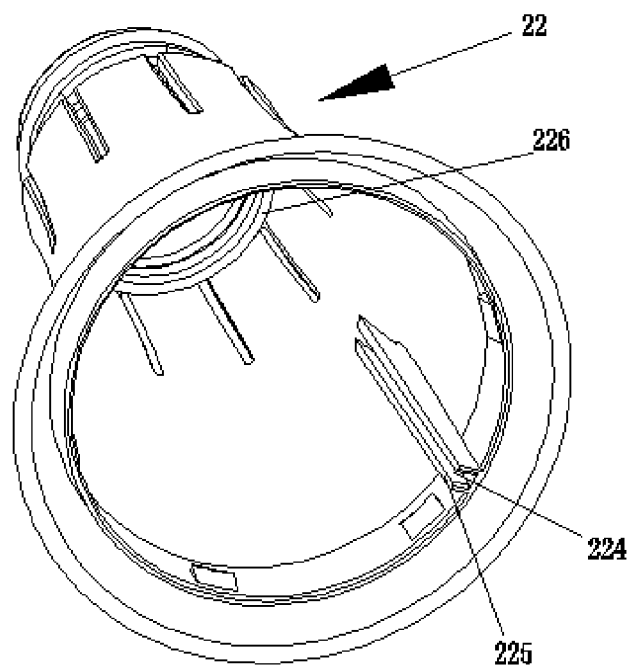
FIG. 47C is a perspective view of the lamp neck of another embodiment.
Figure 48:
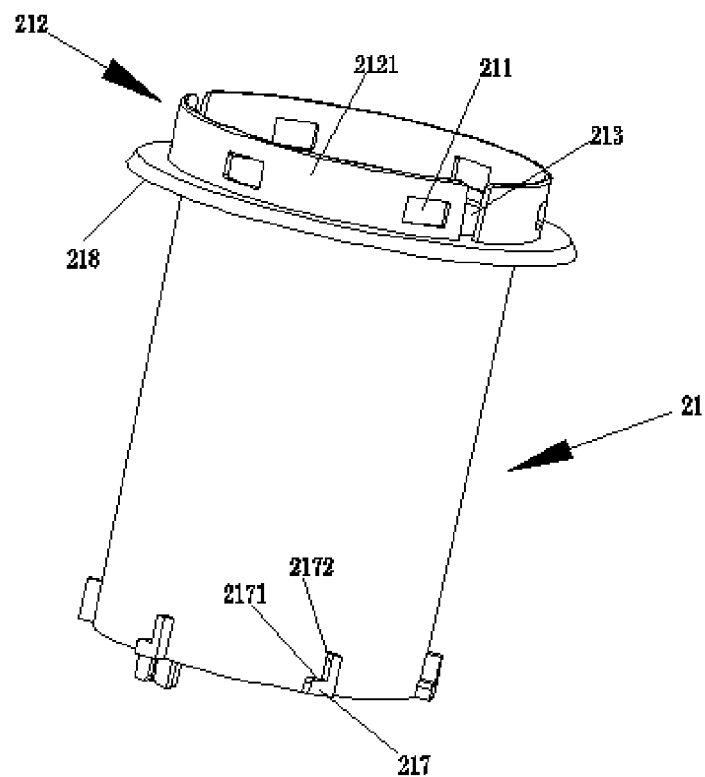
FIG. 48 is a perspective view of the sleeve of an embodiment.

Next, please refer to FIGS. 47A-47C and FIG. 48. FIG. 47A is a perspective view of the lamp neck 22 of one embodiment, and FIG. 47B is another perspective view of the lamp neck 22 of this embodiment. FIG. 48 is a perspective view of the sleeve 21 of this embodiment. As shown in FIGS. 2, 47A, 47B and 48, the lamp neck 22 is connected to the sleeve 21 by engagement. In detail, the sleeve 21 has a first positioning unit 211 and the lamp neck 22 has a second positioning unit 221. The sleeve 21 can be connected with the lamp neck 22 by engaging the first positioning unit 211 and the second positioning unit 221.

In this embodiment, the first positioning unit 211 is an engaging portion on the sleeve 21, and the second positioning unit 221 is a latch on the lamp neck 22. The engaging portion can fasten with the latch. In other embodiments, alternatively, the first positioning unit 211 is a latch on the sleeve 21, and the second positioning unit 221 is an engaging portion on the lamp neck 22. The engaging portion can fasten with the latch.

In this embodiment, the sleeve 21 has a connecting portion 212. The connecting portion 212 includes at least two sheet-shaped bodies 2121 on a circumferential portion of the LED lamp. The first positioning unit 211 is formed on the sheet-shaped bodies 2121. When the lamp neck 22 engages with the sleeve 21, the second positioning unit 221 is embedded into the first positioning unit 211. When embedding, the second positioning unit 221 exerts radial pressure to the sheet-shaped bodies 2121. When the sheet-shaped bodies 2121 are more than two in number, their radially structural strength would be weakened to make the engagement easier, and the connecting portion 212 would have a larger amount of radial deformation. In this embodiment, the engaging portion 212 is a trough or a through hole formed in the sheet-shaped bodies 2121.

In this embodiment, two gaps are formed between the two sheet-shaped bodies 2121 and the gaps constitute a positioning trough 213. The lamp neck 22 has a third positioning unit (plates 223 and 225) corresponding to the positioning trough 213. When the sleeve 21 engages with the lamp neck 22, the third positioning unit (plates 223 and 225) is inserted into the positioning trough 213 to limit the sleeve 21 to be un-rotatable.

In this embodiment, the connecting portion 212 is coaxially put in the lamp neck 22. By the coaxial connection, both the connecting portion 212 and the lamp neck 22 have mutual guiding and supporting effects to make the connection easy, simple and stable.

In this embodiment, both the lamp neck 22 and the sleeve is an integrated structure (not shown) to simplify a structure of the lamp shell 2.

As shown in FIG. 47B, the lamp neck 22 has a slot 224 formed between plate 223 and plate 225. In detail, the slot 224 allows the power board 51 to be inserted for fixture. In this embodiment, two sets of plates 223 and 225 are disposed along the axial direction of the LED lamp to make the LED lamp keep in the axial direction and a gap is kept between the two sets of plates 223 and 225. When the power board 51 has been inserted into the slot 224, convection can be performed between two sides of the power board 51 through the gap. In this embodiment, when two sets of plates 223 and 225 are disposed in the axial direction of the LED lamp, the ratio of length L1 of the lower set of plates 223 and 225 in the axial direction of the lamp neck 22 to length L2 of the power board 51 is 1:14~22. When the ratio falls within this range and the power board 51 is inserted into the lower slot 224, two sides of the power board 51 are limited by the plates 223 and 225, so the power board 51 would not tilt to be advantageous to make the power board 51 easy to align with the other slot 224. This can reduce difficulty in assembling.

In this embodiment, the two plates 223 and 225 are formed by two parallel ribs. A set of ribs is disposed on an inner wall of the lamp neck 22 and extends along the axial direction of the lamp neck 22. After the power board 51 has been inserted into the slot 224, the ribs are parallel to the power board 51.

In this embodiment, the third positioning unit formed by two plates 223 and 225, two opposite sides of the positioning trough 213 have effects of positioning and guiding.

FIG. 47C is a perspective view of the lamp neck 22 on an embodiment. As shown in FIG. 47C, in some embodiments, the plates 225 are of a single set along the axial direction of the LED lamp and with longer length. Such a long slot 224 formed the plates 225 can fix the power board 51 more firmly. In this embodiment, length of the plate 225 is 15%~45% of length of the power board 51 to make the power board 51 held by the slot 224.

In other embodiments, the slot 224 may also be a trough on an inner wall of the lamp neck 22 (not shown). Thus, no plate is required for structural simplification.

As shown in FIGS. 47B and 31, in this embodiment, a first stopping portion 226 is provided in the lamp neck 22 to correspond to the power board 51. When the power board 51 is inserted, it will be stopped by the first stopping portion 226 to prevent the power board 51 from being excessively pressed and being damaged. On the other hand, the first stopping portion 226 can keep a gap between the power board 51 and an end portion of the lamp head 23 to guarantee convection in the gap.

As shown in FIG. 31, the sleeve 21 has a second stopping portion 215 corresponding to the power board 51 for limiting downward movement of the power board 51 in the axial direction. Both the first stopping portion 226 and the second stopping portion 215 limit two sides of the power board 51 in the axial direction to fasten the power board 51 in the axial direction.

As shown in FIGS. 1 and 31, the lamp shell 2 has an airflow limiting surface 214 which extends radially outwardly and is located away from the venting hole 222. The airflow limiting surface 214 cloaks at least part of the fins 11. When the fins are dissipating heat, hot airflow heated by the part of fins 111 cloaked by the airflow limiting surface 214 rises but is blocked by the airflow stopping surface 214 to change its direction (outward along the airflow stopping surface 214). Thus, rising hot airflow is forced to go away from the venting hole 222. This can prevent hot air from both gathering around the venting hole 222 and affecting convection speed of the first heat dissipating channel 7a. Also, this arrangement can prevent rising hot air from both being in contact with the metal portion 231 of the lamp head 23 and affecting heat dissipation of the metal portion 231. Even hot air directly passing the metal portion 231 to conduct into the inner chamber of the lamp shell 2 can also be avoided. The airflow stopping surface 214 may be formed on the sleeve 21. As shown in FIG. 12, in another embodiment of the present invention, the airflow stopping surface 214 may also be formed on the lamp neck 22.

As shown in FIG. 31, in this embodiment, upper portions of at least part of the fins 11 in the axial direction of the LED lamp correspond to the airflow stopping surface 214. When the lamp shell 2 is inserted into the heat sink 1, the airflow stopping surface 214 will have a limiting effect to the lamp shell 2. In this embodiment, the fins abut against the airflow stopping surface 214.

As shown in FIG. 31, in this embodiment, the sleeve 21 is made of a material whose thermal conductivity is less than that of the material of which the lamp neck 22 is made. The airflow stopping surface 214 is formed on the sleeve 21. Height of the heat sink 1 in the axial direction does not exceed the airflow stopping surface 214 to reduce contact area between the heat sink 1 and the lamp neck 22. As for the sleeve 21, the lower its thermal conductivity is, the less the heat conducted from the heat sink 1 to the inside of the sleeve 21 is, and the less the influence to the power source 5 is. As for the lamp neck 22, the less the contact area between the lamp neck 22 and the heat sink 1 is, the lower the thermal conductivity is. The lamp neck 22 has better thermal conductivity than that of the sleeve 21. The lamp neck 22 can dissipate at least part of heat from the power source 5. In other embodiments, both the sleeve 21 and the lamp neck 22 may adopt the same material, a material with relatively low thermal conductivity, such as plastic.

As shown in FIG. 31, in this embodiment, both a wall of the sleeve 21 and a wall of the lamp neck 22 jointly constitute a wall of the inner chamber of the lamp shell 2. Height of the heat sink 1 in the axial direction does not exceed height of the sleeve 21 to make the heat sink 1 corresponds to the sleeve 21 in a radial direction of the LED lamp. That is, the sleeve 21 has an effect of thermal isolation to prevent heat of the heat sink 1 from being conducted to the sleeve 21, so that electronic components of the power source 5 would not be affected. All the lamp neck 22 is higher than a position of the heat sink 1. That is, in a radial direction of the LED lamp, the heat sink 1 does not overlap the lamp neck 22. This can make thermal conduction between the heat sink 1 and the lamp neck 22, and prevent heat from the heat sink 1 to conduct to the inside of the lamp neck 22, so that the electronic components therein would not be affected. As a result, in this embodiment, heat conducting efficiency of the wall of the sleeve 21 is configured to be lower than heat conducting efficiency of the wall of the lamp neck 22. Advantages of such configuration are as follows: (1) because heat conducting efficiency of the sleeve 21 is relatively low, thermal conduction from the heat sink 1 to the sleeve 21 can be reduced to prevent electronic components in the sleeve 21 form being affected by the heat sink 1; and (2) because thermal conducting from the heat sink 1 to the lamp neck 22 does not need to be considered, heat conducting efficiency of the lamp neck 22 can be increased to be advantageous to dissipating heat from the electronic components of the power source 5 through the lamp neck 22. This can avoid life shortening of the power source 5 due to overheating. In this embodiment, in order to make heat conducting efficiency of the wall of the sleeve 21 be lower than heat conducting efficiency of the wall of the lamp neck 22, the sleeve 21 is made of a material with low thermal conductivity and the lamp neck 22 is made of a material with relatively high thermal conductivity. To increase thermal conductivity of the lamp neck 22, the lamp neck 22 may be provided with a venting hole 222 or a heat conducting portion (not shown) such as metal or other materials with high thermal conductivity.

As shown in FIG. 31, the lamp neck 22 has an upper portion and a lower portion. The venting hole 222 is located in the upper portion. Cross-sectional area of the upper portion is less than cross-sectional area of the lower portion. Airflow speed in the upper portion is faster than that in the lower portion, so that initial speed of air ejected from the venting hole 222 can be increased to prevent hot air from gathering around the venting hole 222. In this embodiment, cross-sectional area of the lamp neck 22 upward tapers off in the axial direction to avoid obstruction to air flowing. In this embodiment, cross-sectional area of an inlet of the lower portion of the sleeve 21 is greater than that of the upper portion of the lamp neck 22.

As shown in FIG. 1, the venting hole 222 of the lamp neck 22 is of a strip shape and extends along the axial direction of the LED lamp. Because of gravity of the LED lamp itself, the lamp neck 22 would suffer an axial pulling force. The venting holes 222 are configured to be of a strip shape extending the axial direction of the LED lamp, so stress concentration caused by the venting hole 222 in the lamp neck 22 can be prevented. A maximum diameter of an inscribed circle of the venting hole 222 is less than 2 mm, preferably, between 1 mm and 1.9 mm. As a result, the venting hole 222 can prevent bugs from entering and prevent most dust from passing. On the other hand, the vent 41 can keep better efficiency of air flowing. On the other hand, if the venting hole 222 is configured to annular extending along an circumferential portion of the lamp neck 22, then the lamp neck 22 may be deformed by weight of the heat sink 1 to make the venting holes 222 become larger. This would cause that a maximum diameter of an inscribed circle of the venting hole 222 is greater than 2 mm, this cannot satisfy the requirement.

As shown in FIG. 21, the venting hole 222 is outside an outer surface of the metal portion 231 in radial directions. This can reduce influence to the metal portion 231 because of rising air ejected from the venting hole 222 and prevent heat from being conducted back to the lamp shell 2.

Figure 49:
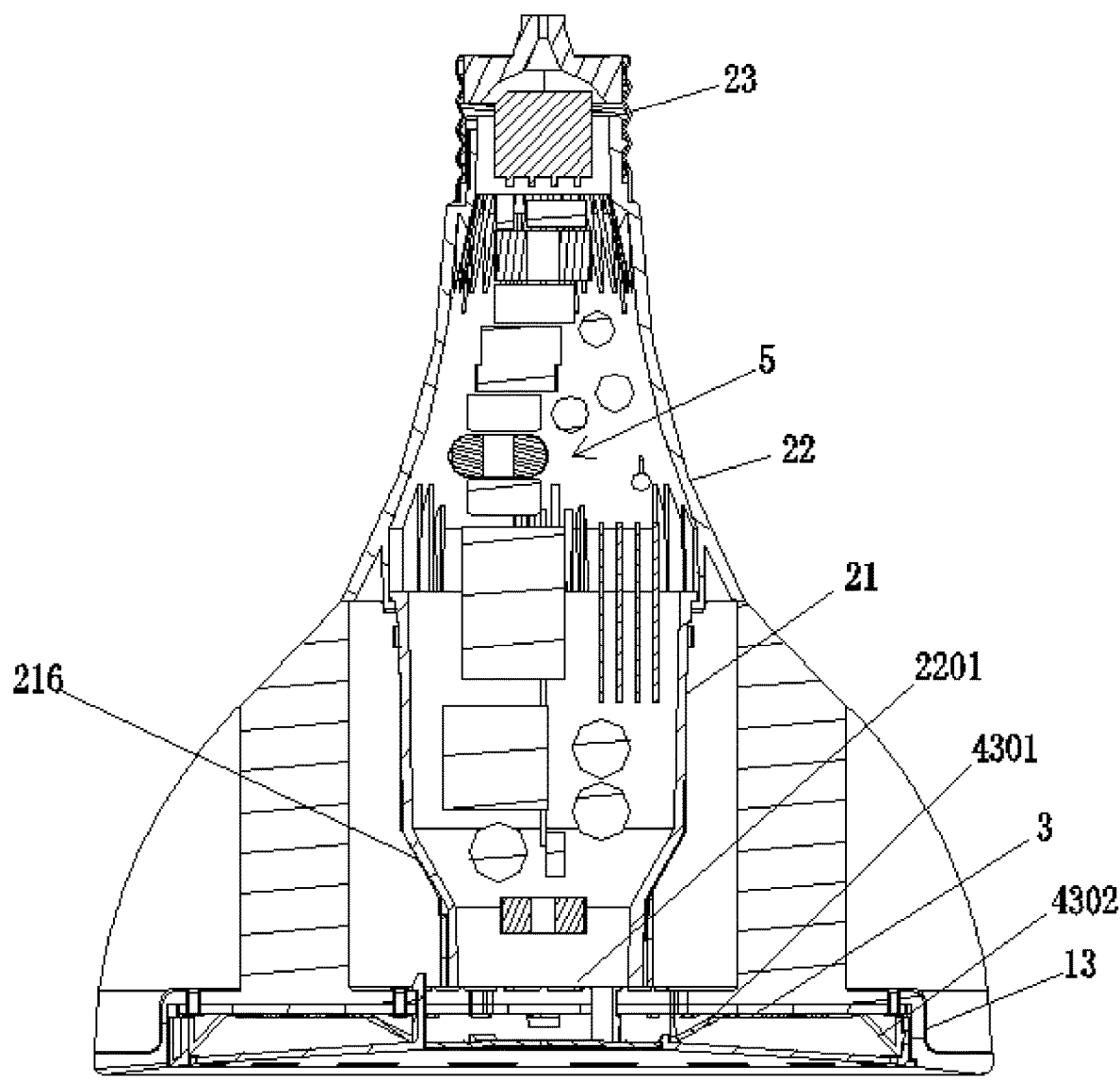
FIG. 49 is a cross-sectional view of the LED lamp of another embodiment.
Figure 50:
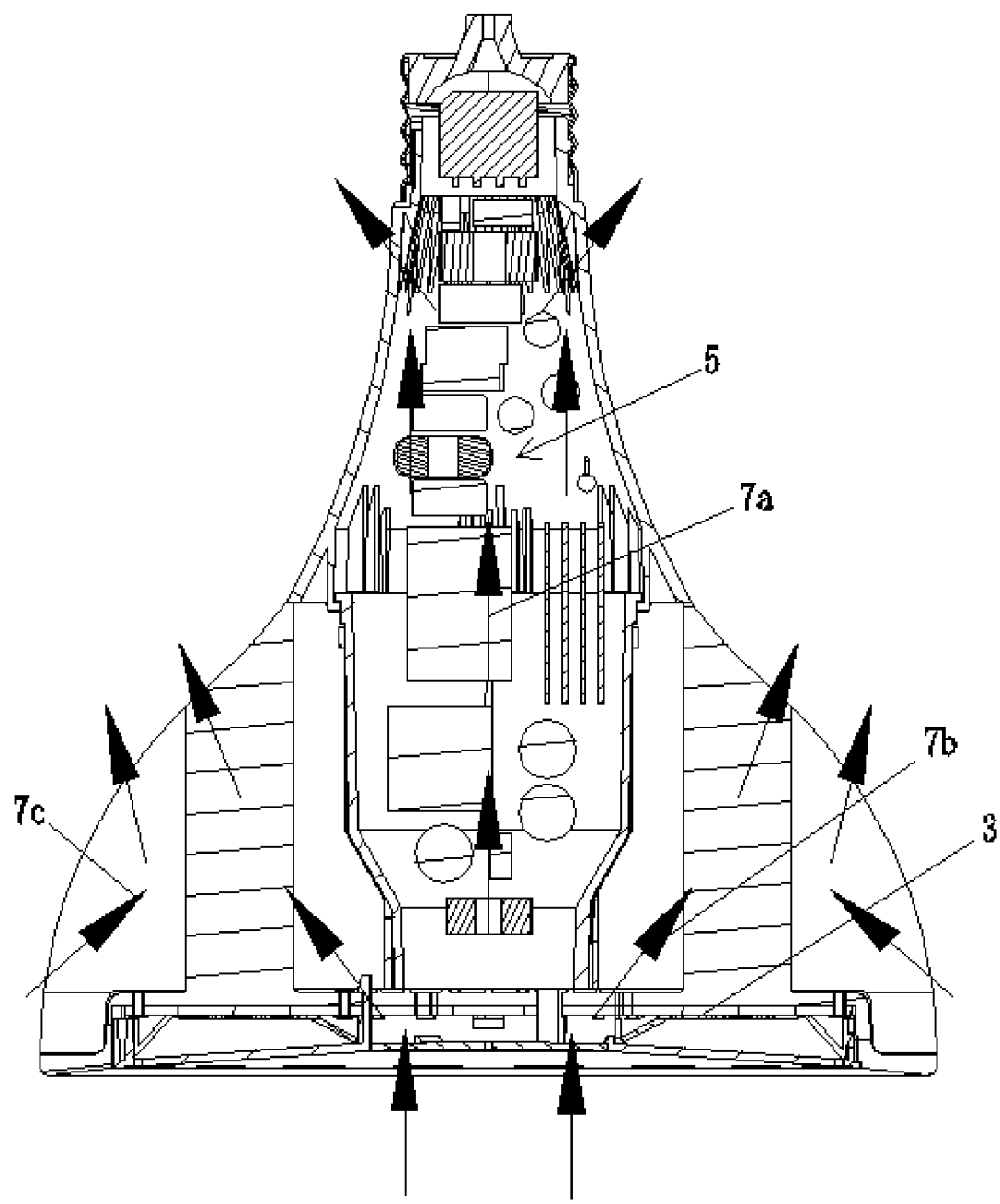
FIG. 50 is a schematic view of an arrangement of the convection channels of the LED lamp of FIG. 49.

FIG. 49 is a cross-sectional view of the LED lamp of another embodiment. FIG. 50 is a schematic view of arrangement of the convection channels in the LED lamp. As shown in FIGS. 49 and 50, in some embodiments, a fundamental structure of the LED lamp is identical to the LED lamp shown in FIG. 1. In some embodiments, the sleeve 21 has an upper portion and a lower portion. The upper portion is connected to the lower portion through an air guiding surface 216. A diameter of cross-section of the air guiding surface 216 downward tapers off along the axis of the LED lamp (along the convection direction of the first heat dissipating channel 7a). That is, the air guiding surface 216 can guide air in the second heat dissipating channel 7b toward the radial outside of the heat sink 1 so as to make air be in contact with more area of the fins 11 to bring out more heat of the fins 11. The sleeve 21 includes a first portion and a second portion in the axial direction. The second portion is a part of the sleeve 21 below the air guiding surface 216 (including the air guiding surface 216). The first portion is the other part of the sleeve 21 above the air guiding surface 216 (but not including the air guiding surface 216). Electronic components of the power source 5, which are located in the second portion of the sleeve 21, include heat intolerance elements such as capacitors, especially electrolytic capacitors so as to make the heat intolerance elements work in low temperature environment (near the first air inlet 2201). In other embodiments, high heat-generating elements may be disposed in the second portion of the sleeve 21, such as resistors, inductors and transformers. As for the second heat dissipating channel 7b, when convection air flows into the second heat dissipating channel 7b and reaches the lower portion of the sleeve 21, the convection air would lean against the outer wall of the sleeve 21 to rise. This can generate an effect of thermal isolation, i.e. heat of the fins 11 is prevented from being conducted to the inside of the sleeve 21 so that the heat intolerance elements therein would not be affected. When the convection air continues to rise, the convection air will flow outward along radial directions of the fins 11 under the guide of the air guiding surface 216 so as to make the convection air be in contact with more area of the fins 11 to enhance an effect of heat dissipation of the fins 11. In this embodiment, the inner chamber of the sleeve 21 is of a wide-upper-side-and-narrow-lower-side channel structure. This significantly enhances the chimney effect and promotes air flowing in the sleeve 21. In addition, the venting hole 222 can be designed on the lamp neck 22 away from the vent to further improve the chimney effect.

Unless otherwise defined, all ranges used herein include two end points and all numbers therebetween. The terms "approximately", "about" or "similar" associated with the ranges are suitable for the two endpoints of the range. Thus, "about 20 to 30" intents to cover "about 20 to about 30", and at least includes the two endpoints indicated.

It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Multiple elements, compositions, parts or steps can be provided by a single integrated element, composition, part or step. Contrarily, a single integrated element, composition, part or step can be divided into multiple separate elements, compositions, parts or steps. As used herein, the singular forms "a", "an" and "the" are intended to include the plural forms as well, unless the context clearly indicates otherwise.

It should be understood that the above description is for the purpose of describing particular embodiments only and is not intended to be limiting of the disclosure. Although the present disclosure is illustrated and described with reference to specific embodiments, those skilled in the art will understand that many variations and modifications are readily attainable without departing from the spirit and scope thereof as defined by the appended claims and their legal equivalents.

The above depiction has been described with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

What is claimed is:

1. An LED (light emitting diode) lamp comprising:
   a lamp shell including a lamp head, a lamp neck and a sleeve, the lamp head connects to the lamp neck which connects to the sleeve;
   a passive heat dissipating element having a heat sink connected to the lamp shell, wherein the heat sink comprises fins and a base, the sleeve of the lamp shell is located in the heat sink, the lamp neck projects from the heat sink, height of the lamp neck is at least 80% of height of the heat sink;

a power source having a first portion and a second portion, wherein the first portion of the power source is disposed in both the lamp neck and the lamp head of the lamp shell, and the second portion of the power source is disposed in the heat sink of the passive heat dissipating element;

a light emitting surface connected to the heat sink of the passive heat dissipating element and comprising LED chips electrically connected to the power source, wherein the light emitting surface and the heat sink are connected to form a heat transferring path from the LED chips to the passive heat dissipating element;

a first heat dissipating channel formed in a first chamber of the lamp shell for dissipating heat generated from the power source while the LED lamp is working, and the first chamber is located between bottom of the LED lamp and an upper portion of the lamp neck;

a second heat dissipating channel formed in the heat sink and between the fins and the base of the heat sink for dissipating the heat generated from the LED chips and transferred to the heat sink; and a lamp cover connected with the heat sink and having a light output surface, an end surface, an inner reflecting surface disposed inside the light output surface of the lamp cover and an outer reflecting surface disposed in the outer circle of the array of the LED chips, wherein the end surface is formed with a vent to allow air flowing from outside of the LED lamp into both the first heat dissipating channel and the second heat dissipating channel through the vent, the inner reflecting surface is disposed in a position of an inner circle of the array of the LED chips, the outer reflecting surface is set to correspond to the LED chips on the light emitting surface;

wherein the first heat dissipating channel comprises a first end on the light emitting surface to allow air flowing from outside of the LED lamp into the first chamber, and a second end on the upper portion of the lamp neck of the lamp shell to allow air flowing from inside of the first chamber out to the LED lamp;

wherein the second heat dissipating channel comprises a third end on the light emitting surface to allow air flowing from outside of the LED lamp into the second heat dissipating channel, and flowing out from spaces between every adjacent two of the fins;

wherein a third aperture is located in a central region of the light emitting surface, and the third aperture forms an air intake of both the first heat dissipating channel and the second heat dissipating channel;

wherein the sleeve of the lamp shell is made of a material having lower thermal conductivity than that of material of the heat sink;

wherein the inner reflecting surface of the lamp cover is configured to reflect part of light emitted from the innermost of the array of LED chips, the outer reflecting surface of the lamp cover is configured to reflect part of light emitted from the outermost of the array of LED chips, and the outermost of the array of LED chips are greater than the innermost of array of LED chips in number, and the outer reflecting surface is greater than the inner reflecting surface in area;

wherein a relationship as follows is satisfied between the LED chips and the inner and outer reflecting surface:

$(A1/N1):(A2/N2)=0.4\sim1;$ where A1 and A2 respectively represent area of the inner and outer reflecting surface;

where N1 and N2 respectively represent number of the innermost and outermost of the array of LED chips of the light emitting surface.

2. The LED lamp of claim 1, wherein the base of the heat sink has a projecting portion protrudes from the light emitting surface in an axial direction of the LED lamp, the projecting portion protrudes from the light emitting surface in the axial direction of the LED lamp, the projecting portion is configured to be annular and a concave structure is defined by both the projecting portion and the base for receiving and protecting both the light emitting surface and the light cover, the base has a first inner surface and the lamp cover has a peripheral wall, the first inner surface corresponds to the peripheral wall, a gap is kept between the first inner surface and the peripheral wall, the first inner surface is configured to be a slant and an angle is formed between the first inner surface and the light emitting surface, the angle is an obtuse angle.

3. The LED lamp of claim 2, wherein the base further includes a second inner surface, an end portion of the peripheral wall abuts against the second inner surface, an angle between the first inner surface and the light emitting surface is less than an angle between the second inner surface and the light emitting surface.

4. The LED lamp of claim 3, wherein the angle between the second inner surface and the light emitting surface is between 120 degrees and 150 degrees.

5. The LED lamp of claim 4, wherein the end portion of the peripheral wall is provided with protruding plates upward extending from the peripheral wall at regular intervals.

6. The LED lamp of claim 5, wherein the protruding plates are the parts that the end portion of the peripheral wall is in actual contact with the second inner surface.

7. The LED lamp of claim 6, wherein a gap is formed between the peripheral wall and the base and the base is formed with a hole, a side of the hole communicates with the gap and the other side corresponds to the fins.

8. The LED lamp of claim 7, wherein a chamber is formed between the light cover and the light emitting surface, and the light emitting surface and the LED chips are located in the chamber.

9. The LED lamp of claim 8, wherein the chamber has first apertures and second apertures, the first apertures are configured to communicate with the outside, and the second apertures are configured to communicate simultaneously with both the first heat dissipating channel and the second heat dissipating channel.

10. The LED lamp of claim 9, wherein the light output surface is provided with holes to form the first apertures, the inner reflecting surface is provided with notches to form the second apertures.

11. The LED lamp of claim 10, wherein the ratio of the number of the second apertures to that of the first apertures is 1:1~2.

12. The LED lamp of claim 11, wherein the ratio of the number of the second apertures to that of the first apertures is 1:1.5.

13. The LED lamp of claim 12, wherein the light emitting surface include at least two LED chip sets having the LED chips, an open region is formed between adjacent two LED chips of the same LED chip set, the open region between any two adjacent LED chips of one of the two adjacent chip sets on the light emitting surface interlaces to and communicates with the open region between any two adjacent LED chips of another one of the chip sets on the light emitting surface in a radial direction of the light emitting surface.

14. The LED lamp of claim 13, wherein three LED chip sets are annularly disposed along the radial direction of the light emitting surface in order, any open regions of the three LED chips are not in the same direction in the radial direction.

* * * * *